(12) United States Patent
Fujimaki

(10) Patent No.: US 7,569,328 B2
(45) Date of Patent: Aug. 4, 2009

(54) RESIN COMPOSITION AND THERMO/PHOTOSENSITIVE COMPOSITION

(75) Inventor: Kazuhiro Fujimaki, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 22 days.

(21) Appl. No.: 10/638,906

(22) Filed: Aug. 12, 2003

(65) Prior Publication Data

US 2004/0131972 A1 Jul. 8, 2004
US 2004/0234893 A9 Nov. 25, 2004

(30) Foreign Application Priority Data

Aug. 16, 2002 (JP) .............. 2002-237509
Sep. 20, 2002 (JP) .............. 2002-275439

(51) Int. Cl.
- G03C 1/73 (2006.01)
- G03F 7/038 (2006.01)
- G03F 7/028 (2006.01)
- G03F 7/033 (2006.01)
- G03F 7/037 (2006.01)

(52) U.S. Cl. .................. 430/287.1; 430/905; 430/906; 430/910; 430/916

(58) Field of Classification Search .............. 430/287.1, 430/283.1, 916, 285.1, 284.1, 944, 945, 281.1
See application file for complete search history.

(56) References Cited

U.S. PATENT DOCUMENTS

| 2,850,445 | A | 9/1958 | Oster |
| 4,708,925 | A | 11/1987 | Newman |
| 6,569,603 | B2 * | 5/2003 | Furukawa ................. 430/287.1 |
| 2002/0086238 | A1 * | 7/2002 | Fujimaki et al. ......... 430/281.1 |

FOREIGN PATENT DOCUMENTS

| EP | 1 182 033 A1 | 2/2002 |
| EP | 1 249 731 A2 | 10/2002 |
| EP | 1 285 751 A2 | 2/2003 |
| EP | 1 341 040 A1 | 9/2003 |
| JP | 44-20189 B | 8/1969 |
| JP | 64-7036 | * 1/1989 |
| JP | 8-108621 A | 4/1996 |
| JP | 8-276558 A | 10/1996 |
| JP | 9-34110 A | 2/1997 |
| JP | 10-207056 | * 8/1998 |
| JP | 11-65105 A | 3/1999 |
| JP | 2000-89455 A | 3/2000 |
| JP | 2002-040652 A | 2/2002 |
| JP | 2002-156757 A | 5/2002 |
| JP | 2002-182391 A | 6/2002 |

OTHER PUBLICATIONS

Chemical Abstract (AN 1998:505254)—English abstract for JP10-207056.*
Chemical Abstract (AN 1989:448172)—English abstract for JP 64-7036 (JP 01007036).*
Japanese Patent Office Action dated Nov. 11, 2008 for Japanese Patent Application No. 2002-237509 and English language translation thereof.

* cited by examiner

Primary Examiner—Sin J. Lee
(74) Attorney, Agent, or Firm—Sughrue Mion, PLLC

(57) ABSTRACT

The present invention provides a resin composition that includes (A) a polymer compound that has, on a side chain of a main chain polymer, through a linkage group containing a hydrogen-bonding group and a ring structure, a terminal ethylenic unsaturated bond, and is soluble or swelling in water or an alkali aqueous solution, and (B) a compound that generates radicals when exposed to light or heat. The invention further provides a thermo/photosensitive composition that includes (A') a polymer compound that has a non-acidic hydrogen-bonding group on a side chain and is soluble or swelling in water or an alkali aqueous solution, and (B') a compound that generates radicals when exposed to light or heat.

15 Claims, No Drawings

RESIN COMPOSITION AND THERMO/PHOTOSENSITIVE COMPOSITION

CROSS-REFERENCE TO RELATED APPLICATION

This application claims priority under 35 USC 119 from Japanese Patent Application Nos. 2002-237509 and 2002-275439, the disclosure of which is incorporated by reference herein.

BACKGROUND OF THE INVENTION

1. Field of the Invention

The present invention relates to a resin composition and a thermo/photosensitive composition that can be used as compositions that can be cured by light or heat and used in image recording materials such as three dimensional optical shaping and holography, planographic printing plate materials, color proofs, photo-resists, and color filters, inks, paints, and adhesives. In particular, the invention relates to a resin composition and a thermo/photosensitive composition that can be suitably used as recording materials of negative type planographic printing plate precursors capable of so-called direct plate-making which can be directly made a plate with various lasers based on digital signals of a computer and the like.

2. Description of the Related Art

In recent years, development of lasers is remarkable; in particular, solid lasers, semiconductor lasers, and gas lasers that emit UV light, visible light, and infrared light in the wavelength range of from 300 to 1200 nm, can be easily obtained as ones that are high in power and small in size. The lasers are very useful as a recording light source when the direct palate making based on digital data of such as a computer is performed in planographic printing. There are various studies on the image recording materials that respond to various laser lights; positive image recording materials that respond to infrared lasers of a photosensitive wavelength of 760 nm or more (such as those described in U.S. Pat. No. 4,708,925), and acid-catalyst crosslinking negative image recording materials (such as those described in Japanese Patent Application Laid-Open (JP-A) No. 8-276558) are known. Furthermore, radical polymerizing negative image recording materials that respond to UV light or visible light in the range of from 300 to 700 nm are also known (such as those described in U.S. Pat. No. 2,850,445 and Japanese Patent Publication (JP-B) No. 44-20189).

Normally, such a negative image recording material contains a compound that generates radicals when exposed to light or heat and a polymerizable compound, and a recording method is utilized in which a polymerization reaction is caused by the radicals generated when exposed to light or heat as an initiator, thereby an image recording layer in an exposed portion is cured, and thereby an image area is formed. Such negative image recording materials are low in the image forming property in comparison with positive image recording materials in which a recording layer is made soluble by energy of laser irradiation. Accordingly, with an intention of accelerating a curing due to polymerization and thereby forming a image area with strength, heat treatment is generally applied before development.

As printing plates that have such an image recording layer formed by the polymerization caused by light or heat, techniques (such as those described in JP-A Nos. 8-108621 and 9-34110) that use a photo-polymerizable or heat polymerizable composition as a recording layer are known. These image-recording layers are excellent in the high sensitivity image forming property. However, when a hydrophilicity-imparted substrate that is used as a support, there is a problem in that since adhesion at an interface between the image recording layer and the support is low, the press life is short.

Furthermore, in order to improve sensitivity, use of infrared lasers of higher output is under study; however, there is a problem in that an optical system is contaminated by generation of ablation of a recording layer during laser scanning. Other than this, chemical amplification-type sensitive materials (such as those described in JP-A No. 11-65105) and sensitive materials that utilize polymerization of ethylenic unsaturated compounds (such as those described in JP-A No. 2000-89455) are under study. However, since these sensitive materials contain components excellent in the reactivity to light and heat, there is concern in that handling under white light or variation of an environmental temperature tends to cause an undesirable reaction, that is, their shelf-stability is poor.

SUMMARY OF THE INVENTION

Taking such disadvantages of the existing techniques into consideration, the object of the invention is to provide a resin composition useful as a photo- or thermo-curing composition that can form a solid coating that can be efficiently cured by light or heat and is excellent in the shelf-stability, and can be preferably used for image recording materials used in such as three dimensional optical shaping and holography, planographic printing plate materials, color proofs, photo-resists and color filters, inks, paints and adhesives. And another object of the invention is to provide a thermo/photosensitive composition that is excellent in the film forming property, film strength and shelf-stability that are useful as a recording layer of a negative type planographic printing plate precursor.

The present inventors, after intensive study, have found that the object can be achieved by introducing a linkage group and a terminal group having a specific structure on a side chain of a polymer compound that plays a role of a binder in a resin composition, using a polymer compound that has a non-acidic hydrogen bonding group on a side chain and is soluble or swelling in water or an alkali aqueous solution as a polymer compound that plays a function as a binder in a thermo/photosensitive composition. Thereby, the invention was accomplished.

That is, the resin composition according to the invention includes (A) a polymer compound that has, through a linkage group containing a hydrogen-bonding group and a ring structure, a terminal ethylenic unsaturated bond on a side chain, and is soluble or swelling in water or an aqueous alkali solution (hereinafter, occasionally referred to as "specific alkali-soluble polymer compound A"), and (B) a compound that generates radicals when exposed to light or heat (hereinafter, occasionally referred to as "radical initiator").

As the hydrogen-bonding group, those having a structure represented by the following formula (a) are preferable.

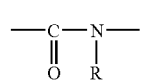

(a)

In the formula (a), R denotes a hydrogen atom or a monovalent organic group. Furthermore, R may form a heterocyclic structure together with a nitrogen atom in the formula; in that case, the heterocyclic structure becomes the ring structure. That is, as a linkage group in the invention, one having a structure represented by the following formula (b) or (c) is preferable.

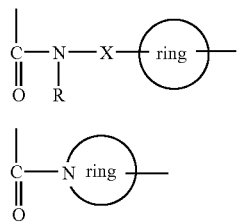

In the equation (b), the definition of R is the same as that in the formula (a), and X represents a single bond or an organic linkage group.

The ring structure involved in the invention is preferably a saturated cyclic hydrocarbon group or heterocyclic group having 3 to 20 carbon atoms, or an aromatic hydrocarbon group or a condensed polycyclic hydrocarbon group having 6 to 20 carbon atoms.

Furthermore, in the invention, a glass transition temperature of the specific alkali-soluble polymer compound A is preferably 60° C. or more.

Although the mechanism of the invention is not clear, such specific alkali-soluble polymer compound A has an ethylenic unsaturated bond on a side chain. The structure, having a functional group high in the radical reactivity, is excellent in the reactivity, and furthermore, a dense and strong crosslinking structure between polymer compounds can be rapidly formed by energy transfer during exposure. Accordingly, it is considered that a planographic printing plate precursor that contains such specific alkali-soluble polymer compound A as a component of a recording material can realize high sensitivity, and excellent press life and ink-affinity.

Furthermore, the specific alkali-soluble polymer compound A according to the invention has, as a linkage group between the terminal ethylenic unsaturated group and a main chain polymer, a hydrogen-bonding group and a ring structure. In a conventional alkali-soluble polymer compound having an ethylenic unsaturated bond, when an amount of the introduced ethylenic unsaturated groups is increased to improve the sensitivity, there is a problem in that the glass transition temperature thereof (Tg) decreases and the shelf-stability to light and heat deteriorates. However, in the specific alkali-soluble polymer compound A used in the invention, it is considered that the hydrogen-bonding properties of such linkage group and bulkiness of the ring structure restrict a rotation around a polymer compound main chain and enables to maintain a high glass transition temperature.

Furthermore, the thermo/photosensitive composition according to the invention includes (A') a polymer compound that has a non-acidic hydrogen-bonding group on a side chain and is soluble or swelling in water or an alkali aqueous solution, and (B') a compound that generates radicals when exposed to light or heat. The (A') polymer compound that has a non-acidic hydrogen-bonding group on a side chain and is soluble or swelling in water or an alkali aqueous solution, in a mode, further includes an ethylenic unsaturated bond on a side chain.

In the thermo/photosensitive composition according to the invention, as a polymer compound that plays a role of a binder, a polymer compound that has a non-acidic hydrogen-bonding group on a side chain and is soluble or swelling in water or an alkali aqueous solution (hereinafter, appropriately referred to as "specific alkali-soluble polymer A'") is used. In the following, although an operation thereof is not clear, a case where the thermo/photosensitive composition according to the invention is used particularly in a recording layer of a negative type planographic printing plate precursor will be explained.

A non-acidic hydrogen-bonding group used in the invention indicates a group that does not have proton-donating property and has proton accepting property, and furthermore in which atoms different in the electronegativity according to Pauling are combined, and, when a hetero atom is contained in constituent atoms, a hydrogen atom is not bonded to the hetero atom. As such non-acidic hydrogen-bonding group, for instance, a nitrile group can be cited; in this case, since a negative charge is largely polarized on a nitrogen atom, the nitrogen atom forms a hydrogen bond with a hydrogen atom of other functional group such as a carboxyl group present in the specific alkali-soluble polymer A' and thereby forms a strong film. Furthermore, the nitrile groups mutually interact with each other due to the polarity thereof and form a strong film; accordingly, an image of higher strength can be formed. Thus, a high press life is realized.

Furthermore, the specific alkali-soluble polymer A' according to the invention preferably has an ethylenic unsaturated bond on a side chain. Since the structure has a functional group high in the radical reactivity, immediately after generation of the radicals due to the energy transfer during exposure, crosslinking reactions take place between the specific alkali-soluble polymers A'. When a structural unit having such an unsaturated bond is contained in a polymer composition, the formation of a cured film, that is, insolubilization to a developer or an organic solvent very rapidly proceeds.

Furthermore, as mentioned above, the crosslinking reaction takes place immediately after the exposure, and furthermore, a cured film high in the crosslink density is formed owing to the hydrogen bond formed by the non-acidic hydrogen-bonding group, or a mutual interaction. Accordingly, in particular the ablation caused by infrared laser scanning exposure, that is, a phenomena in which other low molecular components, for instance, a photothermal converting agent, in the recording layer is released from the recording layer, does not take place. Accordingly, an effect is also exhibited that contamination of an optical system caused by the ablation is suppressed.

Furthermore, normally, in many cases where the cured film is formed utilizing a radical polymerization, for obtaining a sufficiently strong cured film, an oxygen-shielding layer (protective layer) is disposed as an upper layer of the recording layer in order to suppress radical polymerization hindrance caused by an external oxygen so that the polymerization reaction sufficiently proceeds. However, when the specific alkali-soluble polymer A' according to the invention is used as a binder, since a cured film high in the crosslinking density can be formed, an influence of the polymerization hindrance due to oxygen is practically hardly exhibited. Accordingly, it has merit in that there is no need of disposing the oxygen-shielding layer. Moreover, it is considered that since the compatibility between the binder according to the invention and other components that constitute the thermo/photosensitive composition, for instance radicals, is improved, a phase separation of the composition with passage of time can be suppressed, resulting in excellent shelf-stability.

The first aspect of the invention is to provide a resin composition (L), comprising:

a polymer compound A that has, through a linkage group containing a hydrogen-bonding group and a ring structure, a terminal ethylenic unsaturated bond on a side chain, and is soluble or swells in water or an alkali aqueous solution; and a compound B that generates a radical when exposed to light or heat.

The second aspect of the invention is to provide a resin composition (L), wherein the hydrogen-bonding group in the linkage group in the polymer compound A is represented by the following formula (a):

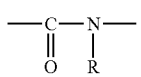

Formula (a)

wherein in formula (a), R represents a hydrogen atom or a monovalent organic group.

The third aspect of the invention is to provide a resin composition (L), wherein the ring structure in the linkage group in the polymer compound A is a saturated cyclic hydrocarbon group or heterocyclic group, which have 3 to 20 carbon atoms.

The fourth aspect of the invention is to provide a resin composition (L), wherein the ring structure in the linkage group in the polymer compound A is an aromatic hydrocarbon group or a condensed polycyclic hydrocarbon group, which have 6 to 20 carbon atoms.

The fifth aspect of the invention is to provide a resin composition (L), wherein a glass transition temperature of the polymer compound A is 60° C. or more.

The sixth aspect of the invention is to provide a resin composition (L), wherein the terminal ethylenic unsaturated bond on a side chain of the polymer compound A is represented by any one of the following general formulae (1) through (3):

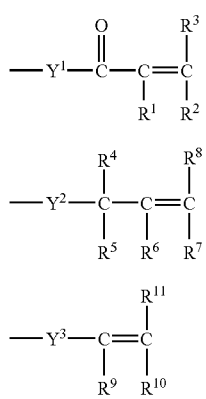

General formula (1)

General formula (2)

General formula (3)

wherein, in general formula (1), $R^1$ represents a hydrogen atom or a monovalent organic group; $R^2$ and $R^3$ each independently represent a hydrogen atom, a halogen atom, an amino group, a carboxyl group, an alkoxycarbonyl group, a sulfo group, a nitro group, a cyano group, or a monovalent organic group; $Y^1$ represents an oxygen atom, a sulfur atom, or $—NR^{12}—$; and $R^{12}$ represents a hydrogen atom or a monovalent organic group;

in general formula (2), $R^4$ through $R^8$ each independently represent a hydrogen atom, a halogen atom, an amino group, a dialkylamino group, a carboxyl group, an alkoxycarbonyl group, a sulfo group, a nitro group, a cyano group, or a monovalent organic group; $Y^2$ represents an oxygen atom, a sulfur atom, or $—NR^{12}—$; and $R^{12}$ represents a hydrogen atom or a monovalent organic group; and in general formula (3), $R^9$ represents a hydrogen atom or a monovalent organic group; $R^{10}$ and $R^{11}$ each independently represent a hydrogen atom, a halogen atom, an amino group, a dialkylamino group, a carboxyl group, an alkoxycarbonyl group, a sulfo group, a nitro group, a cyano group, or a monovalent organic group; $Y^3$ represents an oxygen atom, a sulfur atom, $—NR^{12}—$ or a phenylene group that may have a substituent; and $R^{12}$ represents a hydrogen atom or a monovalent organic group.

The seventh aspect of the invention is to provide a resin composition (L), wherein a content of the ethylenic unsaturated group in the polymer compound A is 1.5 meq/g or more per gram of the polymer compound A.

The eighth aspect of the invention is to provide a resin composition (L), wherein a weight average molecular weight of the polymer compound A is 6000 or more.

The nineth aspect of the invention is to provide a resin composition (L), wherein the linkage group is represented by the following formula (b) or (c), and has the ethylenic unsaturated bond as a substituent on the ring structure:

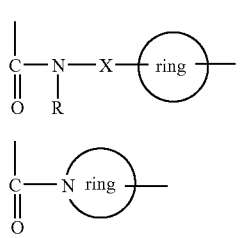

wherein in formula (b), R represents a hydrogen atom or a monovalent organic group, and X represents a single bond or an organic linkage group.

The tenth aspect of the invention is to provide a resin composition (L), wherein an acid value of the polymer compound A ranges from 0.5 to 30 meq/g.

The eleventh aspect of the invention is to provide a thermo/photosensitive composition (M), comprising:

a polymer compound A' that has a non-acidic hydrogen-bonding group on a side chain, and is soluble or swells in water or an alkali aqueous solution; and a compound B that generates a radical when exposed to light or heat.

The twelfth aspect of the invention is to provide a thermo/photosensitive composition (M), further comprising:

a sensitizing dye; and a radical polymerizing compound.

The thirteenth aspect of the invention is to provide a thermo/photosensitive composition (M), wherein a content of a structure unit that has the non-acidic hydrogen-bonding group in the polymer compound A' is 0.1 mol % or more.

The fourteenth aspect of the invention is to provide a thermo/photosensitive composition (M), wherein the polymer compound A' comprises at least one kind of acrylonitrile, methacrylonitrile, and a radical-polymerizing compound represented by the following formula (C-A) as a polymer unit of the polymer compound A':

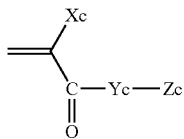

formula (C-A)

wherein in formula (C-A), X represents a hydrogen atom or a methyl group; Y represents an oxygen atom, a sulfur atom, or a N—W; W represents a hydrogen atom or an alkyl group having 1 to 10 carbon atoms that may have a substituent; and Z represents a group having a non-acidic hydrogen-bonding group.

The fifteenth aspect of the invention is to provide a thermo/photosensitive composition (M), wherein a content of the polymer compound A' ranges from 5 to 95% in terms of solid components.

The sixteenth aspect of the invention is to provide a thermo/photosensitive composition (M), wherein a weight average molecular weight of the polymer compound A' is 40,000 or more.

The seventeenth aspect of the invention is to provide a thermo/photosensitive composition (M), wherein the polymer compound A' comprises, as a polymer unit, a radical-polymerizing compound having an acid group.

The eighteenth aspect of the invention is to provide a thermo/photosensitive composition (M), wherein the polymer compound A' comprises, as a polymer unit, a radical-polymerizing compound having an acid group, and an acid value of the polymer compound A' ranges from 0.5 to 4.0 meq/g.

The nineteenth aspect of the invention is to provide a thermo/photosensitive composition (M), wherein the polymer compound A' comprises an ethylenic unsaturated bond on a side chain.

The twentieth aspect of the invention is to provide a thermo/photosensitive composition (M), wherein wherein the polymer compound A' comprises an ethylenic unsaturated bond on a side chain, and a group having the ethylenic unsaturated bond on a side chain of the polymer compound A' is represented by any one of the following general formulae (C-1) through (C-3):

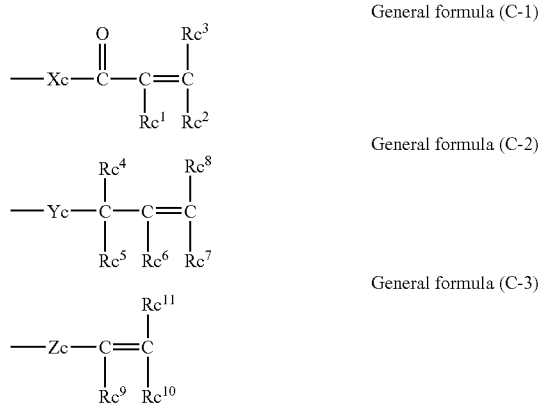

wherein in general formula (C-1), $Rc^1$ represents a hydrogen atom or a monovalent organic group; $Rc^2$ and $Rc^3$ each independently represent a hydrogen atom, a halogen atom, an amino group, a carboxyl group, an alkoxycarbonyl group, a sulfo group, a nitro group, a cyano group, or a monovalent organic group; and Xc represents an oxygen atom, a sulfur atom, or $—NRc^4-$, in which $Rc^4$ represents a hydrogen atom or a monovalent organic group;

in general formula (C-2), $Rc^4$ through $Rc^8$ each independently represent a hydrogen atom, a halogen atom, an amino group, a dialkylamino group, a carboxyl group, an alkoxycarbonyl group, a sulfo group, a nitro group, a cyano group, or a monovalent organic group; and Yc represents an oxygen atom, a sulfur atom, or $—NRc^4-$, in which $Rc^4$ represents a hydrogen atom or a monovalent organic group; and in general formula (C-3), $Rc^9$ represents a hydrogen atom or a monovalent organic group; $Rc^{10}$ and $Rc^{11}$ each independently represent a hydrogen atom, a halogen atom, an amino group, a dialkylamino group, a carboxyl group, an alkoxycarbonyl group, a sulfo group, a nitro group, a cyano group, or a monovalent organic group; and Zc represents an oxygen atom, a sulfur atom, $—NRc^{12}-$ or a phenylene group that may have a substituent, in which $Rc^{12}$ represents an alkyl group that may have a substituent.

DETAILED DESCRIPTION OF THE INVENTION

A resin composition according to the invention includes (A) a polymer compound that has, through a linkage group containing a hydrogen-bonding group and a ring structure, a terminal ethylenic unsaturated bond on a side chain, and is soluble or swelling in water or an alkali aqueous solution (specific alkali-soluble polymer compound A), and (B) a compound that generates radicals when exposed to light or heat (radical initiator). The resin composition according to the invention may further contain (C) a sensitizing pigment that has a function of absorbing light of a predetermined wavelength and converting it into heat, and, (D) a radical polymerizing compound for improving the sensitivity and the formability of a film.

Furthermore, a thermo/photosensitive composition according to the invention includes (A') a polymer compound that has a non-acidic hydrogen-bonding group on a side chain and is soluble or swelling in water or an alkali aqueous solution (specific alkali-soluble polymer A'), and (B') a compound that generates radicals when exposed to light or heat. Furthermore, the thermo/photosensitive composition according to the invention may further contain (C') a sensitizing pigment that has a function of absorbing light of a predetermined wavelength and converting it into heat, and, (D') a radical polymerizing compound for improving the sensitivity and the formability of film.

Still furthermore, the specific alkali-soluble polymer A' preferably has an ethylenic unsaturated bond on a side chain.

In the following, the respective compounds that can be used in the resin composition according to the invention will be explained sequencially. The expression "thermo/photosensitive" as used herein, relates to any composition which reacts in response to heat or light or to both heat and light. The term "light" or "photosensitive" broadly includes materials responsive to a wide variety of radiation including, but not limited to, visible light, infrared light, and UV radiation. The "light" may be coherent, as from a laser or not coherent, as from a lamp.

[(A) Specific Alkali-soluble Polymer A]

A specific alkali-soluble polymer A that is used as a binder component of a resin composition according to the invention is a polymer compound that has, on a side chain of a main chain polymer, a linkage group (hereinafter, appropriately referred to as "specific linkage group") having a hydrogen-bonding group and a ring structure, and a terminal ethylenic unsaturated bond, and is soluble or swelling in water or an alkali aqueous solution.

In the invention, being soluble in water or an alkali aqueous solution means that a specific alkali-soluble polymer A dissolves when water whose pH is 7 or more or an alkali aqueous solution is added thereto, and being swelling means that a specific alkali-soluble polymer A swells when added to water whose pH is 7 or more or an alkali aqueous solution.

(Linkage Group Having Hydrogen-bonding Group and Ring Structure)

A specific linkage group according to the invention has a hydrogen-bonding group and a ring structure between a main chain polymer and a terminal ethylenic unsaturated bond described later. In the following, such hydrogen-bonding group and ring structure will be detailed.

<Hydrogen-bonding Group>

As the hydrogen-bonding group that can be used in the specific linkage group in the invention, there is no particular restriction as far as it is a divalent linkage group having a hydrogen-bonding partial structure.

Specifically, an oxime group, urea group, amidine group, amino group, amide group, imide group, sulfonamide group, ether group, thiol group, imino group, thioether group, thiocarbonyl group, thioester group, carbamoyl group, ureide group, formyl group, carbamoyloxy group, sulfinyl group, sulfonyl group, sulfinamoyl group, sulfamoyl group, sulfonyl sulfamoyl group, sulfonylcarbamoyl group, phosphono group, phosphonoxy group, or ones that have a structure represented by the following formula (a) can be cited.

Among these, a urea group, amidine group, amide group, imide group, sulfonamide group, carbamoyl group, ureide group, carbamoyloxy group, sulfonylcarbamoyl group, or ones having a structure represented by the formula (a) is particularly preferable.

(a)

In the formula (a), R represents a hydrogen atom or a monovalent organic group. Among them, a hydrogen atom, an alkyl group that may have a substituent, and an aryl group that may have a substituent are preferable.

As substituents that can be introduced, an alkyl group, alkenyl group, alkynyl group, aryl group, alkoxy group, aryloxy group, halogen atom, amino group, alkylamino group, arylamino group, carboxy group, alkoxycarbonyl group, sulfo group, nitro group, cyano group, amide group, alkylsulfonyl group, arylsulfonyl group and hydroxy group can be cited.

Furthermore, the R may form a heterocyclic structure with a nitrogen atom in the formula; in that case, the heterocyclic group may become a ring structure described below. That is, as the linkage group in the invention, ones having structures represented by the following formulae (b) and (c) are preferable.

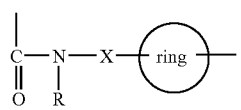

(b)

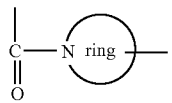

(c)

In the formula (b), the definition of R is the same as that in the formula (a).

X represents a single bond or an organic linkage group. As such organic linkage groups, ones that are polyvalent organic groups constituted of non-metal atoms and constituted of from 1 to 60 carbon atoms, from 0 to 10 nitrogen atoms, from 0 to 50 oxygen atoms, from 1 to 100 hydrogen atoms and from 0 to 20 sulfur atoms are preferable. As more specific structures, ones in which the following structural units are combined can be cited.

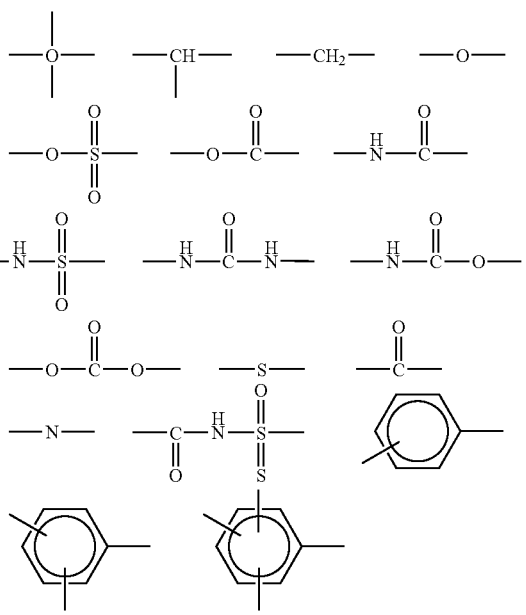

Furthermore, the linkage groups may have a substituent. As such substituent, a halogen atom, hydroxy group, carboxyl group, sulfonate group, nitro group, cyano group, amide group, amino group, alkyl group, alkenyl group, alkynyl group, aryl group, substituted oxy group, substituted sulfonyl group, substituted carbonyl group, substituted sulfinyl group, sulfo group, phosphono group, phosphonate group, silyl group, and heterocyclic group can be cited.

<Ring Structure>

As a ring structure that is used in the specific linkage group in the invention, there is no particular restriction as far as one forms a ring structure, such as a saturated or unsaturated cyclic hydrocarbon group and a heterocyclic group. Furthermore, such ring structure may be a monocyclic structure or a condensed polycyclic structure.

Among them, saturated cyclic hydrocarbon groups or heterocyclic groups having 3 to 20 carbon atoms, or aromatic hydrocarbon groups or condensed polycyclic hydrocarbon groups having 6 to 20 carbon atoms are preferable.

The ring structures may further have a substituent; as such substituent that can be introduced, an alkyl group, alkenyl group, alkynyl group, aryl group, alkoxy group, aryloxy group, halogen atom, amino group, alkylamino group, arylamino group, carboxy group, alkoxycarbonyl group, sulfo group, nitro group, cyano group, amide group, alkylsulfonyl group, arylsulfonyl group, and hydroxy group can be cited.

As specific examples of such ring structure, a cyclopropane ring, cyclobutane ring, cyclopentane ring, cyclohexane ring, cycloheptane ring, benzene ring, naphthalene ring, indene ring, azulene ring, acenaphthylene ring, fluorene ring, phenalene ring, phenanthrene ring, anthracene ring, bicyclo[3,2,1]octane ring, furan ring, thiophene ring, pyrane ring, pyridine ring, pyrazine ring, pyrimidine ring, pyrrolidine ring, and piperidine ring can be cited. Among these, a cyclopentane ring, cyclohexane ring, benzene ring, naphthalene ring, bicyclo[3,2,1]octane ring, pyridine ring, pyrrolidine ring, and piperidine ring are particularly preferable.

(Terminal Ethylenic Unsaturated Bond)

The specific alkali-soluble polymer A according to the invention has, on a side chain of a main chain polymer, the specific linkage group and the terminal ethylenic unsaturated bond. As such terminal ethylenic unsaturated bond, ones that are represented by the following general formulae (1) through (3) are preferable.

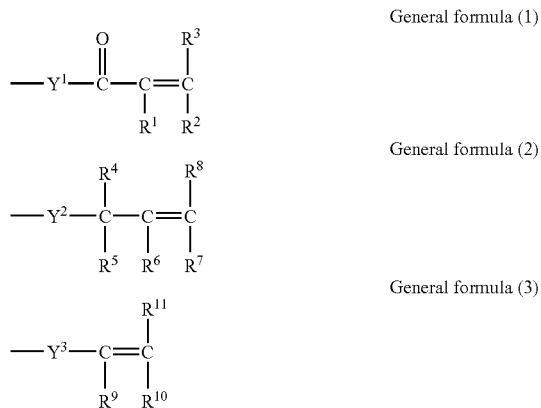

General formula (1)

General formula (2)

General formula (3)

In the general formula (1), $R^1$ represents a hydrogen atom or a monovalent organic group; a hydrogen atom or an alkyl group that may have a substituent can be preferably cited; among these, a hydrogen atom and a methyl group are preferable because they are high in radical reactivity.

$R^2$ and $R^3$ each independently represent a hydrogen atom, halogen atom, amino group, carboxyl group, alkoxycarbonyl group, sulfo group, nitro group, cyano group, or a monovalent organic group; as the monovalent organic group, an alkyl group that may have a substituent, aryl group that may have a substituent, alkoxy group that may have a substituent, aryloxy group that may have a substituent, alkylamino group that may have a substituent, arylamino group that may have a substituent, alkylsulfonyl group that may have a substituent, and arylsulfonyl group that may have a substituent can be cited. Among these, a hydrogen atom, carboxyl group, alkoxycarbonyl group, alkyl group that may have a substituent, and aryl group that may have a substituent are preferable because they are high in radical reactivity.

$Y^1$ represents -Z-O—, —S—, or —$NR^{12}$—.

Here, Z represents a single bond or an organic linkage group; specifically, ones similar to X in the general formula (b) can be cited. $R^{12}$ represents a hydrogen atom or a monovalent organic group; preferably, a hydrogen atom and an alkyl group that may have a substituent can be cited; among these, a hydrogen atom, methyl group, ethyl group, and isopropyl group are preferable because they are high in radical reactivity.

As such $Y^1$, one that is represented by -Z-O— is most preferable.

As a substituent that can be introduced in each of the $R^1$ through $R^3$ and $R^{12}$, an alkyl group, alkenyl group, alkynyl group, aryl group, alkoxy group, aryloxy group, halogen atom, amino group, alkylamino group, arylamino group, carboxyl group, alkoxycarbonyl group, sulfo group, nitro group, cyano group, amide group, alkylsulfonyl group, and arylsulfonyl group can be cited.

In the general formula (2), $R^4$ through $R^8$ each independently represents a hydrogen atom, halogen atom, amino group, dialkylamino group, carboxyl group, alkoxycarbonyl group, sulfo group, nitro group, cyano group, or monovalent organic group; as the monovalent organic group, an alkyl group that may have a substituent, aryl group that may have a substituent, alkoxy group that may have a substituent, aryloxy group that may have a substituent, alkylamino group that may have a substituent, arylamino group that may have a substituent, alkylsulfonyl group that may have a substituent, and arylsulfonyl group that may have a substituent can be cited. Among these, a hydrogen atom, carboxyl group, alkoxycarbonyl group, alkyl group that may have a substituent, and aryl group that may have a substituent are preferable. As substituents that can be introduced, substituents similar to those cited in the general formula (1) can be cited.

$Y^2$ represents an oxygen atom, sulfur atom, or —$NR^{12}$—. The definition of $R^{12}$ is the same as that in general formula (1).

In the general formula (3), $R^9$ represents a hydrogen atom or a monovalent organic group; a hydrogen atom or an alkyl group that may have a substituent can be preferably cited; among them, a hydrogen atom and a methyl group are preferable because they are high in radical reactivity.

$R^{10}$ and $R^{11}$ each independently represent a hydrogen atom, halogen atom, amino group, dialkylamino group, carboxyl group, alkoxycarbonyl group, sulfo group, nitro group, cyano group, or a monovalent organic group; as the monovalent organic group, an alkyl group that may have a substituent, aryl group that may have a substituent, alkoxy group that may have a substituent, aryloxy group that may have a substituent, alkylamino group that may have a substituent, arylamino group that may have a substituent, alkylsulfonyl group that may have a substituent, and arylsulfonyl group that may have a substituent can be cited. Among them, a hydrogen atom, carboxyl group, alkoxycarbonyl group, alkyl group that may have a substituent, and aryl group that may have a substituent are preferable because they are high in radical reactivity.

As substituents that can be introduced, those cited for substituents in the general formula (1) can be cited.

$Y^3$ represents an oxygen atom, sulfur atom, —$NR^{12}$—, or phenylene group that may have a substituent. The definition of $R^{12}$ is the same as that in the general formula (1).

Among such terminal ethylenic unsaturated bonds, ones that are represented by the general formula (1) are preferable from a viewpoint of the sensitivity.

As structure unit of the specific alkali-soluble polymer A having a specific linkage group and a terminal ethylenic unsaturated bond recited in the invention, those that are represented by the following general formula (4) can be cited.

General formula (4)

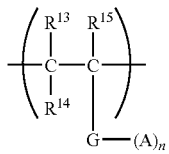

In the general formula (4), G represents a specific linkage group according to the invention; A represents a terminal ethylenic unsaturated group; and n represents an integer of from 1 to 8.

$R^{13}$ and $R^{14}$ each independently represent a hydrogen atom, halogen atom, amino group, carboxyl group, alkoxycarbonyl group, sulfo group, nitro group, cyano group, or a monovalent organic group; as the monovalent organic group, an alkyl group that may have a substituent, aryl group that may have a substituent, alkoxy group that may have a substituent, aryloxy group that may have a substituent, alkylamino group that may have a substituent, arylamino group that may have a substituent, alkylsulfonyl group that may have a substituent, and arylsulfonyl group that may have a substituent can be cited. Among them, a hydrogen atom is preferable.

$R^{15}$ represents a hydrogen atom or a monovalent organic group; a hydrogen atom or an alkyl group that may have a substituent can be preferably cited; among them, a hydrogen atom and a methyl group are particularly preferable.

Among such structure units, according to the invention, those represented by the following general formulae (5) and (5') are particularly preferable; and the specific alkali-soluble polymer A preferably contains at least one such structure units.

General formula (5)

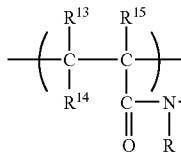

General formula (5')

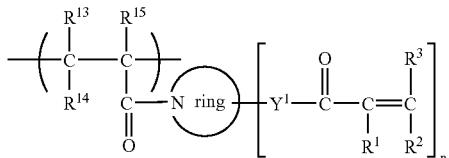

In the general formulae (5) and (5'), the definition of R and X are as that in the general formula (b).

The definitions of $R^1$ through $R^3$ and $Y^4$ are the same as those in the general formula (1), and the definitions of $R^{13}$ through $R^{15}$ and n are the same as those in the general formula (4).

The specific alkali-soluble polymer A according to the invention can be manufactured according to at least one of the following synthesis methods 1) through 3).

Synthesis Method 1)

This is a method in which one kind of or two or more kinds of radical-polymerizing compounds that are represented by the following general formulae (6), (6'), (7) or (7'), and, optionally, one kind of or two or more kinds of other radical-polymerizing compounds are allowed to co-polymerize according to an ordinary radical polymerization method, thereby a precursor of a desired polymer compound is synthesized; thereafter, by use of a base, a proton is pulled-out and $L^1$ or $L^2$ is eliminated; thereby a desired polymer compound that has a structure represented by the general formula (1) is obtained.

At that time, in the manufacture of a polymer compound precursor, generally known suspension polymerization method or solution polymerization method can be applied. As a constituent of the copolymer, any one of block copolymer, random copolymer and graft copolymer can be applicable.

General formula (6)

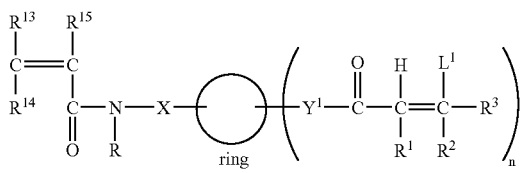

General formula (6')

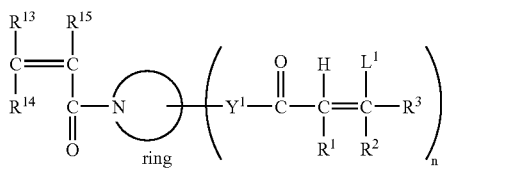

General formula (7)

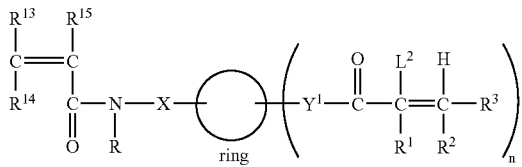

General formula (7')

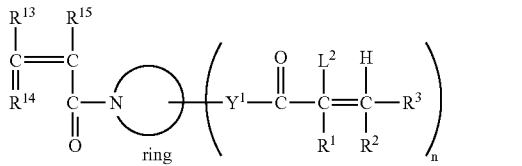

In the formulae, the definitions of R and X are the same as those in the general formula (b).

The definitions of $R^1$ through $R^3$ and Y are the same as those in the general formula (1), and the definitions of $R^{13}$ through $R^{15}$ and n are the same as those in the general formula (4).

$L^1$ and $L^2$ represent an anionic elimination group. As specific examples, a halogen atom, sulfonic acid group, sulfinic acid group, carboxylic acid group, cyano group, ammonium group, azide group, sulfonium group, nitro group, hydroxy group, alkoxy group, phenoxy group, thioalkoxy group, and oxonium group can be cited; and, a halogen atom, sulfonic acid group, ammonium group, and sulfonium group are preferable. Among them, a chlorine atom, bromine atom, iodine atom, alkylsulfonic acid group and arylsulfonic acid group are particularly preferable. As examples of the preferable alkylsulfonic acid groups, a methane sulfonic acid group, ethanesulfonic acid group, 1-propanesulfonic acid group, iso-propylsulfonic acid group, 1-butanesulfonic acid group, 1-octylsulfonic acid group, 1-hexadecanesulfonic acid group, trifluoromethanesulfonic acid group, trichloromethanesulfonic acid group, 2-chloro-1-ethanesulfonic acid group, 2,2,2-trifluoroethanesulfonic acid group, 3-chloropropanesulfonic acid group, perfluoro-1-butanesulfonic acid group, perfluoro-1-octanesulfonic acid group, 10-camphorsulfonic acid group, and benzylsulfonic acid group can be cited. As examples of preferable arylsulfonic acid groups, benzenesulfonic acid group, trans-β-styrenesulfonic acid group, 2-nitrobenzenesulfonic acid group, 2-acetylbenzenesulfonic acid group, 3-(trifluoromethyl)benzenesulfonic acid group, 3-nitrobenzenesulfonic acid group, 4-nitrobenzenesulfonic acid group, p-toluenesulfonic acid group, 4-tert-butylbenzenesulfonic acid group, 4-fluorobenzenesulfonic acid group, 4-chlorobenzenesulfonic acid group, 4-bromobenzenesulfonic acid group, 4-iodobenzenesulfonic acid group, 4-methoxybenzenesulfonic acid group, 4-(trifluoromethoxy)benzenesulfonic acid group, 2,5-dichlorobenzenesulfonic acid group, 2-nitro-4-(trifluoromethyl)-benzenesulfonic acid group, 4-chloro-3-nitrobenzenesulfonic acid group, 2,4-dinitrobenzenesulfonic acid group, 2-mesitylenesulfonic acid group, 2,4,6-triisopropylbenzenesulfonic acid group, pentafluorobenzenesulfonic acid group, 1-naphthalenesulfonic acid group, and 2-naphthalenesulfonic acid group can be cited.

<Bases Used to Bring About Elimination Reaction>

Furthermore, as bases used to bring about the elimination reaction, hydrides, hydroxides or carbonates of alkali metals, organic amine compounds and metal alkoxide compounds can be cited as preferable examples.

As preferable examples of hydrides, hydroxides and carbonates of alkali metals, sodium hydride, calcium hydride, potassium hydride, sodium hydroxide, potassium hydroxide, calcium hydroxide, potassium carbonate, sodium carbonate, potassium hydrogen carbonate, and sodium hydrogen carbonate can be cited.

As preferable examples of organic amine compounds, trimethylamine, triethylamine, diethylmethylamine, tributylamine, triisobutylamine, trihexylamine, trioctylamine, N,N-dimethylcyclohexylamine, N,N-diethylcyclohexylamine, N-methyldicyclohexylamine, N-ethyldicyclohexylamine, pyrrolidine, 1-methylpyrrolidine, 2,5-dimethylpyrrolidine, piperidine, 1-methylpiperidine, 2,2,6,6-tetramethylpiperidine, piperazine, 1,4-dimethylpiperazine, quinuclidine, 1,4-diazabicyclo[2,2,2]-octane, hexamethylene tetramine, morpholine, 4-methylmorpholine, pyridine, picoline, 4-dimethylaminopyridine, lutidine, 1,8-diazabicyclo[5,4,0]-7-undecene (DBU), N,N'-dicyclohexylcarbodiimide (DCC), diisopropylethylamine, and Schiff bases can be cited.

As preferable examples of metal alkoxide compounds, sodium methoxide, sodium ethoxide, and potassium-t-butoxide can be cited. These bases may be used singly or in combination.

In the elimination reaction recited in the invention, as solvents used when the base is added, for instance, ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethyl acetamide, dimethylsulfoxide, toluene, ethyl acetate, methyl lactate, ethyl lactate, and water can be cited. These solvents can be used singly or in combination.

An amount of a base being used may be equivalent, less, or more with respect to an amount of a specific functional group in a compound.

Furthermore, when a base is excessively used, after the elimination reaction, in order to remove the excess base, an acid can be preferably added. As examples of acids, inorganic acids such as hydrochloric acid, sulfuric acid, nitric acid, hydrobromic acid and perchloric acid, and organic acids such as acetic acid, fluoroacetic acid, trifluoroacetic acid, methanesulfonic acid, p-toluenesulfonic acid and trifluoromethanesulfonic acid can be cited.

The temperature condition in the elimination reaction may be any one of room temperature, cooling, and heating condition. A preferable condition is in the range of −20 to 100° C.

Here, specific examples of the radical polymerizing compounds represented by general formulae (6) or (6') will be cited; however, the invention is not restricted to these.

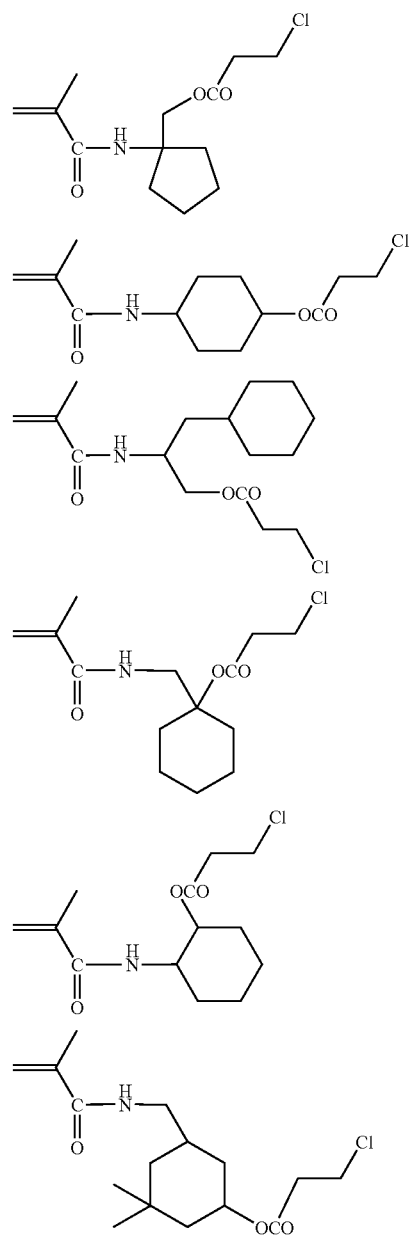

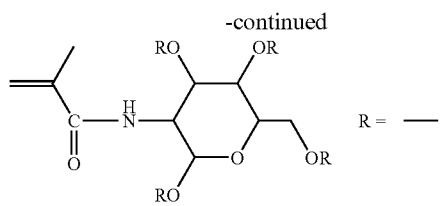
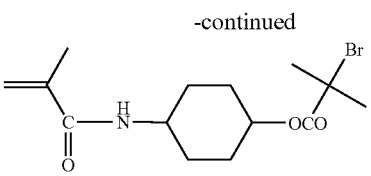
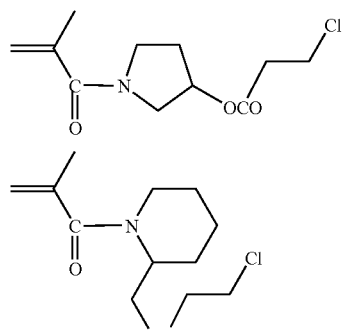
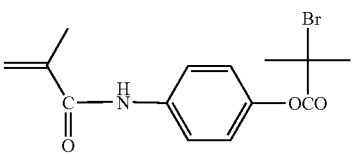
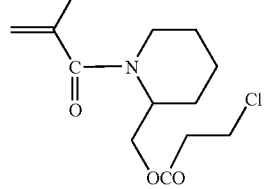
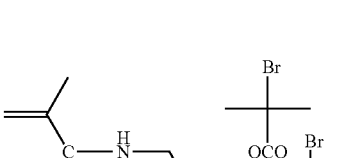
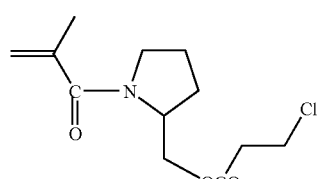
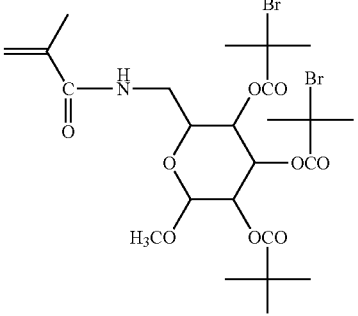
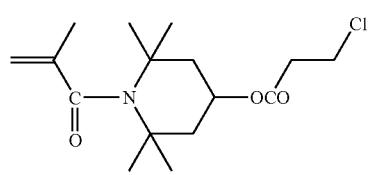
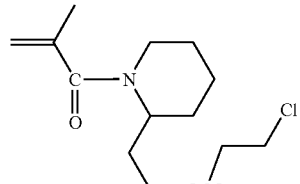
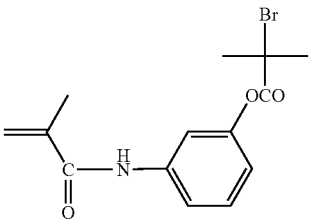
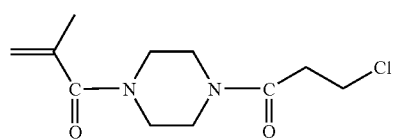
Subsequently, specific examples of the radical polymerizing compounds represented by general formulae (7) or (7') will be cited; however, invention is not restricted to these.
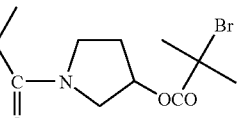
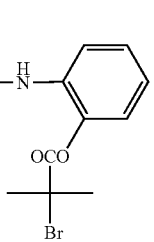
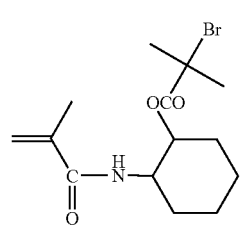
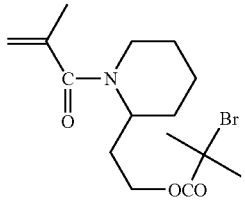
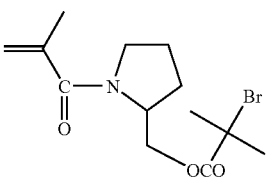
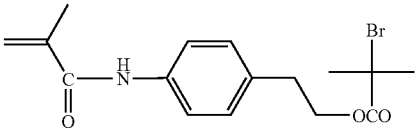

-continued

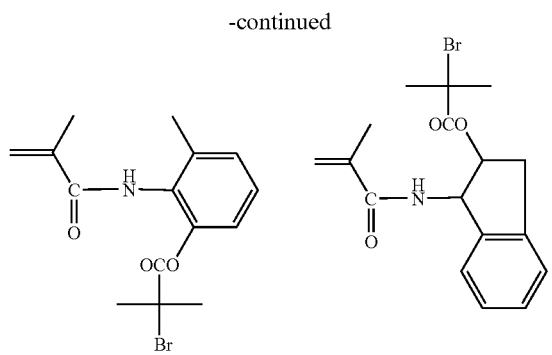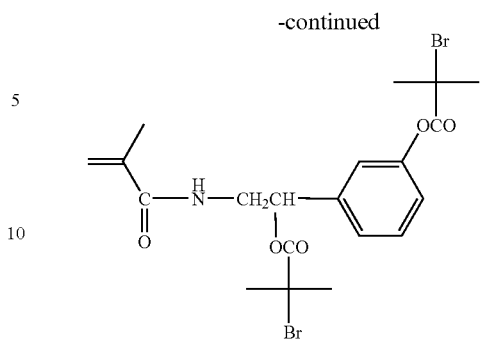

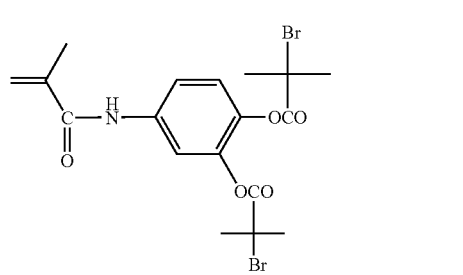

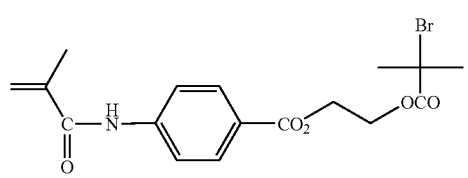

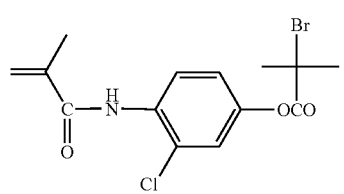

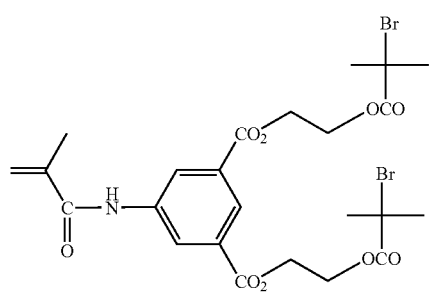

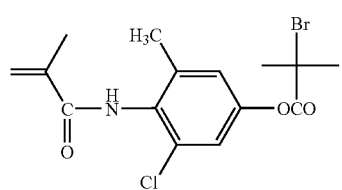

Synthesis Method 2)

This is a method in which a base polymer compound having a unit represented by the following general formula (8) or (8') and a compound that has a side chain functional group that can react with Z in the general formula (8) or (8') and a structure represented by the foregoing general formulae (1), (2), (3) are allowed to react, and thereby a desired polymer is obtained.

General formula (8)

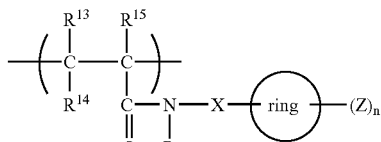

General formula (8')

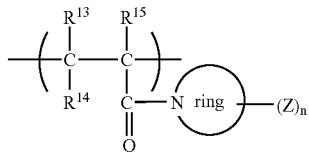

In the formula, the definitions of R and X are the same as those in the general formula (b).

The definitions of $R^{13}$ through $R^{15}$ and n are the same as those in the general formula (4).

Z is selected from a hydroxide group, carboxyl group, carboxylic acid halide group, carboxylic acid anhydride group, amino group, halogenated alkyl group, isocyanate group and epoxy group.

As compounds that have a side chain functional group that can react with Z and a structure represented by the general formula (1), (2), or (3), 2-hydroxyethyl acrylate, 2-hydroxylethyl methacrylate, 4-hydroxybutyl acrylate, 4-hydroxybutyl methacrylate, acrylic acid, methacrylic acid, acrylic acid chloride, methacrylic acid chloride, N,N-dimethyl-2-aminoethyl methacrylate, 2-chloroethyl methacrylate, 2-isocyanic acid ethyl methacrylate, 3-isocyanic acid propyl methacrylate, glycidyl acrylate, glycidyl methacrylate, 3,4-epoxycyclohexylmethyl acrylate, 3,4-epoxycyclohexylmethyl methacrylate, 2-bromoethyl methacrylate, 3-bromopropyl methacrylate, 2-hydroxyethyl methacrylamide, 4-hydroxybutyl methacrylamide, itaconic acid, ethylene glycol monovinyl ether, propylene glycol monovinyl ether, butylene glycol monovinyl ether, diethylene glycol monovinyl ether, 1-chloroethyl vinyl ether, 1-aminoethyl vinyl ether, 4-chloromethyl styrene, p-styrene carboxylic acid, allyl alcohol, allylamine, diallyl amine, 2-allyloxyethyl alcohol, 2-chloro-1-butene, allyl isocyanate, and allyl bromide can be cited.

Synthesis Method 3)

This is a method in which one kind of or two or more kinds of radical-polymerizing compounds that have an unsaturated group represented by the general formula (2) and an ethylenic unsaturated group having higher addition polymerizability than the unsaturated group, and, optionally, another radical-polymerizing compound are allowed to polymerize, and thereby a polymer compound is obtained. As examples of the radical-polymerizing compound that has an unsaturated group represented by the general formula (2) and an ethylenic unsaturated group having higher addition polymerizability than the unsaturated group, N,N-diallylacrylamide, N,N-diallylmethacrylamide, allylacrylamide, allylmethacrylamide, and 4-allyloxyphenyl methacrylate can be cited.

A content of a structure units having the specific linkage group and the terminal ethylenic unsaturated bond in the specific alkali-soluble polymer A recited in the invention is necessary to be 0.1 mol % or more, preferably in the range of from 20 to 80 mol %, and more preferably in the range of from 30 to 60 mol %. In the range, the film forming property and the film strength tend to be excellent.

Furthermore, a structure unit having an ethylenic unsaturated group other than the structure unit having the specific linkage group and the terminal ethylenic unsaturated bond may be contained. In this case, a molar ratio, that is, a ratio of (building blocks having a specific linkage group and terminal ethylenic unsaturated bond) to (other building blocks having an ethylenic unsaturated group) is in the range of from 9:1 to 1:9, preferably in the range of 9:1 to 3:1, and more preferably in the range of 3:1 to 2:1. In the range, the film forming property and the film strength tend to be excellent. As the other structure unit containing an ethylenic unsaturated group, those represented by the following general formula (9) are preferable in view of curing property.

General formula (9)

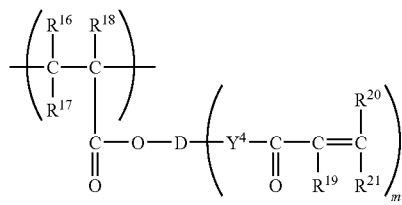

In the formula (9), $R^{16}$ through $R^{21}$ represent a hydrogen atom or a methyl group. $Y^2$ represents an oxygen atom or $-NR^{22}-$, and $R^{22}$ represents a hydrogen atom or a methyl group. D represents an alkylene group having 2 to 10 carbon atoms, and m represents an integer of 1 to 6.

A content of the ethylenic unsaturated group in the specific alkali-soluble polymer A recited in the invention, when expressed in terms of the chemical equivalent per gram of polymer, is preferably 1.5 meq/g or more, and particularly preferably in the range of 2.0 to 6.0 meq/g. When the content is less than 1.5 meq/g, the film curing property is deficient; accordingly, when used as a recording material of a planographic printing plate precursor, the sufficient image strength cannot be obtained. On the contrary, when the content exceeds 6.0 meq/g, the shelf-stability deteriorates.

With the specific alkali-soluble polymer A recited in the invention, for improving various performances such as the film strength and so on, other radical-polymerizing compound can be preferably co-polymerized as far as the effect of the invention is not damaged.

As such other radical-polymerizing compounds, radical-polymerizing compounds selected from, for instance, acrylic acid esters, methacrylic acid esters, acrylamides, methacrylamides, styrenes, acrylonitriles, and methacrylonitriles can be cited.

Specifically, for instance, acrylic acid esters such as alkyl acrylates (the number of carbon atoms in the alkyl group is preferably from 1 to 20) (specifically, for instance, benzil acrylate, 4-biphenyl acrylate, butyl acrylate, sec-butyl acrylate, t-butyl acrylate, 4-t-butylphenyl acrylate, 4-chlorophenyl acrylate, pentachlorophenyl acrylate, 4-cyanobenzyl acrylate, cyanomethyl acrylate, cyclohexyl acrylate, 2-ethoxyethyl acrylate, ethyl acrylate, 2-ethylhexyl acrylate, heptyl acrylate, hexyl acrylate, isobornyl acrylate, isopropyl acrylate, methyl acrylate, 3,5-dimethyladamanthyl acrylate, 2-naphthyl acrylate, neopentyl acrylate, octyl acrylate, phenethyl acrylate, phenyl acrylate, propyl acrylate, tolyl acrylate, amyl acrylate, tetrahydrofurfuryl acrylate, 2-hydroxyethyl acrylate, 3-hydroxypropyl acrylate, 2-hydroxypropyl acrylate, 4-hydroxybutyl acrylate, 5-hydroxypentyl acrylate, allyl acrylate, 2-allyloxyethyl acrylate and propargyl acrylate); methacrylic acid esters such as alkyl methacrylates (the number of carbon atoms in the alkyl group is preferably from 1 to 20) (for instance, benzyl methacrylate, 4-biphenyl methacrylate, butyl methacrylate, sec-butyl methacrylate, t-butyl methacrylate, 4-t-butylphenyl methacrylate, 4-chlorophenyl methacrylate, pentachlorophenyl methacrylate, 4-cyanophenyl methacrylate, cyanomethyl methacrylate, cyclohexyl methacrylate, 2-ethoxyethyl methacrylate, ethyl methacrylate, 2-ethylhexyl methacrylate, heptyl methacrylate, hexyl methacrylate, isobornyl methacrylate, isopropyl methacrylate, methyl methacrylate, 3,5-dimethyladamanthyl methacrylate, 2-naphthyl methacrylate, neopentyl methacrylate, octyl methacrylate, phenethyl methacrylate, phenyl methacrylate, propyl methacrylate, tolyl methacrylate, amyl methacrylate, tetrahydrofurfuryl methacrylate, 2-hydroxyethyl methacrylate, 3-hydroxypropyl methacrylate, 2-hydroxypropyl methacrylate, 4-hydroxybutyl methacrylate, 5-hydroxypentyl methacrylate, allyl methacrylate, 2-allyloxyethyl methacrylate and propargyl methacrylate); acrylamides such as acrylamide, N-alkylacrylamides and so the like (for instance, N-methylacrylamide, N-ethylacrylamide, N-propylacrylamide, N-isopropylacrylamide, morphorylacrylamide, piperidylacrylamide, N-butylacrylamide, N-sec-butylacrylamide, N-t-butylacrylamide, N-hexylacrylamide, N-cyclohexylacrylamide, N-phenylacrylamide, N-naphthylacrylamide, N-hydroxymethylacrylamide, N-hydroxyethylacrylamide, N-allylacrylamide, N-propargylacrylamide, 4-hydroxyphenylacrylamide, 2-hydroxyphenylacrylamide, N,N-dimethylacrylamide, N,N-diethylacrylamide, N,N-dipropylacrylamide, N,N-diisopropylacrylamide, N,N-dibutylacrylamide, N,N-di-sec-butylacrylamide, N,N-di-t-butylacrylamide, N,N-dihexylacrylamide, N,N-dicyclohexylacrylamide, N,N-phenylacrylamide, N,N-dihydroxyethylacrylamide, N,N-diallylacrylamide, and N,N-dipropargylacrylamide); methacrylamides such as methacrylamide, N-alkylmethacrylamides and the like (for instance, N-methylmethacrylamide, N-ethylmethacrylamide, N-propylmethacrylamide, N-isopropylmethacrylamide, morphorylmethacrylamide, piperidylmethacrylamide, N-butylmethacrylamide, N-sec-butylmethacrylamide, N-t-butylmethacrylamide, N-hexylmethacrylamide, N-cyclohexylmethacrylamide, N-phenylmethacrylamide, N-naphthylmethacrylamide, N-hydroxymethylmethacrylamide, N-hydroxyethylmethacrylamide, N-allylmethacrylamide, N-propargylmethacrylamide, 4-hydroxyphenylmethacrylamide, 2-hydroxyphenylmethacrylamide, N,N-dimethylmethacrylamide, N,N-diethylmethacrylamide, N,N-dipropylmethacrylamide, N,N-diisopropylmethacrylamide, N,N-dibutylmethacrylamide, N,N-di-sec-butylmethacrylamide, N,N-di-t-butylmethacrylamide, N,N-dihexylmethacrylamide, N,N-dicyclohexylmethacrylamide, N,N-phenylmethacrylamide, N,N-dihydroxyethylmethacrylamide, N,N-diallylmethacrylamide, and N,N-dipropargylmethacrylamide); styrenes such as styrene, alkylstyrene and the like (for instance, methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene and acetoxymethylstyrene); alkoxystyrenes (for instance, methoxystyrene, 4-methoxy-3-methylstyrene, and dimethoxystyrene); halogen styrenes (for instance, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, and 4-fluoro-3-trifluoromethylstyrene); acrylonitriles; and methacrylonitriles can be cited.

Among the other radical-polymerizing compounds, those that can be preferably used are methacrylic acid esters, acrylamides, methacrylamides and styrenes; those that are particularly preferably used are benzyl methacrylate, t-butyl methacrylate, 4-t-butylphenyl methacrylate, pentachlorophenyl methacrylate, 4-cyanophenyl methacrylate, cyclohexyl methacrylate, ethyl methacrylate, 2-ethylhexyl methacrylate, isobornyl methacrylate, isopropyl methacrylate, methyl methacrylate, 3,5-dimethyladamanthyl methacrylate, 2-naphthyl methacrylate, neopentyl methacrylate, phenyl methacrylate, tetrahydrofurfuryl methacrylate, 2-hydroxyethyl methacrylate, 3-hydroxypropyl methacrylate, 2-hydroxypropyl methacrylate, allyl methacrylate, acrylamide, N-methylacrylamide, N-isopropylacrylamide, morphorylacrylamide, piperidylacrylamide, N-t-butylacrylamide, N-cyclohexylacrylamide, N-phenylacrylamide, N-naphthylacrylamide, N-hydroxymethylacrylamide, N-hydroxyethylacrylamide, N-allylacrylamide, 4-hydroxyphenylacrylamide, 2-hydroxyphenylacrylamide, N,N-dimethylacrylamide, N,N-diisopropylacrylamide, N,N-di-t-butylacrylamide, N,N-dicyclohexylacrylamide, N,N-phenylacrylamide, N,N-dihydroxyethylacrylamide, N,N-diallylacrylamide, methacryamide, N-methylmethacrylamide, N-isopropylmethacrylamide, morphorylmethacrylamide, piperidylmethacrylamide, N-t-butylmethacrylamide, N-cyclohexylmethacrylamide, N-phenylmethacrylamide, N-naphthylmethacrylamide, N-hydroxymethylmethacrylamide, N-hydroxyethylmethacrylamide, N-allylmethacrylamide, 4-hydroxyphenylmethacrylamide, 2-hydroxyphenylmethacrylamide, N,N-dimethylmethacrylamide, N,N-diisopropylmethacrylamide, N,N-di-t-butylmethacrylamide, N,N-dicyclohexylmethacrylamide, N,N-phenylmethacrylamide, N,N-dihydroxyethylmethacrylamide, N,N-diallylmethacrylamide, styrene, methylstyrene, dimethylstyrene, trimethylstyrene, isopropylstyrene, butylstyrene, cyclohexylstyrene, chloromethylstyrene, trifluoromethylstyrene, ethoxymethylstyrene, acetoxymethylstyrene, methoxystyrene, 4-methoxy-3-methylstyrene, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, and 4-fluoro-3-trifluoromethylstyrene.

One kind or two or more kinds of them can be used, and a content of these copolymerization components in the specific alkali-soluble polymer A is preferably, from 0 to 90 mol %, and particularly preferably from 0 to 60 mol %. When it exceeds 60 mol %, a strength of cured film becomes deficient.

Furthermore, the specific alkali-soluble polymer A recited in the invention, in order to improve various performances such as alkali-solubility of an unexposed area, may be co-polymerized with a radical polymerizing compound having an acid group.

As such acid groups, there are, for instance, a carboxylic acid group, sulfonic acid group, phosphoric acid group, and phenolic hydroxy group; among these, a particularly preferable one is carboxylic acid group. As radical-polymerizing compounds that contain a carboxylic acid group, there are, for instance, acrylic acid, methacrylic acid, itaconic acid, crotonic acid, isocrotonic acid, maleic acid, and p-carboxyl styrene. Furthermore, those that have a ring structure as the linkage group, such as 2-methacryloyloxyethylhexahydrophthalic acid and 2-methacryloyloxyethylphthalic acid, and those represented by the following general formula (10) such as 2-methacryloyloxyethylsuccinic acid are preferable from a viewpoint of the press life and developability.

General formula (10)

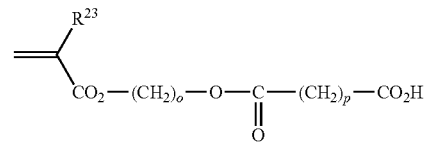

($R^{25}$ represents a hydrogen atom or a methyl group; and o and p each independently represent an integer from 1 to 10.)

As radical-polymerizing compounds that have an acid group, one kind or two or more kinds of them can be used, and a content of these co-polymerization components, in terms of the chemical equivalent per gram of the specific alkali-soluble polymer A, is preferably 0.1 meq/g or more, and more preferably in the range of from 0.5 to 3.0 meq/g. When the content exceeds 3.0 meq/g, in the case of a resin composition recited in the invention is used as a recording material of a planographic printing plate precursor, the image strength is likely to be deteriorated by alkali-development.

As solvents that can be used when such specific alkali-soluble polymer A is synthesized, for instance, ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate, and ethyl lactate can be cited.

These solvents can be used singly or in combination.

A weight average molecular weight of the specific alkali-soluble polymer A recited in the invention is preferably 6,000 or more, and more preferably in the range of 50,000 to 200,000. The molecular weight less than 6,000 is not preferable because the film curing property and the film strength become deficient. When it exceeds 200,000, the alkali solubility decreases.

A glass transition temperature of the resin composition recited in the invention is preferably 60° C. or more, more preferably 80° C. or more, and further more preferably 100° C. or more. When it is less than 60° C., the stability tends to deteriorate.

Furthermore, the specific alkali-soluble polymer A recited in the invention may contain a non-reacted monomer. In this case, a proportion of the monomer in the polymer compound is preferably 15 mass % or less.

In the following, specific examples of specific alkali-soluble polymer A recited in the invention, and typical synthesis examples will be cited; however, the invention is not restricted to the examples.

| Polymer Compound | Composition (mol %) | Mw |
|---|---|---|
| 1 | 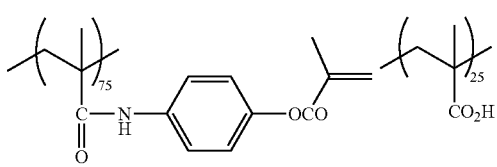 | 98000 |
| 2 | 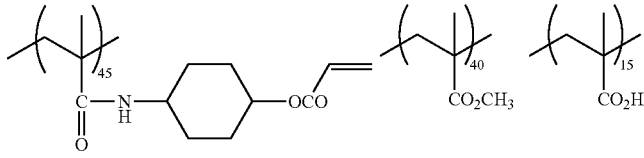 | 89000 |
| 3 | 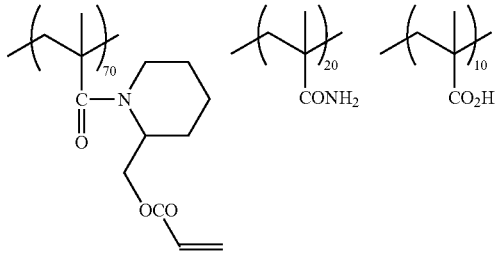 | 78000 |
| 4 | 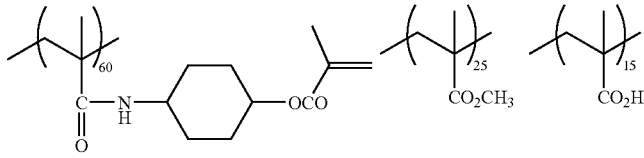 | 101000 |
| 5 | 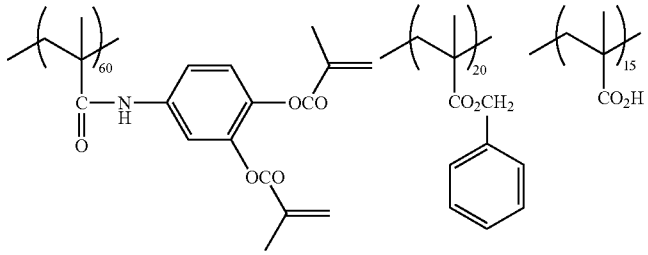 | 82000 |
| 6 | 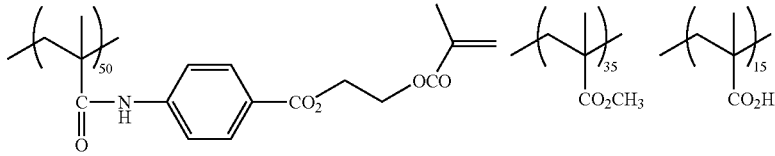 | 79000 |

-continued
| Polymer Compound | Composition (mol %) | Mw |
|---|---|---|
| 7 | 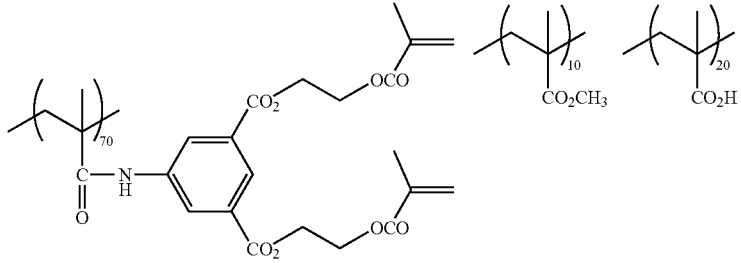 | 75000 |
| 8 | 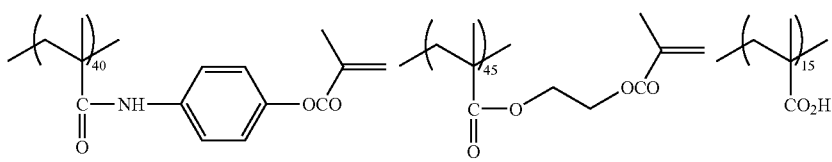 | 80000 |
| 9 | 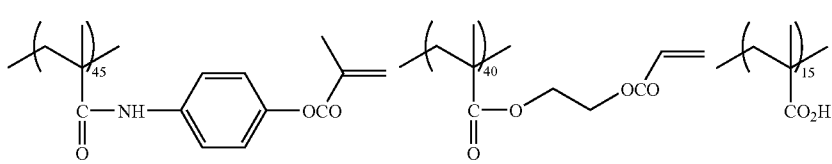 | 75000 |
| 10 | 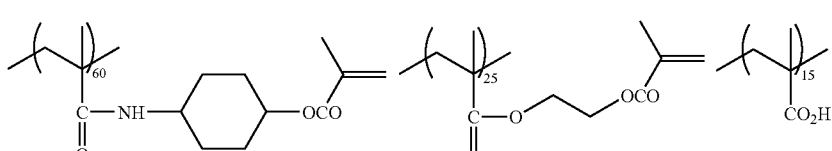 | 83000 |
| 11 | 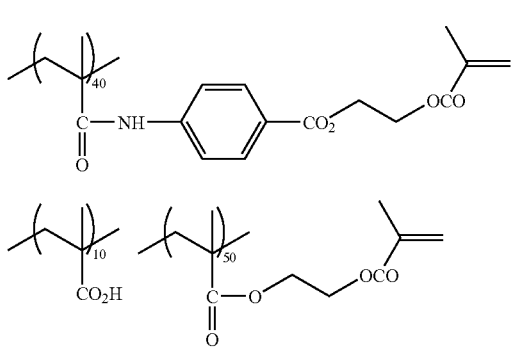 | 84000 |
| 12 | 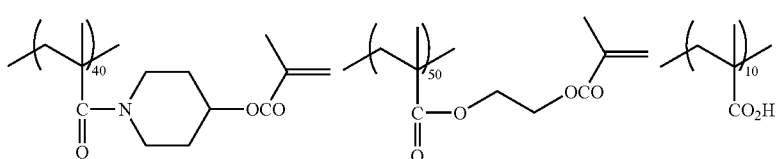 | 92000 |
| 13 | 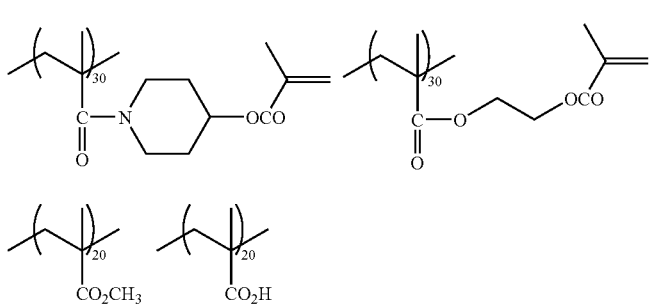 | 90000 |

| Polymer Compound | Composition (mol %) | Mw |
|---|---|---|
| 14 | | 121000 |
| 15 | | 96000 |
| 16 | | 86000 |
| 17 | | 78000 |
| 18 | | 81000 |
| 19 | | 87000 |

| Polymer Compound | Composition (mol %) | Mw |
|---|---|---|
| 20 | 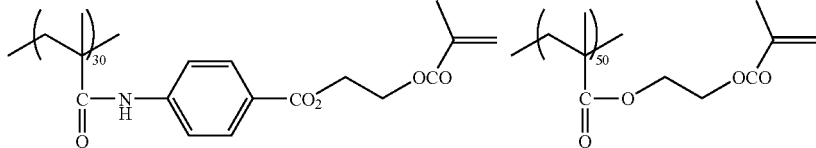 | 92000 |
| 21 | 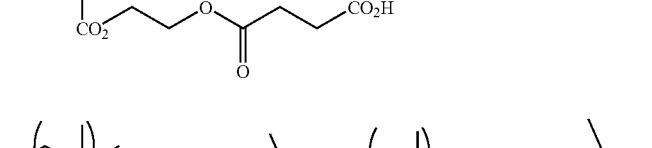 | 94000 |
| 22 | 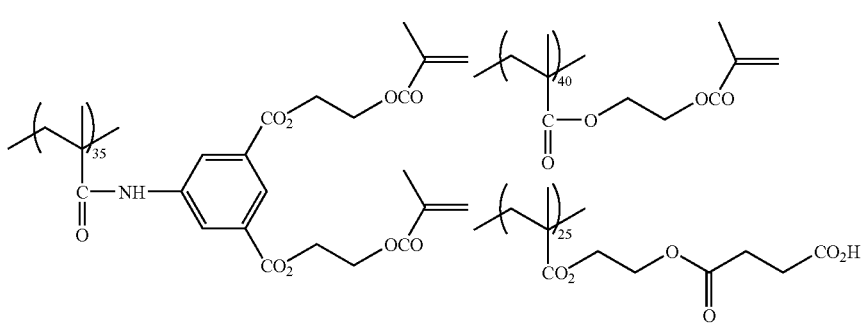 | 86000 |
| 23 | 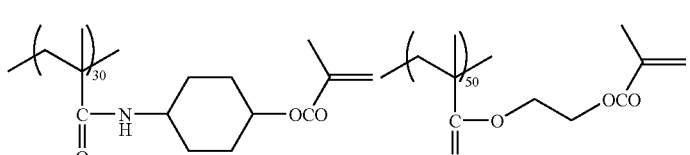 | 90000 |
| 24 | 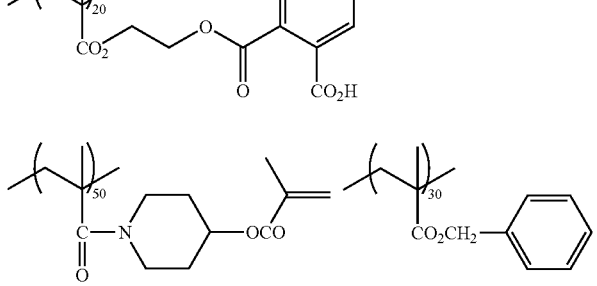 | 93000 |

| Polymer Compound | Composition (mol %) | Mw |
|---|---|---|

-continued

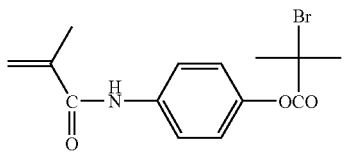

Synthesis Example

<Synthesis of Compound B-1>

Into a 1000 ml three-necked flask, 109 g of 4-aminophenol was introduced, 1000 ml of acetone was added followed by stirring of the mixture. Thereto, 84 g of sodium hydrogen carbonate and 0.05 g of p-methoxyphenol were added, followed by cooling of the mixture with an ice bath containing ice water. After a temperature of a mixture solution became 5° C. or less, 105 g of methacrylic acid chloride was dropped by use of a dropping funnel over 1 hr. After the dropping came to completion, the ice bath was removed and stirring was further continued for 3 hr. A reaction mixture solution was poured into 2 L of water, and precipitates were filtered. Obtained precipitates were recrystallized using methanol/toluene, and 110 g of crystal was obtained. Into a 500 ml three-necked flask, 40 g of the obtained crystal was introduced and 100 ml of acetone was added followed by stirring of the mixture. Thereto, 28 g of triethylamine and 0.02 g of p-methoxyphenol were added followed by cooling of the mixture with an ice bath containing ice water. After a temperature of the mixture solution became 5° C. or less, 64 g of 2-bromoisobutyric acid bromide was dropped with a dropping funnel over 1 hr. When the dropping came to completion, the ice bath was removed, and the stirring was further continued for 3 hr. The reaction mixture solution was poured into 1 L of water and precipitates were filtered. The obtained precipitates were recrystallized using isopropyl alcohol/hexane and 50 g of crystal was obtained. From $^1$H-NMR, IR, and mass spectrometry spectrum, it was confirmed to be a compound B-1 having the following structure.

(B-1)

<Synthesis of Polymer Compound 2>

Into 2000 ml three-necked flask, 300 g of N,N-dimethylacetamide was introduced and heated to 70° C. under nitrogen current. Thereto, 300 g of N,N-dimethylacetamide solution comprising 245 g of the above obtained compound (B-1), 22 g of methacrylic acid and 1.6 g of V-601 (Wako Pure Chemical Industries, Ltd.) was dropped over 2.5 hr. After the dropping came to completion, the stirring was continued further for 2 hr. The reaction solution, after cooling to room temperature, was poured into 5 L of water to precipitate, the precipitate was filtered, thereby 210 g of a precursor polymer compound was obtained. Then, 210 g of the precursor polymer compound and 0.1 g of p-methoxyphenol were introduced into a 2000 ml three-necked flask and dissolved in 1800 ml of N,N-dimethylacetamide followed by cooling of the solution in an ice bath containing ice water. After a temperature of the mixture solution became 5° C. or less, 300 g of 1,8-diazabicyclo[5,4,0]-7-undecene (DBU) was dropped with a dropping funnel over 2 hr. After the dropping came to completion, the stirring was further continued for 8 hr. After it was cooled to 5° C. or less with an ice bath containing ice water, the the pH of the reaction solution was adjusted to about 2 with 75 ml of concentrated hydrochloric acid. Next, the reaction solution was thrown into 3 L of water, thereby a polymer compound was precipitated. The precipitated polymer compound was filtered, washed with water, and dried, thereby 130 g of the polymer compound was obtained. When $^1$H-NMR of the obtained polymer compound was measured, it was confirmed to be the polymer compound 2 in the specific examples. Furthermore, by gel-permeation chromatography (GPC) with polystyrene as a reference material, a weight average molecular weight was measured and found to be 98,000. Still furthermore, an acid value was obtained according to titration and found to be 1.0 meq/g.

The alkali-soluble polymer compounds recited in the invention may be used singly or in combination of two or more kinds thereof. In this case, a content of the other polymer compound other than the specific alkali-soluble polymer A recited in the invention is 80% by mass or less in the polymer compounds, and more preferably 50% by mass or less.

A content of (A) the specific alkali-soluble polymer A contained in the resin composition recited in the invention is approximately from 5 to 95% by mass in terms of solid components, and preferably approximately from 10 to 85% by mass. In particular, when the resin composition recited in the invention is used as a recording material of the planographic printing plate precursor, in the case of the content being less than 5% by mass, when an image is formed, the image area is deficient in the strength. Furthermore, when the content exceeds 95% by mass, an image is not formed.

[(A') Specific Alkali-soluble Polymer A']

A polymer compound that is used as a binder component of a thermo/photosensitive composition according to the invention is a polymer compound (specific alkali-soluble polymer A') that has a non-acidic hydrogen-bonding group on a side chain and is soluble or swelling in water or an alkali aqueous solution.

In the invention, being soluble in water or an alkali aqueous solution means that a specific alkali-soluble polymer A', when water whose pH is 7 or more or an alkali aqueous solution is added thereto, dissolves, and being swelling means that a specific alkali-soluble polymer A', when water whose pH is 7 or more or an alkali aqueous solution is added thereto, swells.

In the invention, a non-acidic hydrogen-bonding group indicates a group that is non-acidic and hydrogen-bonding, that is, not having proton donating property and having proton accepting property, and furthermore in which atoms different in Pauling's electronegativity are combined, and, when a hetero atom is contained in constituent atoms, a hydrogen atom is not bonded to the hetero atom. As specific examples of such groups, a carbon-halogen group, amino group in which a substituent on N position is substituted, nitrile group, ether group, carbonyl group, ester group, thioether group, thiocarbonyl group, thioester group, carbamoyl group in which a substituent on N position is substituted, ureide group in which a substituent on N position is substituted, formyl group, carbamoyloxy group in which a substituent on N position is substituted, sulfinyl group in which a substituent on S site is substituted, sulfonyl group, sulfinamoyl group in which a substituent on N position is substituted, sulfamoyl group in which a substituent on N position is substituted, sulfonylsulfamoyl group in which a substituent on N position is substituted, sulfonylcarbamoyl group in which a substituent on N position is substituted, phosphono group in which a substituent on O position is substituted, phosphonoxy group in which a substituent on O position is substituted, nitro group, and heterocyclic group containing a nitrogen atom are cited; as preferable groups among these, a nitrile group, and heterocyclic group containing a nitrogen atom can be cited.

As methods for introducing such non-acidic hydrogen-bonding group in a side chain of a polymer compound, one method in which one kind of or two or more kinds of radical-polymerizing compounds having a non-acidic hydrogen-bonding group are polymerized or copolymerized, or another method in which one kind of or two or more kinds of radical polymerizing groups that has a non-acidic hydrogen-bonding group, and one kind of or two or more kinds of other radical-polymerizing compounds as a co-polymerization component, are copolymerized can be cited. As such polymerization method, generally known polymerization methods such as a suspension polymerization or a solution polymerization can be employed; in particular, when a copolymer is formed, any one of a block copolymer, random copolymer and graft copolymer may be formed.

A content of a structure unit that has a non-acidic hydrogen-bonding group in the specific alkali-soluble polymer A' is necessary to be 0.1 mol % or more, preferably in the range of 10 to 80 mol %, and more preferably in the range of 20 to 60 mol %. In such range, the film forming property and the film strength tend to be excellent.

As radical-polymerizing compounds having a non-acidic hydrogen-bonding group according to the invention, acrylonitrile, methacrylonitrile and ones represented by the following formula (C-A) are preferable.

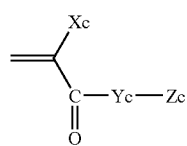
(C-A)

In the formula, Xc represents a hydrogen atom or a methyl group; Yc represents an oxygen atom, sulfur atom or Nc-Wc; and the Wc represents a hydrogen atom or an alkyl group having 1 to 10 carbon atoms that may have a substituent. Zc represents a group having the non-acidic hydrogen-bonding group.

Among them, as particularly preferable radical-polymerizing compounds, acrylonitrile, methacrylonitrile, (meth) acrylic acid esters having an aromatic group and a nitrile group, and (meth)acrylamides having an aromatic group and a nitrile group can be cited.

As radical-polymerizing compounds having the non-acidic hydrogen-bonding group recited in the invention, preferable specific examples (A-1) through (A-82) will be cited below; however, the invention is not restricted to the examples.

(A-1)

(A-2)

(A-3)

(A-4)

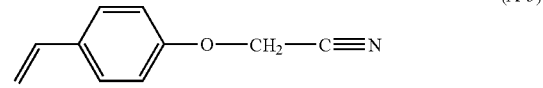
(A-5)

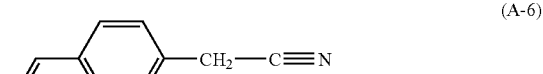
(A-6)

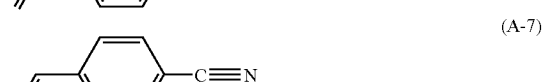
(A-7)

(A-8)

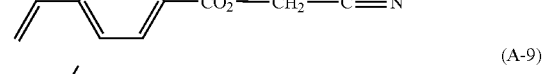
(A-9)

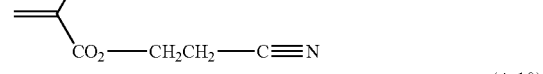
(A-10)

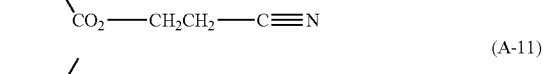
(A-11)

(A-12)

(A-13)

(A-14)

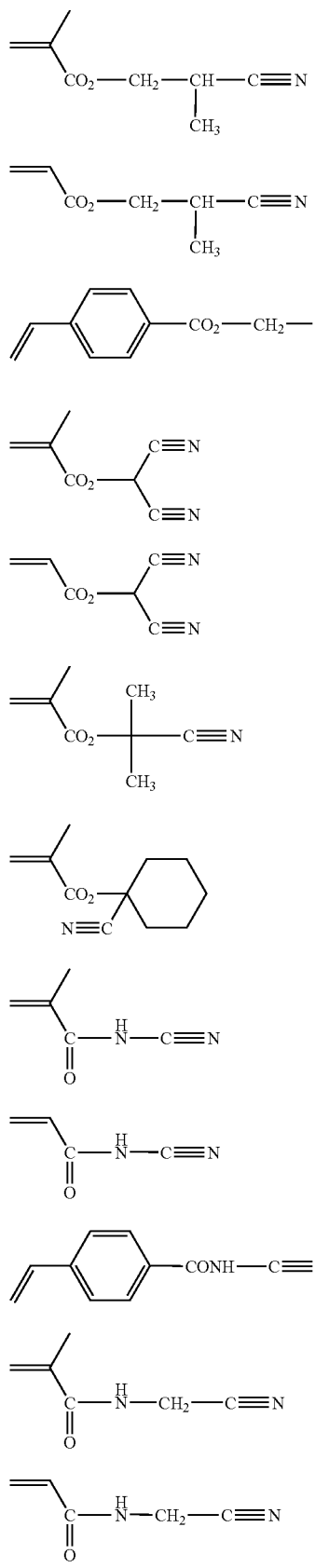
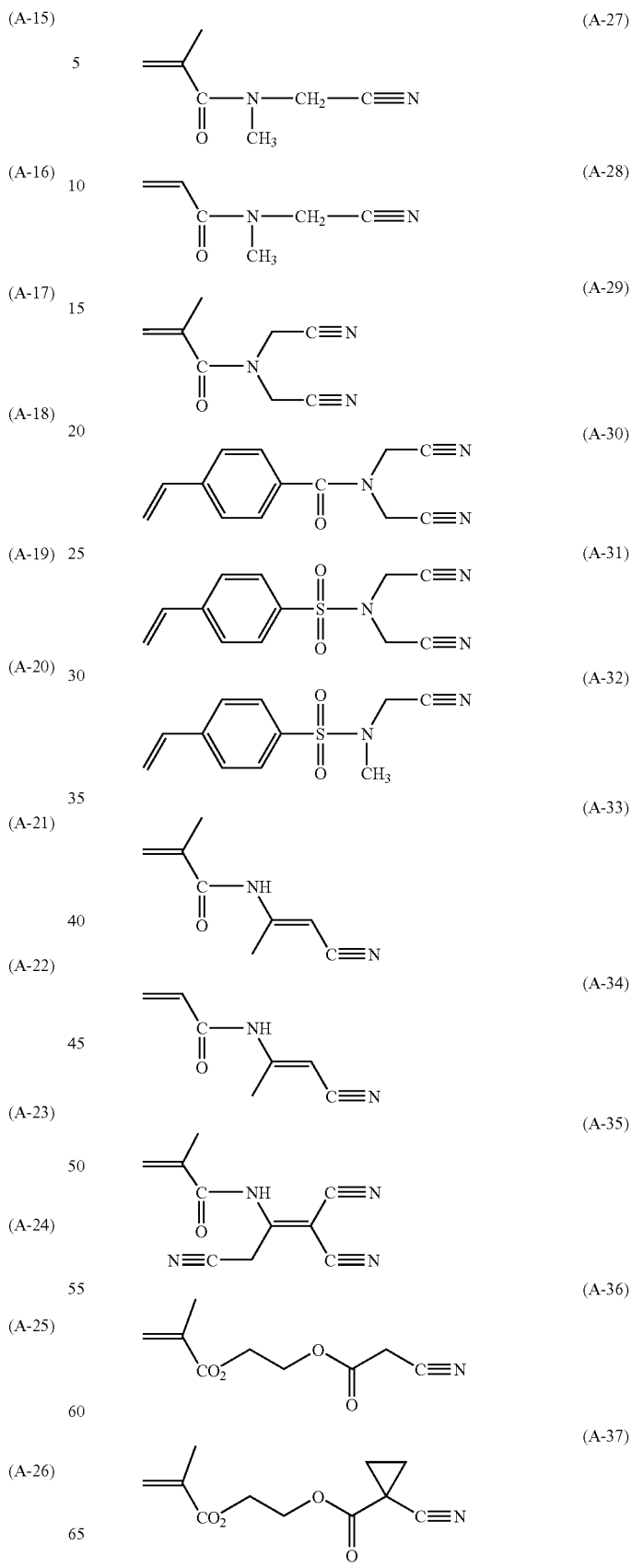

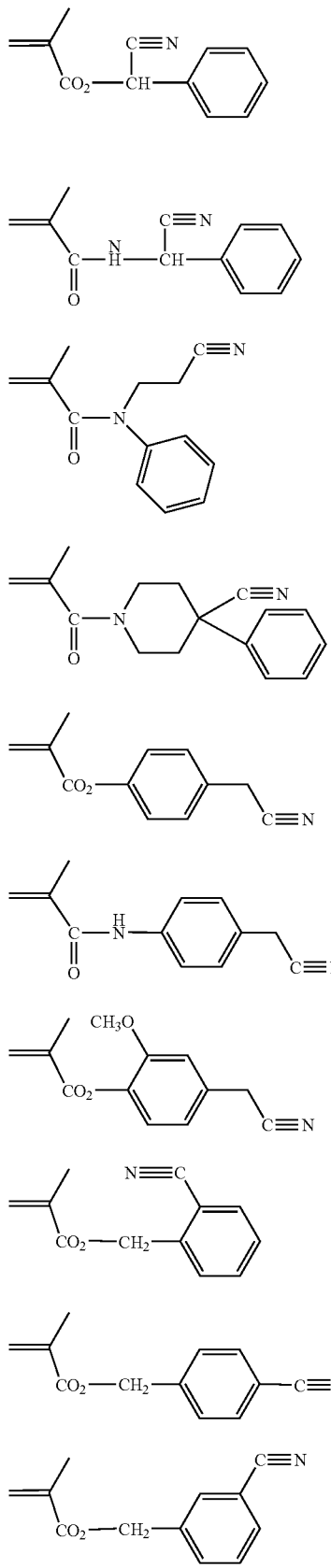
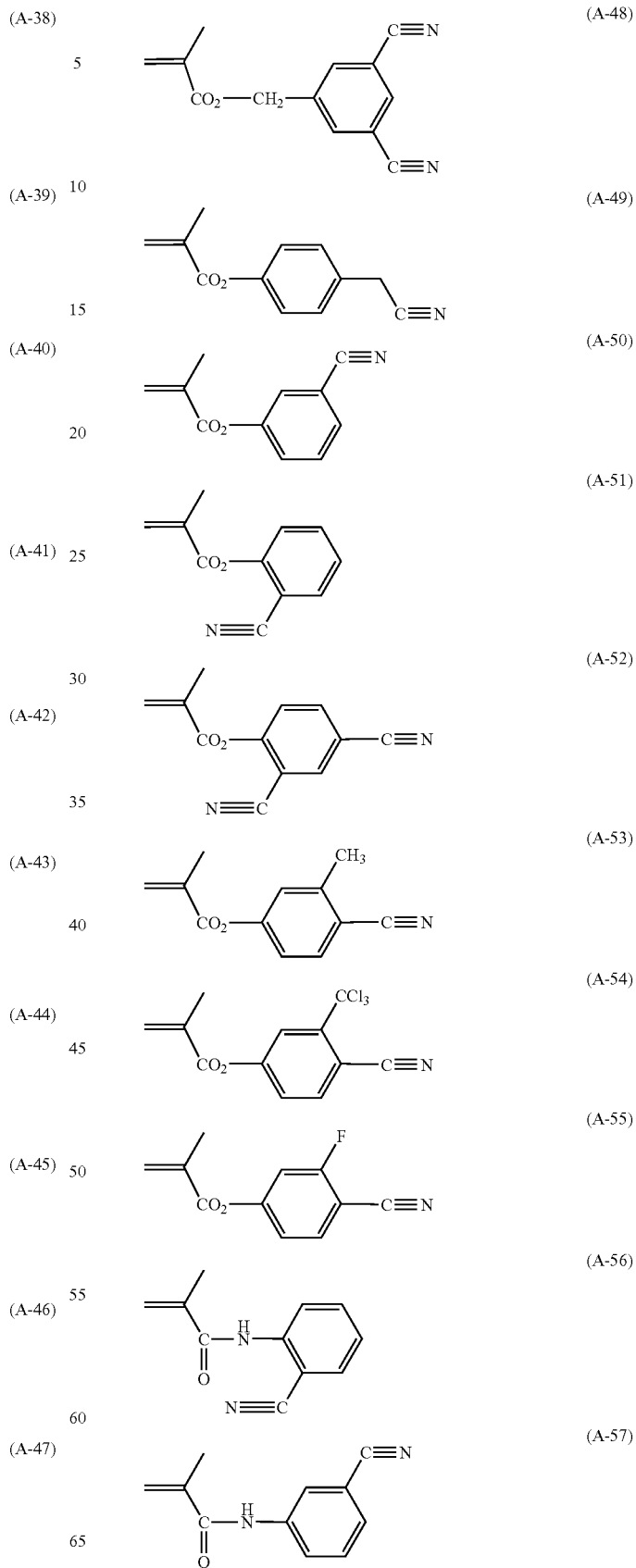

(A-58) 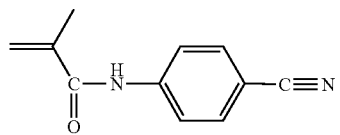
(A-59) 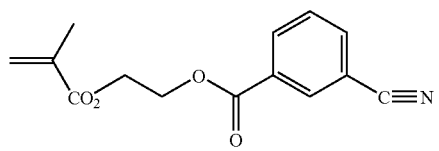
(A-60) 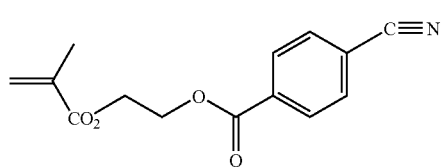
(A-61) 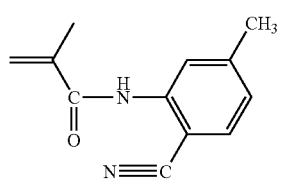
(A-62) 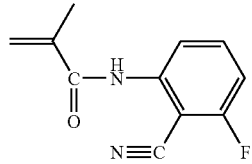
(A-63) 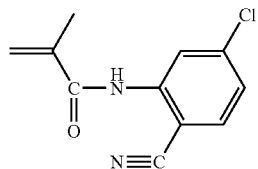
(A-64) 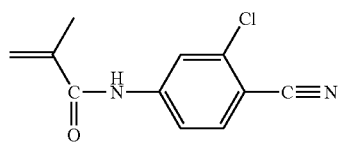
(A-65) 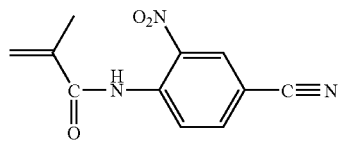
(A-66) 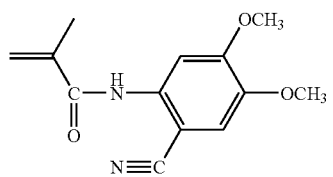
(A-67) 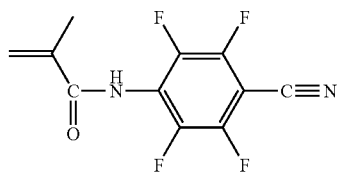
(A-68) 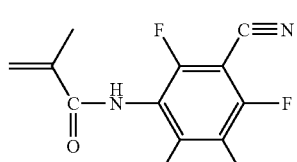
(A-69) 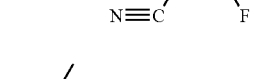
(A-70) 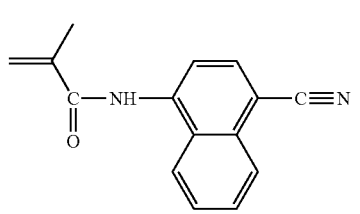
(A-71) 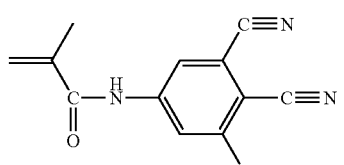
(A-72) 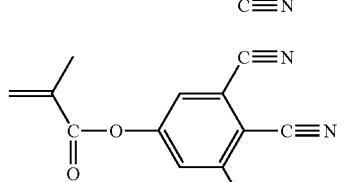
(A-73) 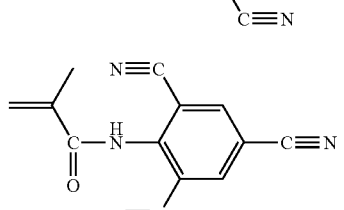
(A-74) 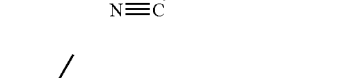
(A-75) 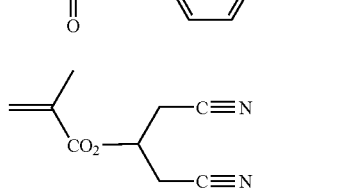

-continued

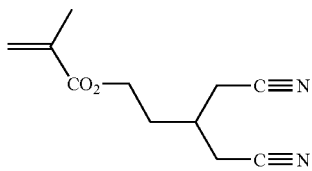 (A-76)

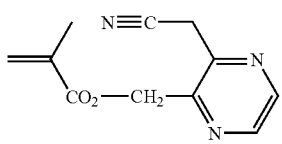 (A-77)

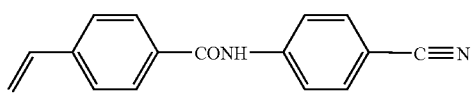 (A-78)

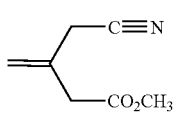 (A-79)

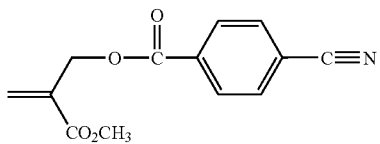 (A-80)

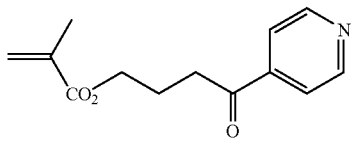 (A-81)

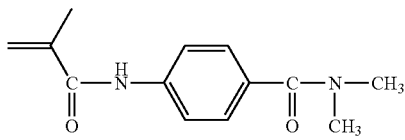 (A-82)

(Polymer Compound Having Ethylenic Unsaturated Bond)

The specific alkali-soluble polymer A' according to the invention preferably has at least one ethylenic unsaturated group on a side chain. As such ethylenic unsaturated groups, ones represented by the following general formulae (C-1) through (C-3) are preferable.

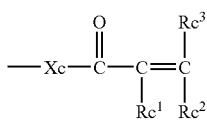 General formula (C-1)

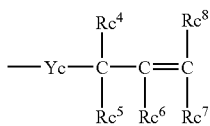 General formula (C-2)

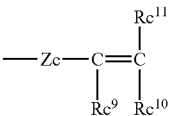 General formula (C-3)

In the general formula (C-1), $Rc^1$ represents a hydrogen atom or a monovalent organic group; preferably, a hydrogen atom or an alkyl group that may have a substituent can be cited; among them, a hydrogen atom and a methyl group are preferable in view of high radical reactivity.

$Rc^2$ and $Rc^3$ each independently represent a hydrogen atom, halogen atom, amino group, carboxyl group, alkoxycarbonyl group, sulfo group, nitro group, cyano group, or a monovalent organic group; as the monovalent organic groups, an alkyl group that may have a substituent, aryl group that may have a substituent, alkoxy group that may have a substituent, aryloxy group that may have a substituent, alkylamino group that may have a substituent, arylamino group that may have a substituent, alkylsulfonyl group that may have a substituent, and arylsulfonyl group that may have a substituent can be cited. Among them, a hydrogen atom, carboxyl group, alkoxycarbonyl group, alkyl group that may have a substituent, and aryl group that may have a substituent are preferable from a viewpoint of high radical reactivity.

Xc represents an oxygen atom, sulfur atom or —$NRc^{4'}$-; the $Rc^{4'}$ represents a hydrogen atom or a monovalent organic group; preferably, a hydrogen atom and aryl group that may have a substituent can be cited; among them, a hydrogen atom, methyl group, ethyl group, and isopropyl group are preferable in view of high radical reactivity.

As substituents that can be introduced in each of the $Rc^1$ through $Rc^4$, an alkyl group, alkenyl group, alkynyl group, aryl group, alkoxy group, aryloxy group, halogen atom, amino group, alkylamino group, arylamino group, carboxyl group, alkoxycarbonyl group, sulfo group, nitro group, cyano group, amide group, alkylsulfonyl group, and arylsulfonyl group can be cited.

In the general formula (C-2), $Rc^4$ through $Rc^8$ each independently represents a hydrogen atom, halogen atom, amino group, dialkylamino group, carboxyl group, alkoxycarbonyl group, sulfo group, nitro group, cyano group, or monovalent organic group; as the monovalent organic groups, an alkyl group that may have a substituent, aryl group that may have a substituent, alkoxy group that may have a substituent, aryloxy group that may have a substituent, alkylamino group that may have a substituent, arylamino group that may have a substituent, alkylsulfonyl group that may have a substituent, and arylsulfonyl group that may have a substituent can be cited. Among them, a hydrogen atom, carboxyl group, alkoxycarbonyl group, alkyl group that may have a substituent, and aryl group that may have a substituent are preferable. As the substituents that can be introduced, those cited in the general formula (C-1) can be cited.

Yc represents an oxygen atom, sulfur atom, or —$NRc^{4'}$-. As the $Rc^{4'}$, those cited in general formula (C-1) can be cited.

In the general formula (C-3), $Rc^9$ represents a hydrogen atom or a monovalent organic group; a hydrogen atom or an alkyl group that may have a substituent can be preferably cited; among them, a hydrogen atom and a methyl group are preferable from a viewpoint of high radical reactivity.

$Rc^{10}$ and $Rc^{11}$ each independently represent a hydrogen atom, halogen atom, amino group, dialkylamino group, carboxyl group, alkoxycarbonyl group, sulfo group, nitro group, cyano group, or a monovalent organic group; as the monovalent organic group, an alkyl group that may have a substituent, aryl group that may have a substituent, alkoxy group that may have a substituent, aryloxy group that may have a substituent, alkylamino group that may have a substituent, arylamino group that may have a substituent, alkylsulfonyl group that may have a substituent, and arylsulfonyl group that may have a substituent can be cited. Among them, a hydrogen atom, carboxyl group, alkoxycarbonyl group, alkyl group that may have a substituent, and aryl group that may have a substituent are preferable from a viewpoint of high radical reactivity.

As the substituents that can be introduced, those cited in the general formula (C-1) can be cited.

Zc represents an oxygen atom, sulfur atom, —NRc$^{12}$- or phenylene group that may have a substituent. As the Rc$^{12}$, an alkyl group that may have a substituent or the like can be cited; among these, a hydrogen atom, methyl group, ethyl group and isopropyl group are preferable because of the high radical reactivity.

The specific alkali-soluble polymer A' having such ethylenic unsaturated group on a side chain can be manufactured according to at least one of the synthesis methods 1) through 3) shown below.

Synthesis Method 1)

This is a method in which (1) a radical-polymerizing compound that has a non-acidic hydrogen-bonding group, (2) one kind of or two or more kinds of radical-polymerizing compounds that are represented by the following general formulae (C-4) or (C-5), and, optionally, (3) one kind of or two or more kinds of other radical-polymerizing compounds are co-polymerized according to an ordinary radical polymerization method, and thereby a precursor of a desired polymer compound is synthesized; and, thereafter, by use of a base, a proton is pulled-out, thereby Lc$^1$ or Lc$^2$ is eliminated, and thereby a desired specific alkali-soluble polymer A' that has, on a side chain, a group having a non-acidic hydrogen-bonding group and a structure represented by the general formula (C-1) is obtained.

At this time, in the manufacture of a polymer compound precursor, generally known suspension polymerization method or solution polymerization method can be applied. As a constitution of the copolymer, any one of block copolymer, random copolymer and graft copolymer may be acceptable.

General formula (C-4)

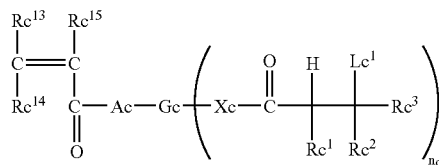

General formula (C-5)

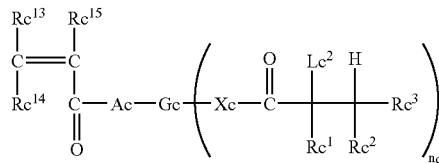

<Radical-polymerizing Compound Represented by General Formula (C-4) or (C-5)>

In the formula, the definitions of Rc$^1$ through Rc$^3$ and Xc are the same as those in the general formula (C-1), and Rc$^{13}$ through Rc$^{15}$ each independently represent a hydrogen atom or a monovalent organic group; preferably, a hydrogen atom and an alkyl group that may have a substituent can be cited; in particular, Rc$^{13}$ and Rc$^{14}$ are preferably a hydrogen atom, and Rc$^{15}$ is preferably a hydrogen atom or a methyl group.

Ac represents an oxygen atom, sulfur atom or —N(Rc$^{16}$), and, as the Rc$^{16}$, a hydrogen atom and an alkyl group that may have a substituent can be cited.

$n_c$ represents an integer from 1 to 10.

Gc represents an organic linkage group. Preferably, alkyl groups that may have a substituent having 1 to 20 carbon atoms, cycloalkyl groups that may have a substituent having 3 to 20 carbon atoms, and aromatic groups that may have a substituent having 6 to 20 carbon atoms can be cited; among these, linear or branched alkyl groups having 1 to 10 carbon atoms that may have a substituent, cycloalkyl groups that may have a substituent having 3 to 10 carbon atoms and aromatic groups that may have a substituent having 6 to 12 carbon atoms are preferable in view of performances such as the film strength and developability.

In the formula, Lc$^1$ and Lc$^2$ represent anionic elimination groups. As specific examples, a halogen atom, sulfonic acid group, sulfinic acid group, carboxylic acid group, cyano group, ammonium group, azide group, sulfonium group, nitro group, hydroxy group, alkoxy group, phenoxy group, thioalkoxy group, and oxonium group can be cited, and, a halogen atom, sulfonic acid group, ammonium group, and sulfonium group are preferable. Among them, chlorine atom, bromine atom, iodine atom, alkylsulfonic acid group and arysulfonic acid group are particularly preferable. As examples of the preferable alkylsulfonic acid groups, a methanesulfonic acid group, ethanesulfonic acid group, 1-propanesulfonic acid group, isopropylsulfonic acid group, 1-butanesulfonic acid group, 1-octylsulfonic acid group, 1-hexadecanesulfonic acid group, trifluoromethanesulfonic acid group, trichloromethanesulfonic acid group, 2-chloro-1-ethanesulfonic acid group, 2,2,2-trifluoroethanesulfonic acid group, 3-chloropropanesulfonic acid group, perfluoro-1butanesulfonic acid group, perfluoro-1-octanesulfonic acid group, 10-camphorsulfonic acid group, and benzylsulfonic acid group can be cited. As examples of preferable arylsulfonic acid groups, benzenesulfonic acid group, trans-β-styrenesulfonic acid group, 2-nitrobenzenesulfonic acid group, 2-acetylbenzenesulfonic acid group, 3-(trifluoromethyl)benzenesulfonic acid group, 3-nitrobenzenesulfonic acid group, 4-nitrobenzenesulfonic acid group, p-toluenesulfonic acid group, 4-tert-butylbenzenesulfonic acid group, 4-fluorobenzenesulfonic acid group, 4-chlorobenzenesulfonic acid group, 4-bromobenzenesulfonic acid group, 4-iodobenzenesulfonic acid group, 4-methoxybenzenesulfonic acid group, 4-(trifluoromethoxy)benzenesulfonic acid group, 2,5-dichlorobenzenesulfonic acid group, 2-nitro-4-(trifluoromethyl)-benzenesulfonic acid group, 4-chloro-3-nitrobenzenesulfonic acid group, 2,4-dinitrobenzenesulfonic acid group, 2-mesitylenesulfonic acid group, 2,4,6-triisopropylbenzenesulfonic acid group, pentafluorobenzenesulfonic acid group, 1-naphthalenesulfonic acid group, and 2-naphthalenesulfonic acid group can be cited.

<Other Radical-polymerizing Compounds>

The polymer compounds having an ethylenic unsaturated group recited in the invention, in order to improve various performances such as the film strength, is preferably co-polymerized with other radical-polymerizing compounds that do not have a structure unit represented by the general formulae (C-4) or (C-5). As examples of the other radical-polymerizing compounds, radical-polymerizing compounds selected from, for instance, acrylic acid esters, methacrylic acid esters, N,N-2-substituted acrylamides, N,N-2-substituted methacrylamides and styrenes can be cited.

Specifically, acrylic acid esters such as alkyl acrylates (the number of carbon atoms in the alkyl group is preferably from 1 to 20) (specifically, for instance, methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, and tetrahydrofurfuryl acrylate); aryl acrylates (for instance, phenyl acrylate); methacrylic acid esters such as alkyl methacrylates (the number of carbon atoms in the alkyl group is preferably in the range of from 1 to 20) (for instance, methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, and tetrahydrofurfuryl methacrylate); aryl methacrylates (for instance, phenyl methacrylate, cresyl methacrylate, and naphthyl methacrylate); styrenes such as styrene, alkylstyrene and the like (for instance, methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene and acetoxymethylstyrene); alkoxystyrenes (for instance, methoxystyrene, 4-methoxy-3-methylstyrene, and dimethoxystyrene); halogen styrenes (for instance, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, and 4-fluoro-3-trifluoromethylstyrene) can be cited.

One kind of or two or more kinds of these can be used.

<Bases Used to Cause Elimination Reaction>

Furthermore, as bases used to cause the elimination reaction, hydrides, hydroxides or carbonates of alkali metals, organic amine compounds and metal alkoxide compounds can be cited as preferable examples.

As preferable examples of the hydrides, hydroxides and carbonates of alkali metals, sodium hydride, calcium hydride, potassium hydride, sodium hydroxide, potassium hydroxide, calcium hydroxide, potassium carbonate, sodium carbonate, potassium hydrogen carbonate, and sodium hydrogen carbonate can be cited.

As preferable examples of organic amine compounds, trimethylamine, triethylamine, diethylmethylamine, tributylamine, triisobutylamine, trihexylamine, trioctylamine, N,N-dimethylcyclohexylamine, N,N-diethylcyclohexylamine, N-methyldicyclohexylamine, N-ethyldicyclohexylamine, pyrrolidine, 1-methylpyrrolidine, 2,5-dimethylpyrrolidine, piperidine, 1-methylpiperidine, 2,2,6,6-tetramethylpiperidine, piperazine, 1,4-dimethylpiperazine, quinuclidine, 1,4-diazabicyclo [2,2,2]-octane, hexamethylene tetramine, morpholine, 4-methylmorpholine, pyridine, picoline, 4-dimethylaminopyridine, lutidine, 1,8-diazabicyclo[5,4,0]-7-undecene (DBU), N,N'-dicyclohexylcarbodiimide (DCC), diisopropylethylamine, and Schiff bases can be cited.

As preferable examples of metal alkoxide compounds, sodium methoxide, sodium ethoxide, and potassium-t-butoxide can be cited. These bases may be used singly or in combination.

In the elimination reactions in the invention, as solvents used when the base is added, for instance, ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethyl acetamide, dimethyl sulfoxide, toluene, ethyl acetate, methyl lactate, ethyl lactate, and water can be cited. These solvents can be used singly or in combination.

An amount of a base being used may be equivalent to or less than an amount of a specific functional group in a compound, or may be equivalent to or more than an amount of a specific functional group in a compound.

Furthermore, when the base is excessively used, after the elimination reaction, in order to remove the excess base, an acid can be preferably added. As examples of acids, inorganic acids such as hydrochloric acid, sulfuric acid, nitric acid, hydrobromic acid and perchloric acid, and organic acids such as acetic acid, fluoroacetic acid, trifluoroacetic acid, methanesulfonic acid, p-toluenesulfonic acid and trifluoromethanesulfonic acid can be cited.

The temperature condition in the elimination reaction may be any one of room temperature, cooling, and heating condition. A preferable temperature condition is in the range of from −20 to 100° C.

Here, specific examples (M-1) through (M-13) of the radical polymerizing-compound represented by general formula (C-4) will be cited; however, the invention is not restricted to the examples.

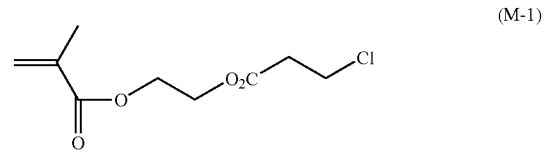

(M-1)

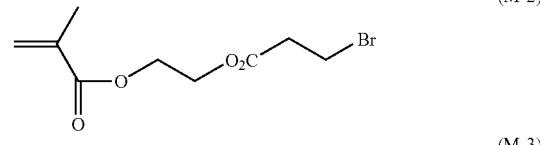

(M-2)

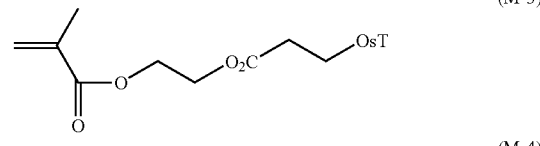

(M-3)

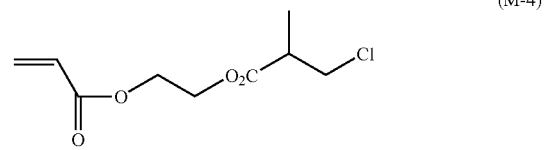

(M-4)

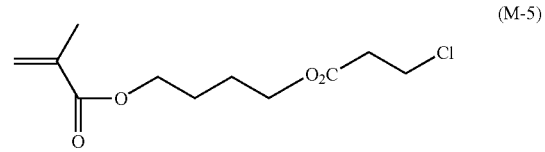

(M-5)

(M-6)
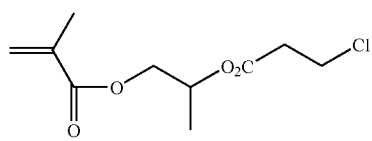
(M-7)
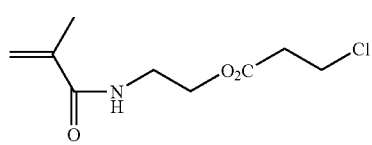
(M-8)
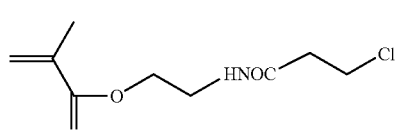
(M-9)
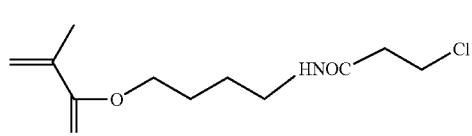
(M-10)
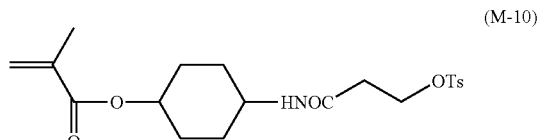
(M-11)
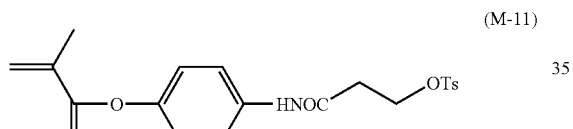
(M-12)
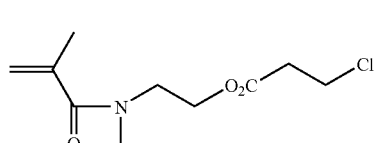
(M-13)
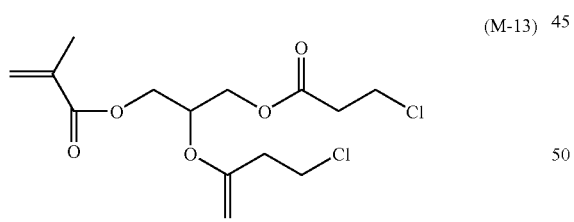
Here, specific examples (M-14) through (M-63) of the radical polymerizing-compound represented by general formula (C-5) will be cited; however, the invention is not restricted to the examples.
(M-14)
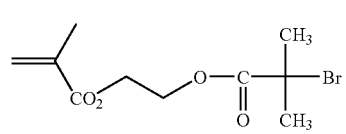
(M-15)
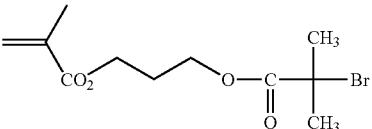
(M-16)
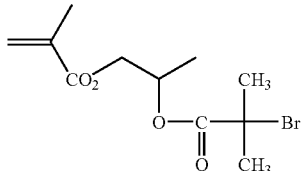
(M-17)
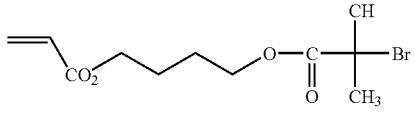
(M-18)
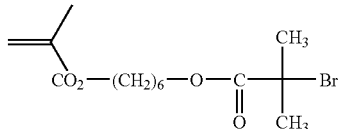
(M-19)
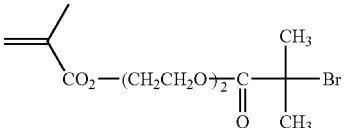
(M-20)
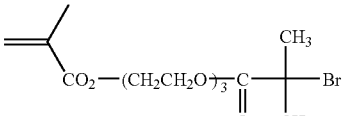
(M-21)
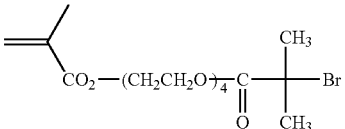
(M-22)
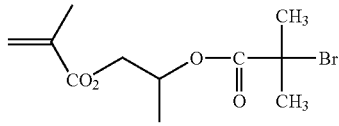
(M-23)
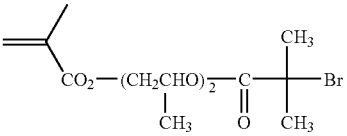
(M-24)
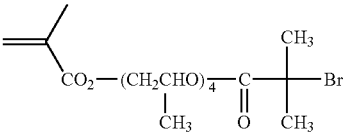
(M-25)
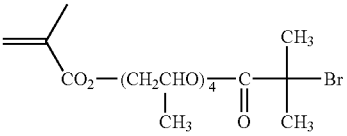

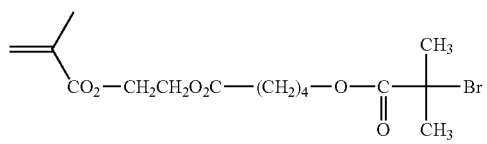 (M-26)
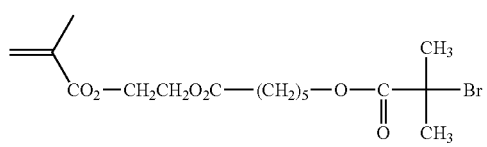 (M-27)
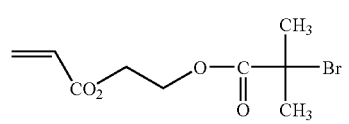 (M-28)
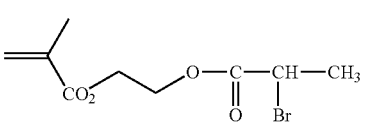 (M-29)
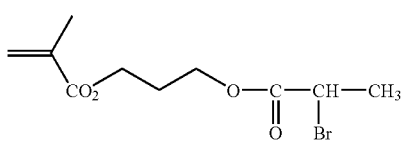 (M-30)
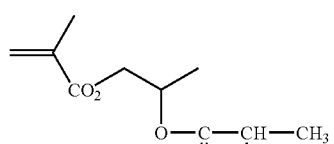 (M-31)
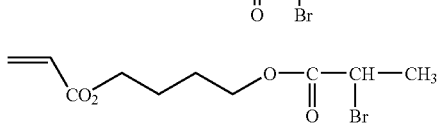 (M-32)
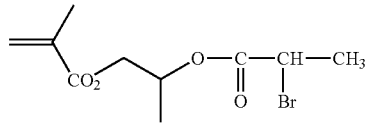 (M-33)
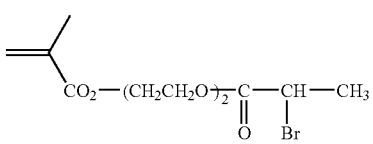 (M-34)
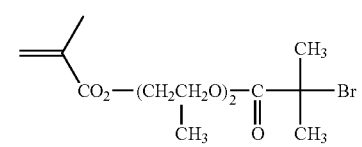 (M-35)
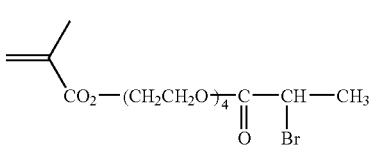 (M-36)
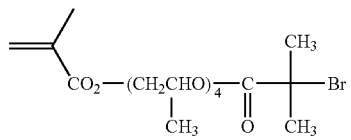 (M-37)
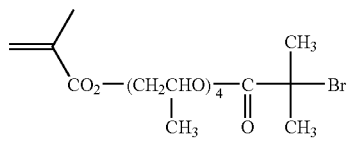 (M-38)
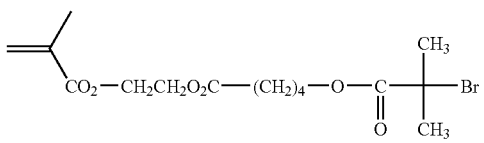 (M-39)
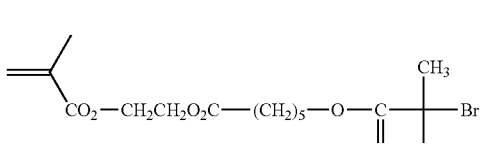 (M-40)
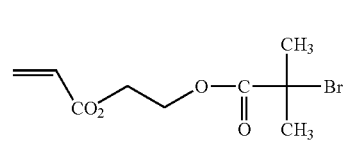 (M-41)
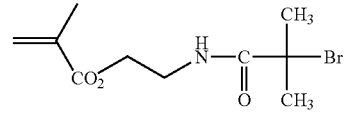 (M-42)
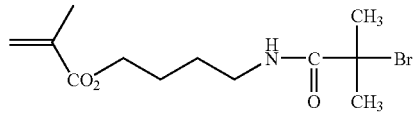 (M-43)
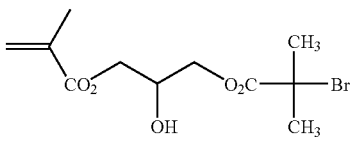 (M-44)
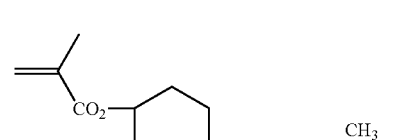 (M-45)
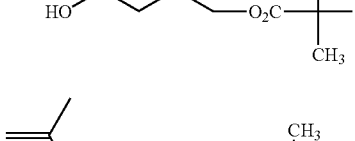 (M-46)

-continued
(M-47)
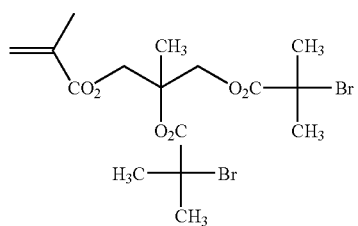
(M-48)
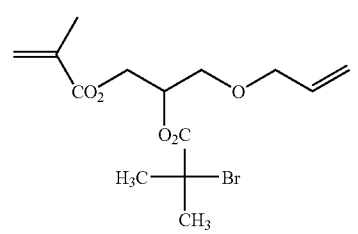
(M-49)
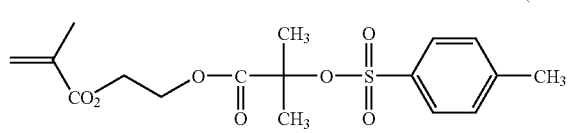
(M-50)
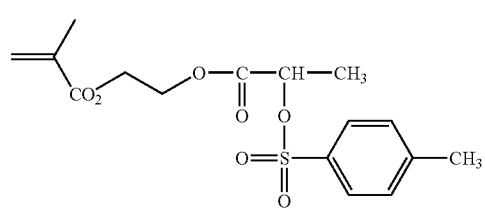
(M-51)
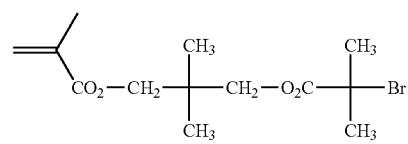
(M-52)
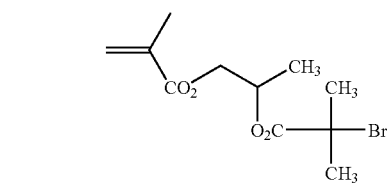
(M-53)
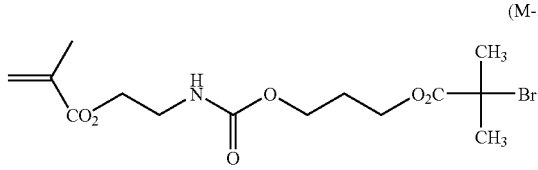
(M-54)
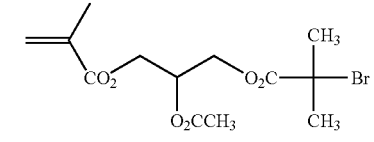
-continued
(M-55)
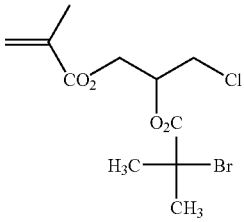
(M-56)
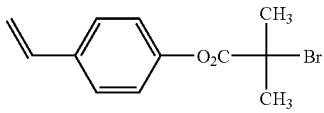
(M-57)
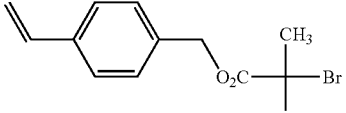
(M-58)
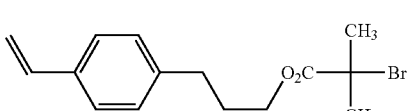
(M-59)
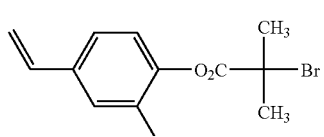
(M-60)
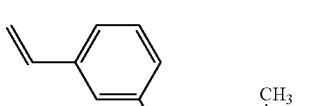
(M-61)
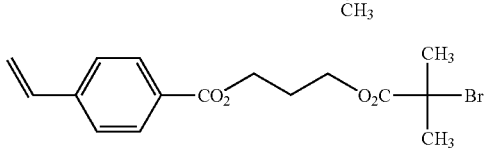
(M-62)
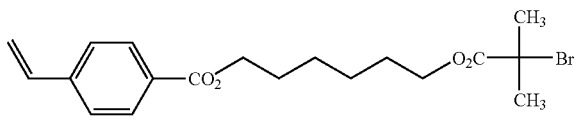
(M-63)
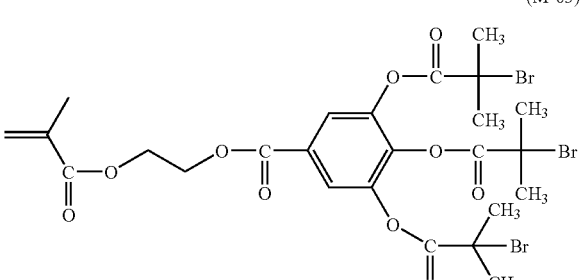
Synthesis Method 2)
This is a method in which (1) a radical-polymerizing compound that has a non-acidic hydrogen-bonding group, (4) one kind or two or more kinds of radical-polymerizing compounds that has a specific functional group detailed below, and, optionally, (5) one kind or two or more kinds of other radical-polymerizing compounds are co-polymerized according to an ordinary radical polymerization method, and thereby a base polymer compound is synthesized; thereafter, the specific functional group on a side chain thereof and (6) a compound having a structure represented by the following general formulae (C-6) through (C-8) are allowed to react, and thereby, a desired specific alkali-soluble polymer A' that has, on a side chain, a group having a non-acidic hydrogen-bonding group and a structure represented by the general formulae (C-1) through (C-3) is obtained.

In the manufacture of a base polymer compound, generally known suspension polymerization method or solution polymerization method can be applied. As a constitution of the copolymer, any one of block copolymer, random copolymer and graft copolymer may be acceptable. For the (5) other radical-polymerizing compounds used here, those described in (3) the other radical-polymerizing compounds in the synthesis method 1) can be used.

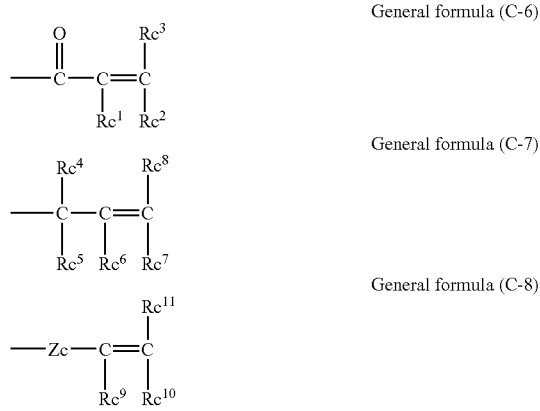

General formula (C-6)

General formula (C-7)

General formula (C-8)

<Radical-polymerizing Compound Having a Specific Functional Group>

As examples of the specific functional groups, a hydroxy group, carboxyl group, carboxylic acid halide group, carboxylic acid anhydride group, amino group, halogenated alkyl group, isocyanate group and epoxy group can be cited. As radical-polymerizing compounds that have these functional groups, 2-hydroxylethyl acrylate, 2-hydroxylethyl methacrylate, 4-hydroxybutyl acrylate, 4-hydroxybutyl methacrylate, acrylic acid, methacrylic acid, acrylic acid chloride, methacrylic acid chloride, N,N-dimethyl-2-aminoethyl methacrylate, 2-chloroethyl methacrylate, 2-isocyanate-ethyl methacrylate, 3-isocyanate-propyl methacrylate, glycidyl acrylate, glycidyl methacrylate, 3,4-epoxycyclohexylmethyl acrylate, 3,4-epoxycyclohexylmethyl methacrylate, 2-bromoethyl methacrylate, 3-bromopropyl methacrylate, 2-hydroxyethyl methacrylamide, 4-hydroxybutyl methacrylamide, and itaconic acid can be cited.

<Compounds that have a Structure Represented by the General Formulae (C-6) Through (C-8)>

In the general formula (C-6), the definitions of $Rc^1$ through $Rc^3$ are the same as those in the general formula (C-1).

As examples of low molecular weight compounds having a group represented by the general formula (C-6), 2-hydroxylethyl acrylate, 2-hydroxylethyl methacrylate, 4-hydroxybutyl acrylate, 4-hydroxybutyl methacrylate, acrylic acid, methacrylic acid, acrylic acid chloride, methacrylic acid chloride, N,N-dimethyl-2-aminoethyl methacrylate, 2-chloroethyl methacrylate, 2-isocyanate-ethyl methacrylate, 3-isocyanate-propyl methacrylate, glycidyl acrylate, glycidyl methacrylate, 3,4-epoxycyclohexylmethyl acrylate, 3,4-epoxycyclohexylmethyl methacrylate, 2-bromoethyl methacrylate, 3-bromopropyl methacrylate, 2-hydroxyethyl methacrylamide, 4-hydroxybutyl methacrylamide, and itaconic acid can be cited.

In the general formula (C-7), the definitions of $Rc^4$ through $Rc^8$ are the same as those in the general formula (C-2).

As compounds that have the structure expressed by the general formula (C-7), ally alcohol, allylamine, diallylamine, 2-allyloxyethyl alcohol, 2-chloro-1-butene and allyl isocyanate can be cited as examples.

In the general formula (C-8), the definitions of $Rc^9$ through $Rc^{11}$ and Z are the same as those in the general formula (C-3).

As examples of the low molecular weight compound represented by the general formula (C-8), ethylene glycol monovinyl ether, propylene glycol monovinyl ether, butylene glycol monovinyl ether, diethylene glycol monovinyl ether, 1-chloroethyl vinyl ether, 1-aminoethyl vinyl ether, 4-chloromethyl styrene, and p-styrene carboxylic acid can be cited.

Synthesis Method 3)

This is a method in which (1) a radical-polymerizing compound that has a non-acidic hydrogen-bonding group, (7) one kind or two or more kinds of radical-polymerizing compounds that has a unsaturated group represented by the general formula (C-7) or (C-8) and an ethylenic unsaturated group having higher addition polymerizability than the unsaturated group, and, optionally, (8) one kind or more of other radical-polymerizing compounds are allowed to co-polymerize according to an ordinary radical polymerization method, and thereby a desired specific alkali-soluble polymer A' that has, on a side chain, the group having a non-acidic hydrogen-bonding group and the structure represented by the general formula (C-2) or (C-3) is obtained.

In the manufacture of the polymer compound, generally known suspension polymerization method or solution polymerization method can be applied. As a constitution of the copolymer, any one of block copolymer, random copolymer and graft copolymer may be acceptable. For the other radical-polymerizing compounds used here, those described for the other radical-polymerizing compounds in the synthesis method 1) can be used.

<(7) Radical-polymerizing Compound that has a Unsaturated Group Represented by the General Formula (C-7) or (C-8) and an Ethylenic Unsaturated Group Having Higher Addition Polymerizability than the Unsaturated Group>

As the radical-polymerizing compound that has a unsaturated group expressed by the general formula (C-7) and an ethylenic unsaturated group having higher addition polymerizability than the unsaturated group, allyl acrylate, allyl methacrylate, 2-allyloxyethyl acrylate, 2-allyloxyethyl methacrylate, propargyl acrylate, propargyl methacrylate, N-allyl acrylate, N-allyl methacrylate, N,N-diallyl acrylate, N,N-diallyl methacrylate, allylacrylamide, and allylmethacrylamide can be cited as examples.

As the radical-polymerizing compound that has a unsaturated group represented by the general formula (C-8) and an ethylenic unsaturated group having higher addition polymerizability than the unsaturated group, vinyl acrylate, vinyl methacrylate, 2-phenylvinyl acrylate, 2-phenylvinyl methacrylate, 1-propenyl acrylate, 1-propenyl methacrylate, vinylacrylamide, and vinylmethacrylamide can be cited as examples.

The synthesis methods 1) through 3) can be applied singly or in combinations thereof to obtain the specific alkali-soluble polymer A' recited in the invention.

A content of a structure unit expressed by the general formulae (C-1) through (C-3) in the specific alkali-soluble polymer A' is necessary to be 0.1 mol % or more, and more preferably in the range of from 30 to 80 mol %. In the range, the film forming property and the film strength tend to be excellent.

Furthermore, the specific alkali-soluble polymer A' recited in the invention, in order to improve various performances such as solubility in water or an alkali aqueous solution, is preferably copolymerized with a radical-polymerizing compound having an acid group. As such acid groups that comprised in such radical polymerizing compound, there are, for instance, a carboxylic acid group, sulfonic acid group and phosphoric acid group; among them, a carboxylic acid group is particularly preferable. As the radical-polymerizing compounds that have a carboxylic acid group, there are, for instance, acrylic acid, methacrylic acid, itaconic acid, crotonic acid, isocrotonic acid, maleic acid, and p-carboxyl styrene; among these, acrylic acid, methacrylic acid, and p-carboxyl styrene are particularly preferable.

These can be used singly or in combinations thereof. An acid value of the specific alkali-soluble polymer A' is in the range of from 0.5 to 4.0 meq/g, and, particularly preferably, from a viewpoint of suppressing a decrease of image strength caused by alkaline water development, in the range of from 0.5 to 3.0 meq/g. When the acid value exceeds 3.0 meq/g, the image strength becomes likely to be damaged by the alkaline water development.

As solvents that are used when such specific alkali-soluble polymer A' is synthesized, for instance, ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate, and ethyl lactate can be cited.

These solvents can be used singly or in combination.

A weight average molecular weight of the specific alkali-soluble polymer A' recited in the invention is preferably 40,000 or more, and more preferably in the range of from 70,000 to 180,000. When the molecular weight is less than 40,000, undesirably the film strength becomes deficient; and when the molecular weight exceeds 180,000, the solubility in water or an alkali aqueous solution deteriorates.

Furthermore, such the specific alkali-soluble polymer A' may contain non-reacted monomer. In this case, a ratio of the monomer in the polymer compound is desirably 15 mass % or less.

The specific alkali-soluble polymers A' recited in the invention may be used singly or in combination. Furthermore, other polymer compound may be mixed and used. In this case, a content of the other polymer compound in the specific alkali-soluble polymer A' is 50 mass % or less, and more preferably 10 mass % or less.

In the following, specific polymer compounds of the specific alkali-soluble polymers A' recited in the invention and typical synthesis examples thereof will be shown; however, the invention is not restricted thereto.

| Polymer compound | Composition (mol %) | Mw |
|---|---|---|
| V-1 | 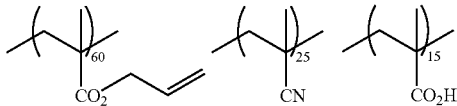 | 150000 |
| V-2 | 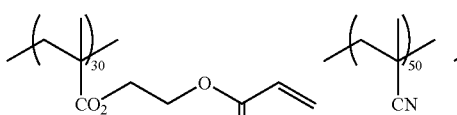 | 108000 |
| V-3 | 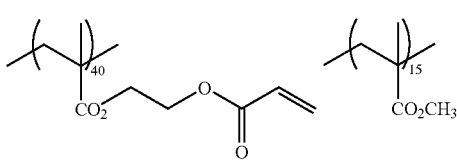 | 98000 |
| V-4 | 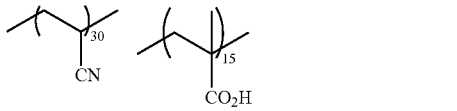 | 103000 |

-continued
| Polymer compound | Composition (mol %) | Mw |
|---|---|---|
| V-5 | 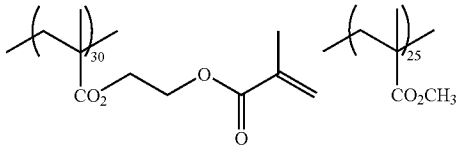 | 87000 |
| V-6 | 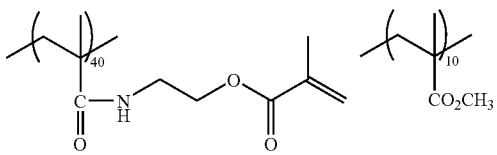 | 92000 |
| V-7 | 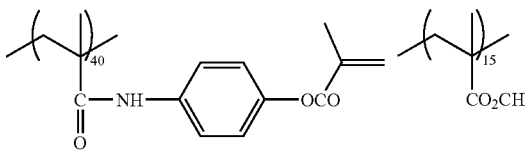 | 81000 |
| V-8 | 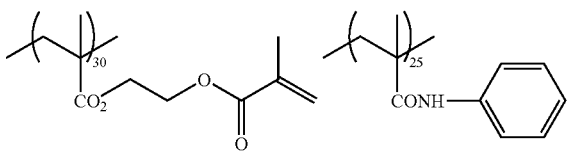 | 93000 |
| V-9 | 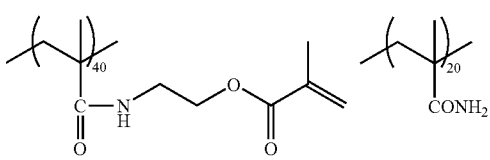 | 100000 |

-continued
| Polymer compound | Composition (mol %) | Mw |
|---|---|---|
| V-10 | 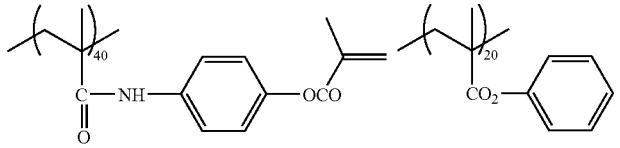 | 89000 |
| V-11 | 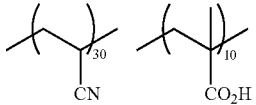 | 103000 |
| V-12 | 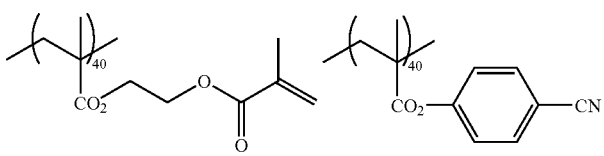 | 104000 |
| V-13 | 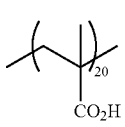 | 110000 |
| V-14 | 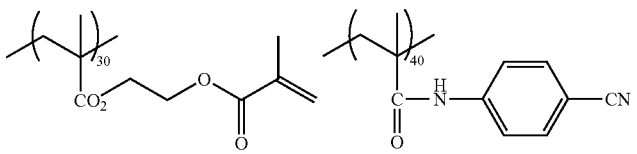 | 108000 |

-continued

| Polymer compound | Composition (mol %) | Mw |
|---|---|---|
| V-15 | | 89000 |
| V-16 | | 91000 |
| V-17 | | 106000 |
| V-18 | | 102000 |
| V-19 | | 85000 |

-continued
| Polymer compound | Composition (mol %) | Mw |
|---|---|---|
| V-20 | 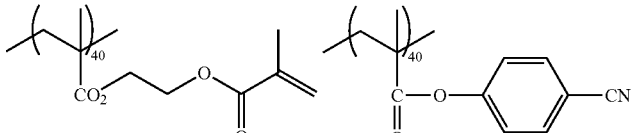 | 97000 |
| V-21 |  | 99000 |
| V-22 | 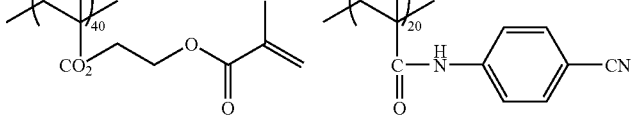 | 102000 |
| V-23 | 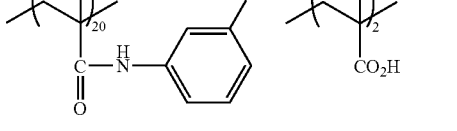 | 136000 |
| V-24 | 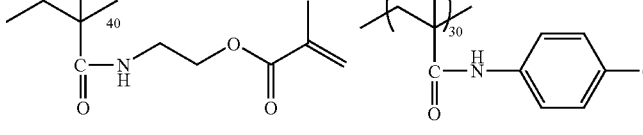 | 91000 |

Synthesis Examples

<Synthesis of Polymer Compound V-4>

Into a 1000 ml three-necked flask, 60 g of N,N-dimethylacetamide was introduced, and heated, under nitrogen current, to 70° C. Thereto, 60 g of N,N-dimethylacetamide solution comprising 33.5 g of a compound (M-14), 12.7 g of acrylonitrile, 3.4 g of methacrylic acid, and 0.401 g of V-601 (manufactured by Wako Pure Chemical Industries, Ltd.) was dropped over 2.5 hr. After the dropping came to completion, the stirring was continued for further 2 hr. Then, 0.1 g of p-methoxyphenol was added, followed by cooling of the solution with an ice bath containing ice water. After a temperature of a mixture solution became 5° C. or less, 60.5 g of 1,8-diazabicyclo[5,4,0]-7-undecene (DBU) was dropped by use of a dropping funnel over 2 hr. After the dropping came to completion, the stirring was further continued for 6 hr. The reaction solution was poured into 3 L of water in which 75 ml of concentrated hydrochloric acid was dissolved, and thereby polymer compound 4 was allowed to precipitate. The precipitated polymer compound was filtered, washed with water, dried, and thereby 38 g of the dry polymer compound was obtained. When the obtained polymer compound was subjected to $^1$H-NMR measurement, it was confirmed to be the polymer compound 4. Furthermore, by gel-permeation chromatography (GPC) with polystyrene as a reference material, a weight average molecular weight was measured and found to be 103000.

<Synthesis of Polymer Compound V-12>

Into 2000 ml three-necked flask, 210 g of N,N-dimethylacetamide was introduced followed by heating to 70° C. under nitrogen current. Thereto, 210 g of N,N-dimethylacetamide solution comprising 83.7 g of compound (A-1), 74.5 g of compound (M-14), 25.8 g of methacrylic acid and 1.206 g of V-601 (manufactured by Wako Pure Chemical Industries, Ltd.) was dropped over 2.5 hr. The stirring was continued further for 2 hr. Then, 0.6 g of TEMPO was added followed by cooling of the solution with an ice bath containing ice water. After a temperature of the mixture liquid became 5° C. or less, 182.5 g of 1,8-diazabicyclo[5,4,0]-7-undecene (DBU) was dropped with a dropping funnel over 2 hr. After the dropping came to completion, the stirring was further continued for 6 hr. The reaction liquid was thrown into 8 L of water in which 100 ml of concentrated hydrochloric acid was dissolved, and thereby a polymer compound 12 was allowed to precipitate. The precipitated polymer compound was filtered, washed with water, and dried, and thereby 105 g of the polymer compound was obtained. When the obtained polymer compound was subjected to $^1$H-NMR measurement, it was confirmed to be the polymer compound 12. Furthermore, by gel-permeation chromatography (GPC) with polystyrene as a reference material, a weight average molecular weight was measured and found to be 104,000.

A content of the specific alkali-soluble polymer A' contained in the thermo/photosensitive composition recited in the invention is in the range of approximately from 5 to 95 mass % in terms of solid components, and preferably in the range of approximately from 40 to 90 mass %. When the content is too small, the film strength tends to decrease, and when the content is excessive, the film forming property is adversely affected; accordingly, anyway, both cases are not preferable.

[(B) or (B') Compound that Generates Radicals When Exposed to Light or Heat]

The resin composition according to the invention and the thermo/photosensitive composition according to the invention contain a compound that generates radicals when exposed to light or heat (radical initiator). The radical initiator indicates a compound that generates radicals by at least one of light energy and heat energy, and thereby initiates and accelerates polymerization of the (A) specific alkali-soluble polymer A, (D) that is optionally used together and has a polymerizing unsaturated group described later, the (A') specific alkali-soluble polymer A', and a radical-polymerizing compound that is optionally used together and having a polymerizing unsaturated group described later (D'). Furthermore, (A) the specific alkali-soluble polymer A and (A') the specific alkali-soluble polymer A' according to the invention are themselves polymer compounds and have the film forming property; accordingly, only addition of the radical initiator causes an excellent resin composition and thermo/photosensitive composition.

In the invention, as preferable radical initiators, (a) aromatic ketones, (b) onium salt compounds, (c) organic peroxides, (d) thio compounds, (e) hexaarylbiimidazole compounds, (f) ketoxime ester compounds, (g) borates, (h) azinium compounds, (i) metallocene compounds, (j) active ester compounds, and (k) compounds having carbon-halogen bond can be cited. Specific examples of the (a) through (k) will be cited below; however, the invention is not restricted thereto.

(a) Aromatic Ketones

As (a) aromatic ketones preferably used as a radical initiator in the invention, compounds having a benzophenone skeleton or a thioxanthone skeleton described in J. P. Fouassier and J. F. Rabek, RADIATION CURING IN POLYMER SCIENCE AND TECHNOLOGY (1993), 77-117 can be cited. For instance,

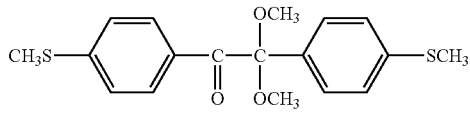

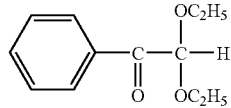 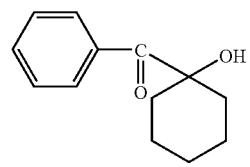

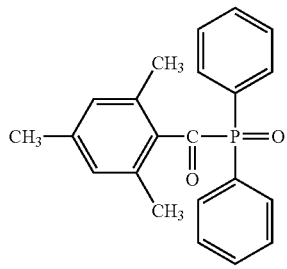

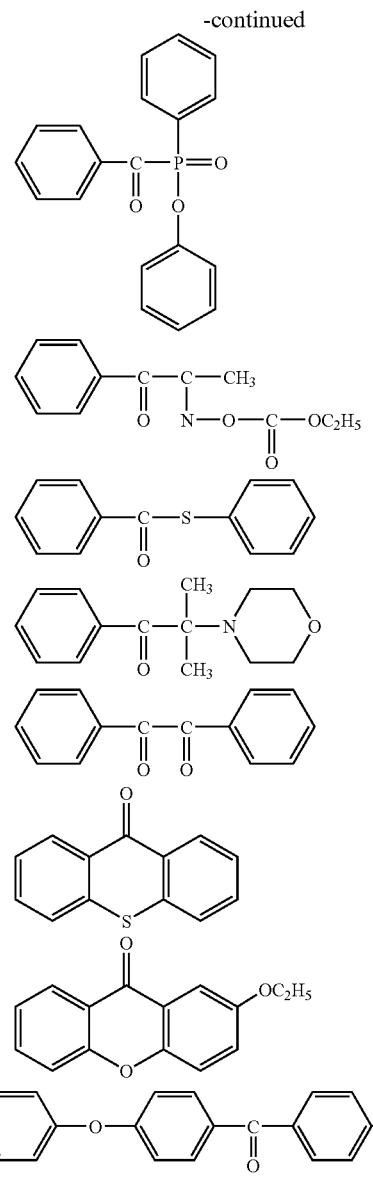

can be cited. Among these, as examples of particularly preferable (a) aromatic ketones, α-thiobenzophenones described in JP-B No. 47-6416 and benzoin ethers described in JP-B No. 47-3981 can be cited, the examples of which is the following compound.

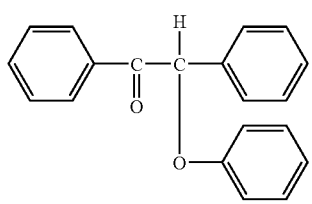

The α-substituted benzoins described in JP-B No. 47-22326 can be cited, the examples of which is the following compound.

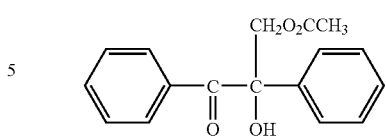

The benzoin derivatives described in JP-B No. 47-23664, aroylphosphonic acid esters described in JP-A 57-30704, dialkoxybenzophenones described in JP-B No. 60-26483 can be cited, the examples of which is the following compound.

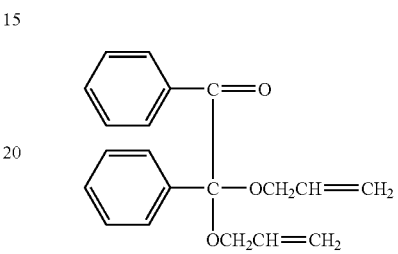

The benzoin ethers described in JP-B No. 60-26403 and JP-A No. 62-81345 can be cited, the examples of which is the following compound.

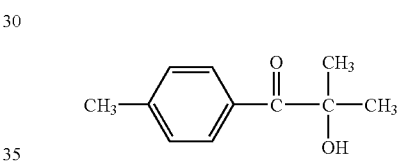

the α-aminobenzophenones described in JP-B No. 1-34242, U.S. Pat. No. 4,318,791, and EP No. 0284561A1 can be cited, the examples of which is the following compound.

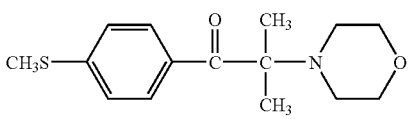

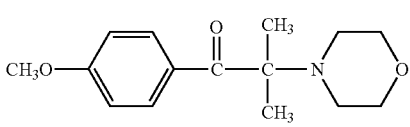

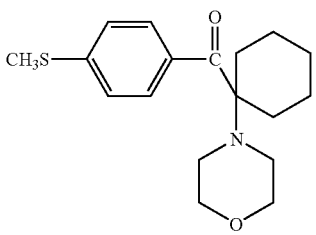

The p-di(dimethylaminobenzoyl)benzene described in JP-A No. 2-211452 can be cited, the examples of which is the following compound.

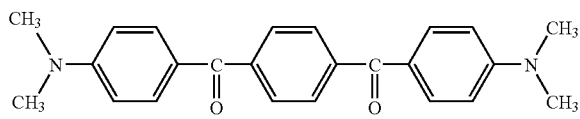

The thio substituted aromatic ketones described in JP-A No. 61-194062 can be cited, the examples of which is the following compound.

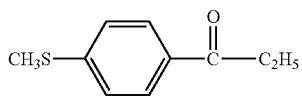

The acylphosphine sulfides described in JP-B No. 2-9597 can be cited, the examples of which is the following compound.

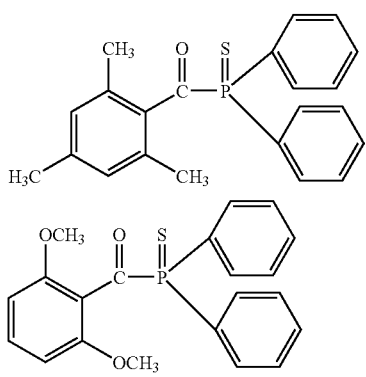

The acylphosphines described in JP-B No. 2-9596 can be cited, the examples of which is the following compound.

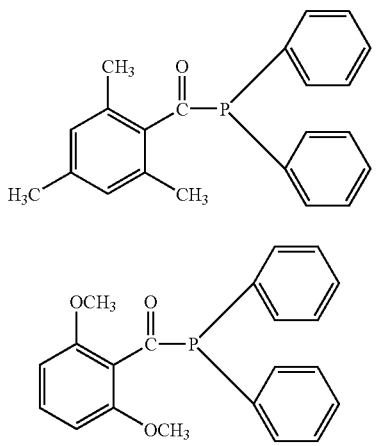

Furthermore, the thioxanthones described in JP-B No. 63-61950 and the cumarins described in JP-B No. 59-42864 can be cited.

(b) Onium Salt Compounds

As the (b) onium salt compounds preferable as the radical initiator used in the invention, compounds expressed by the following general formulae (11) through (13) can be cited.

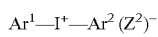     General formula (11)

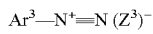     General formula (12)

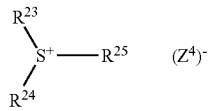

In the formula (11), $Ar^1$ and $Ar^2$ each independently represent an aryl group having 20 or less carbon atoms that may have a substituent. As preferable substituents when the aryl group has a substituent, a halogen atom, nitro group, alkyl groups having 12 or less carbon atoms, alkoxy groups having 12 or less carbon atoms, or aryloxy groups having 12 or less carbon atoms can be cited. $(Z^2)^-$ represents a counter ion selected from a group consisting of a halogen ion, perchloric acid ion, carboxylic acid ion, tetrafluoroborate ion, hexafluorophosphate ion and sulfonic acid ion, and preferably perchloric acid ion, hexafluorophosphate ion and arylsulfonic acid ion.

In the general formula (12), $Ar^3$ represents an aryl group having 20 or less carbon atoms that may have a substituent. As preferable substituents, a halogen atom, nitro group, alkyl groups having 12 or less carbon atoms, alkoxy groups having 12 or less carbon atoms, aryloxy groups having 12 or less carbon atoms, alkylamino groups having 12 or less carbon atoms, dialkylamino groups having 12 or less carbon atoms, arylamino groups having 12 or less carbon atoms, or diarylamino groups having 12 or less carbon atoms can be cited. The definition of $(Z^3)^-$ is the same as that of $(Z^2)^-$.

In the formula (13), $R^{23}$, $R^{24}$ and $R^{25}$ each may be the same with or different from each other, and represents a hydrocarbon group having 20 or less carbon atoms that may have a substituent. As preferable substituents, a halogen atom, nitro group, alkyl groups having 12 or less carbon atoms, alkoxy groups having 12 or less carbon atoms, or aryloxy groups having 12 or less carbon atoms can be cited. The definition of $(Z^4)^-$ is the same as that of $(Z^2)^-$.

In the invention, as specific examples of onium salts that can be preferably used, those described in JP-A No. 2001-133969 paragraph Nos. from [0030] to [0033] proposed by the present applicants and those described in JP-A No. 2001-343742 paragraph Nos. from [0015] to [0046] can be cited.

The onium salts used in the invention preferably have a maximum absorption wavelength of 400 nm or less, and furthermore preferably of 360 nm or less. By thus setting the absorption wavelength in the ultra-violet region, it becomes possible to handle a planographic printing plate precursor white light.

(c) Organic Peroxides

As (c) organic peroxides preferable as the radical initiator used in the invention, almost all compounds that have one or more of oxygen-oxygen bond in a molecule are applicable. As examples thereof, there are methyl ethyl ketone peroxide, cyclohexanone peroxide, 3,3,5-trimethylcyclohexanone peroxide, methylcyclohexanone peroxide, acetylacetone peroxide, 1,1-bis(t-butylperoxy)-3,3,5-trimethylcyclohexane, 1,1-bis(t-butylperoxy)cyclohexane, 2,2-bis(t-butylperoxy) butane, t-butyl hydroperoxide, cumene hydroperoxide, diisopropylbenzene hydroperoxide, p-methane hydroperoxide, 2,5-dimethylhexane-2,5-dihydroperoxide, 1,1,3,3-tetramethyl butyl hydroperoxide, ditertiary butyl peroxide, t-butyl cumyl peroxide, dicumyl peroxide, bis(t-butylperoxyisopropyl)benzene, 2,5-dimethyl-2,5-di(tertiarybutylperoxy)hexane, 2,5-xanoyl peroxide, succinic acid peroxide, benzoyl peroxide, 2,4-dichlorobenzoyl peroxide, m-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, t-butyl peroxyacetate, t-butyl peroxypivalate, t-butyl peroxyneodecanoate, t-butyl peroxyoctanoate, t-butyl peroxy-3,5,5-trimethylhexanoate, t-butyl peroxylaurate, t-carbonate, 3,3',4,4'-tetra(t-butylperoxycarbonyl)benzophenone, 3,3',4,4'-tetra-(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra-(cumylperoxycarbonyl)benzophenone, 3,3',4,4'-tetra(p-isopropylcumylperoxycarbonyl)benzophenone, carbonyldi(t-butylperoxydihydrogendiphthalate), and carbonyldi(t-hexylperoxydihydrogendiphthalate).

Among them, peroxide esters such as 3,3',4,4'-tetra-(t-butylperoxycarbonyl)benzophenone, 3,3',4,4'-tetra-(t-amylperoxycarbonyl)benzophenone, 3,3',4,4'-tetra-(t-hexylperoxycarbonyl)benzophenone, 3,3',4,4'-tetra-(t-octylperoxycarbonyl)benzophenone, 3,3',4,4'-tetra-(cumylperoxycarbonyl)benzophenone, 3,3',4,4'-tetra-(p-isopropylcumylperoxycarbonyl)benzophenone and di-t-butylperoxy isophthalate are preferable.

(d) Thio Compounds

As the (d) thio compounds preferable as the radical initiator used in the invention, compounds having a structure represented by the following general formula (14) can be cited.

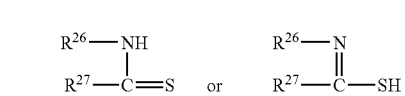

General formula (14)

(In the general formula (14), $R^{26}$ represents an alkyl group, aryl group or substituted aryl group, and $R^{27}$ represents a hydrogen atom or alkyl group. Furthermore, the $R^{26}$ and $R^{27}$ represent a group of non-metal atoms that are necessary for forming a 5- or 7-membered ring that may contains a hetero atom selected from an oxygen atom, sulfur atom and nitrogen atom, by bonding to each other.)

As the alkyl groups in the general formula (14), thoese having 1 to 4 carbon atoms are preferable. Furthermore, as the aryl groups, those having 6 to 10 carbon atoms such as phenyl and naphthyl groups are preferable, and the substituted aryl groups include those in which a halogen atom such as a chlorine atom, alkyl group such as a methyl group or alkoxy group such as a methoxy group or ethoxy group is substituted on the aryl group as mentioned above. $R^{27}$ is preferably an alkyl group having 1 to 4 carbon atoms. As specific examples of the thio compounds represented by the general formula (14), compounds shown below can be cited.

| No. | $R^{26}$ | $R^{27}$ |
|---|---|---|
| 1 | —H | —H |
| 2 | —H | —$CH_3$ |
| 3 | —$CH_3$ | —H |
| 4 | —$CH_3$ | —$CH_3$ |
| 5 | —$C_6H_5$ | —$C_2H_5$ |
| 6 | —$C_6H_5$ | —$C_4H_9$ |
| 7 | —$C_6H_4Cl$ | —$CH_3$ |
| 8 | —$C_6H_4Cl$ | —$C_4H_9$ |
| 9 | —$C_6H_4$—$CH_3$ | —$C_4H_9$ |
| 10 | —$C_6H_4$—$OCH_3$ | —$CH_3$ |
| 11 | —$C_6H_4$—$OCH_3$ | —$C_2H_5$ |
| 12 | —$C_6H_4$—$OC_2H_5$ | —$CH_3$ |
| 13 | —$C_6H_4$—$OC_2H_5$ | —$C_2H_5$ |
| 14 | —$C_6H_4$—$OCH_3$ | —$C_4H_9$ |
| 15 | —$(CH_2)_2$— | |
| 16 | —$(CH_2)_2$—S— | |
| 17 | —$CH(CH_3)$—$CH_2$—S— | |
| 18 | —$CH_2$—$CH(CH_3)$—S— | |
| 19 | —$C(CH_3)_2$—$CH_2$—S— | |
| 20 | —$CH_2$—$C(CH_3)_2$—S— | |
| 21 | —$(CH_2)_2$—O— | |
| 22 | —$CH(CH_3)$—$CH_2$—O— | |
| 23 | —$C(CH_3)_2CH_2$—O— | |
| 24 | —CH=CH—$N(CH_3)$— | |
| 25 | —$(CH_2)_3$—S— | |
| 26 | —$(CH_2)_2$—$CH(CH_3)$—S— | |
| 27 | —$(CH_2)_3$—O— | |
| 28 | —$(CH_2)_5$— | |
| 29 | —$C_6H_4$—O— | |
| 30 | —N=$C(SCH_3)$—S— | |
| 31 | —$C_6H_4$—NH— | |
| 32 | 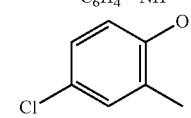 | |

(e) Hexaarylbiimidazole Compounds

As the (e) hexaarylbiimidazole compounds preferable as the radical initiator used in the invention, lophine dimmers described in JP-B Nos. 45-37377 and 44-86516, for instance, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o, p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o, o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4', 5,5'-tetraphenylbiimidazole can be cited.

(f) Ketoxime Ester Compounds

As the (f) ketoxime ester compounds preferable as the radical initiator used in the invention, 3-benzoyloxyiminobutane-2-one, 3-acetoxyiminobutane-2-one, 3-propyonyloxyiminobutane-2-one, 2-acetoxyiminopentane-3-one, 2-acetoxyimino-1-phenylpropane-1-one, 2-benzoyloxyimino-1-phenylpropane-1-one, 3-p-toluenesulfonyloxyiminobutane-2-one, and 2-ethoxycarbonyloxyimino-1-phenylpropane-1-one can be cited.

(g) Borate Compounds

As examples of the (g) borate compounds preferable as the radical initiator used in the invention, compounds represented by the following general formula (15) can be cited.

General formula (15)

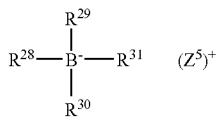

(In the general formula (15), $R^{28}$, $R^{29}$, $R^{30}$ and $R^{31}$ each may be the same with each other or different from each other, and separately represent a substituted or nonsubstituted alkyl group, substituted or nonsubstituted aryl group, substituted or nonsubstituted alkenyl group, substituted or nonsubstituted alkynyl group, or substituted or nonsubstituted heterocyclic group. Two or more groups of the $R^{28}$, $R^{29}$, $R^{30}$ and $R^{31}$ may combine to form a ring structure. Here, at least one of the $R^{28}$, $R^{29}$, $R^{30}$ and $R^{31}$ is a substituted or nonsubstituted alkyl group. $(Z^5)^+$ represents an alkali metal cation or a quaternary ammonium cation.)

The examples of the alkyl groups of the $R^{28}$ through $R^{31}$ include a linear, branched and cyclinc alkyl groups, and the number of carbon atoms is preferable to be from 1 to 18. Specifically, a methyl group, ethyl group, propyl group, isopropyl group, butyl group, pentyl group, hexyl group, octyl group, stearyl group, cyclobutyl group, cyclopentyl group and cyclohexyl group are included. Furthermore, the examples of the substituted alkyl groups of $R^{28}$ through $R^{31}$ include those obtained by substituting foregoing alkyl groups and the like with a halogen atom (such as, —Cl, —Br), cyano group, nitro group, aryl group (preferably phenyl group), hydroxy group, —COOR$^{32}$ (Here, $R^{32}$ represents a hydrogen atom, or alkyl or aryl group having 1 to 14 carbon atoms), —OCOR$^{33}$ or —OR$^{34}$ (Here, $R^{33}$ and $R^{34}$ represent an alkyl group having 1 to 14 carbon atoms, or aryl group), and those represented by the following formula.

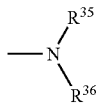

(In the formula, $R^{35}$ and $R^{36}$ separately represent a hydrogen atom and alkyl or aryl group having 1 to 14 carbon atoms).

The examples of aryl groups of the $R^{28}$ through $R^{31}$ include aryl groups having 1 to 3 rings such as a phenyl group and naphthyl group, and the examples of substituted aryl groups of the $R^{28}$ through $R^{31}$ include those obtained by substituting the aryl groups such as mentioned above with the foregoing substituent for the substituted alkyl group or an alkyl group having 1 to 14 carbon atoms. The examples of the alkenyl groups of the $R^{28}$ through $R^{31}$ include linear, branched and cyclic alkenyl groups having 2 to 18 carbon atoms. The examples of the substituents of the substituted alkenyl groups include those cited as the foregoing substituents of the substituted alkyl groups. The examples of the alkynyl groups of the $R^{28}$ through $R^{31}$ include those having linear or branched alkynyl groups having 2 to 28 carbon atoms, and the examples of the substituents of the substituted alkynyl groups include those cited as the foregoing substituents of the substituted alkyl groups. As the heterocyclic groups of the $R^{28}$ through $R^{31}$ include 5- or more-membered heterocyclic groups, preferably 5 to 7-membered heterocyclic groups, containing at least one of N, S and O, are cited; here, the heterocyclic groups may contain condensed rings. Furthermore, the cyclic group may have the substituent that is cited as the foregoing substituent of the aryl group. As examples of compounds represented by the general formula (15), specifically, compounds described in U.S. Pat. Nos. 3,567,453 and 4,343,891, and EP Nos. 109,772 and 109,773 and those shown below can be cited.

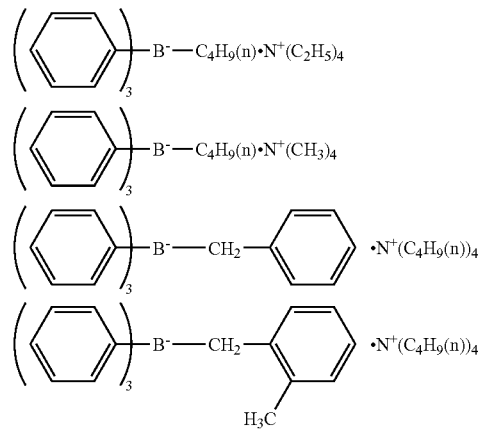

(h) Azinium Compounds

As the (h) azinium salt compounds preferable as the radical initiator used in the invention, a group of compounds that have a N—O bond described in JP-A Nos. 63-138345, 63-142345, 63-142346 and 63-143537 and JP-B No. 46-42363 can be cited.

(i) Metallocene Compounds

As the (i) metallocene compounds preferable as the radical initiator used in the invention, titanocene compounds described in JP-A Nos. 59-152396, 61-151197, 63-41484, 2-249, and 2-4705, and iron-arene complexes described in JP-A Nos. 1-304453 and 1-152109 can be cited.

As specific examples of the titanocene compounds, di-cyclopentadienyl-Ti-di-chloride, di-cyclopentadienyl-Ti-bis-phenyl, di-cyclopentadienyl-Ti-bis-2,3,4,5,6-pentafluorophen-1-yl, di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-bis-2,6-difluorophen-1-yl, di-cyclopentadienyl-Ti-bis-2,4-difluorophen-1-yl, di-methylcyclopentadienyl-Ti-bis-2,3,4,5,6-pentafluorophen-1-yl, di-methylcyclopentadienyl-Ti-bis-2,3,5,6-tetrafluorophen-1-yl, di-methylcyclopentadienyl-Ti-bis-2,4-difluorophen-1-yl, bis (cyclopentadienyl)-bis(2,6-difluoro-3-(pili-1-yl)phenyl)Titanium bis(cyclopentadienyl)bis[2,6-difluoro-3-(methylsulfoneamide) phenyl]Ti, bis(cyclopentadienyl)bis[2,6-difluoro-3-(N-butylbialloyl-amino)phenyl]Ti, bis (cyclopentadienyl)bis[2,6-difluoro-3-(N-butyl-(4-chlorobenzoyl)amino)phenyl]Ti, bis(cyclopentadienyl)bis [2,6-difluoro-3-(N-benzyl-2,2-dimethylpentanoylamino) phenyl]Ti, bis(cyclopentadienyl)bis[2,6-difluoro-3-(N-(2-ethylhexyl)-4-tolyl-sulfonyl)amino)phenyl]Ti, bis (cyclopentadienyl)bis[2,6-difluoro-3-(N-(3-oxaheptyl) benzoylamino)phenyl]Ti, bis(cyclopentadienyl)bis[2,6-difluoro-3-(N-(3,6-dioxadecyl)benzoylamino)phenyl]Ti, bis (cyclopentadienyl)bis[2,6-difluoro-3-(trifluoromethylsulfonyl)amino)phenyl]Ti, bis (cyclopentadienyl)bis[2,6-difluoro-3-(trifluoroacetylamino) phenyl]Ti, bis(cyclopentadienyl)-bis[2,6-difluoro-3-(2-chlorobenzylamino)phenyl]Ti, bis(cyclopentadienyl)bis[2, 6-difluoro-3-(4-chlorobenzoyl)amino)phenyl]Ti, bis(cyclopentadienyl)bis[2,6-difluoro-3-(N-(3,6-dioxadecyl)-2,2-dimethylpentanoylamino)phenyl]Ti, bis(cyclopentadienyl)bis[2,6-difluoro-3-(N-(3,7-dimethyl-7-methoxyoctyl)benzoylamino)phenyl]Ti, and bis(cyclopentadienyl)bis[2,6-difluoro-3-(N-cyclohexylbenzoylamino)phenyl]Ti can be cited.

(j) Active Ester Compounds

As the (j) active ester compounds preferable as the radical initiator used in the invention, imidosulfonate compounds described in JP-B No. 62-6223 and active sulfonates described in JP-B No. 63-14340 and JP-A No. 59-174831 can be cited.

(k) Compounds Having Carbon-halogen Bond

As the (k) compounds having a carbon-halogen bond preferable as the radical initiator used in the invention, those from the following general formulae (16) through (22) can be cited.

General formula (16)

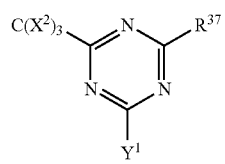

(In the general formula (16), $X^2$ represents a halogen atom, and $Y^1$ represents $-C(X^2)_3$, $-NH_2$, $-NHR^{38}$, $-NR^{38}$ or $-OR^{38}$. The $R^{38}$ represents an alkyl group, substituted alkyl group, aryl group, or substituted aryl group. Furthermore, $R^{37}$ represents $-C(X^2)_3$, alkyl group, substituted alkyl group, aryl group, substituted aryl group, or substituted alkenyl group.)

General formula (17)

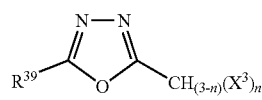

(In the general formula (17), the $R^{39}$ represents an alkyl group, substituted alkyl group, alkenyl group, substituted alkenyl group, aryl group, substituted aryl group, halogen atom, alkoxy group, substituted alkoxy group, nitro group or cyano group, and $X^3$ represents a halogen atom, and n represents an integer of 1 to 3.)

$R^{40}\text{-}Z^6\text{-}CH_{(2-m)}(X^3)_m R^{41}$      General formula (18)

(In the general formula (18), $R^{40}$ represents an aryl group or substituted aryl group; $R^{41}$ represents groups shown below or a halogen; $Z^6$ represents $-C(=O)-$, $-C(=S)-$ or $-SO_2-$; $X^3$ represents a halogen atom; and m is 1 or 2.)

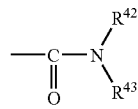 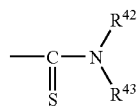 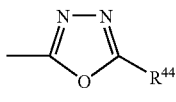

(In the formula, $R^{42}$ and $R^{43}$ represent an alkyl group, substituted alkyl group, alkenyl group, substituted alkenyl group, aryl group or substituted aryl group; and the definition of $R^{44}$ is the same as $R^{38}$ in the general formula (16).)

General formula (19)

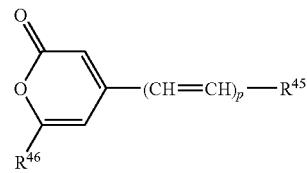

(In the general formula (19), $R^{45}$ represents an aryl group or heterocyclic group that may be substituted; $R^{46}$ represents a trihaloalkyl group or trihaloalkenyl group having 1 to 3 carbon atoms; and p is 1, 2 or 3.)

General formula (20)

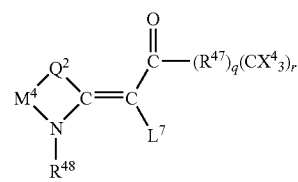

(The general formula (20) represents carbonylmethylene heterocyclic compounds having a trihalogenomethyl group. $L^7$ represents a hydrogen atom or a substituent represented by the formula: $CO-(R^{47})q(C(X^4)_3)r$; $Q^2$ represents a sulfur, selenium or oxygen atom, dialkylmethylene group, alkene-1,2-ylene group, 1,2-phenylene group or N—R group; $M^4$ represents a substituted or nonsubstituted alkylene group or alkenylene group, or 1,2-arylene group; $R^{48}$ represents an alkyl group, aralkyl group or alkoxyalkyl group; $R^{47}$ represents a carbocyclic or heterocyclic divalent aromatic group; $X^4$ represents a chlorine, bromine or iodine atom; and q=0 and r=1 or q=1 and r=1 or 2.)

General formula (21)

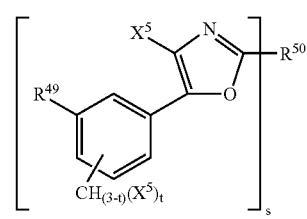

(The general formula (21) represents 4-halogeno-5-(halogenomethyl-phenyl)-oxazole derivatives. $X^5$ represents a halogen atom, t being an integer of 1 to 3, s being an integer of 1 to 4, $R^{49}$ being a hydrogen atom or $CH_{3-t}X^5_t$ group, $R^{50}$ being a s-valent unsaturated organic group that may be substituted.)

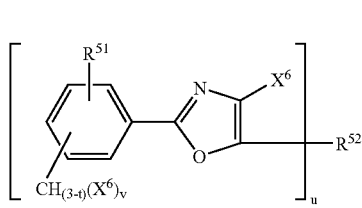

General formula (22)

(The general formula (22) represents 2-(halogenomethyl-phenyl)-4-halogeno-oxazole derivatives. $X^6$ represents a halogen atom, v being an integer of 1 to 3, u being an integer of 1 to 4, $R^{51}$ being a hydrogen atom or $CH_{3-v}X^6_v$ group, and $R^{52}$ being a u-valent unsaturated organic group that may be substituted.)

As specific examples of the compound having such a carbon-halogen bond, compounds described in Wakabayashi et al., Bull. Chem. Soc. Japan, 42, 2924 (1969), can be cited, the examples of which is, 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2', 4'-dichlorophenyl)-4,6-bis(trichloromethyl)-S-triazine, 2,4, 6-tris(trichloromethyl)-S-triazine, 2-methyl-4,6-bis (trichloromethyl)-S-triazine, 2-n-nonyl-4,6-bis (trichloromethyl)-S-triazine and 2-(α,α,β-trichloroethyl)-4, 6-bis(trichloromethyl)-S-triazine. In addition, compounds described in BP No. 1,388,492 such as 2-styryl-4,6-bis (trichloromethyl)-S-triazine, 2-(p-methylstyryl)-4,6-bis (trichloromethyl)-S-triazine, 2-(p-methoxystyryl)-4,6-bis (trichloromethyl)-S-triazine and 2-(p-methoxystyryl)-4-amino-6-trichloromethyl-S-triazine; compounds described in JP-A-53-133428 such as 2-(4-methoxy-naphtho-1-yl)-4,6-bis-trichlormethyl-S-triazine, 2-(4-ethoxy-naphtho-1-yl)-4, 6-bis-trichlormethyl-S-triazine, 2-[4-(2-ethoxyethyl)-naphtho-1-yl]-4,6-bis-trichlormethyl-S-triazine, 2-(4,7-dimethoxy-naphtho-1-yl)-4,6-bis-trichlormethyl-S-triazine and 2-(acenaphtho-5-yl)-4,6-bis-trichlormethyl-s-triazine; and compounds described in GP No. 3,337,024 such as the compounds set forth below can be cited.

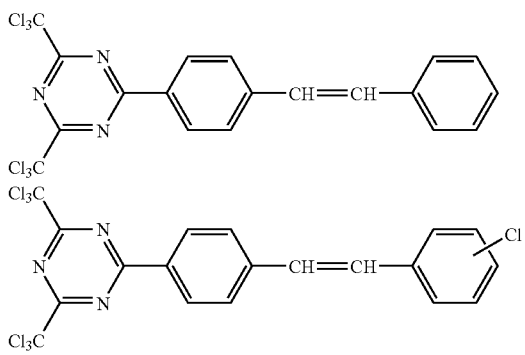

Furthermore, compounds described in F. C. Schaefer et al, J. Org. Chem., 29, 1527 (1964) such as 2-methyl-4,6-bis (tribromomethyl)-S-triazine, 2,4,6-tris(tribromomethyl)-S-triazine, 2,4,6-tris(dibromomethyl)-S-triazine, 2-amino-4-methyl-6-trisbromomethyl-S-triazine and 2-methoxy-4-methyl-6-trichloromethyl-S-triazine can be cited. Still furthermore, compounds described in JP-A-62-58241 can be cited, the examples of which is the compounds shown below.

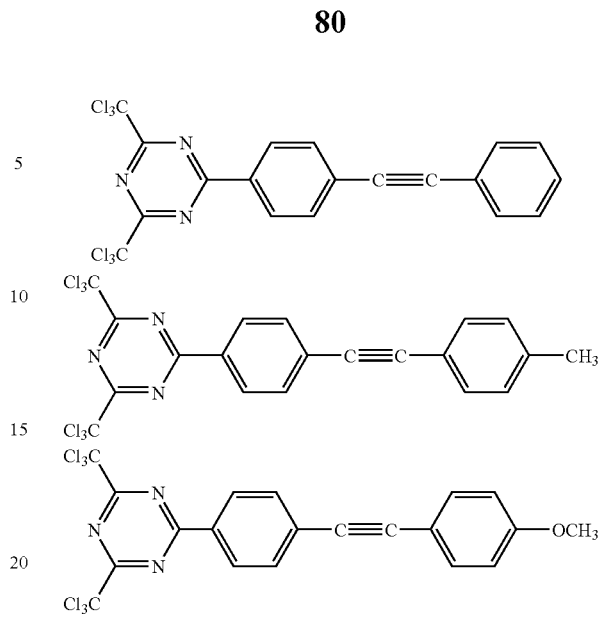

Furthermore, compounds described in JP-A-5-281728 such as the compounds shown below can be cited.

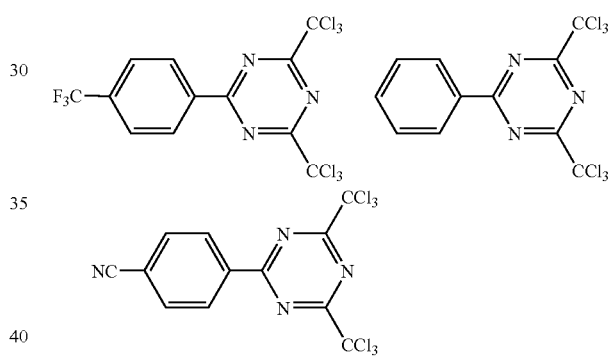

Alternatively, still furthermore, a group of compounds set forth below, which can be easily synthesized by one skilled in the art according to the synthesis method described in M. P. Hutt, E. F. Elslager and L. M. Herbel, Journal of Heterocyclic Chemistry, Vol. 7 (No. 3), 511 et seq (1970) can be cited, the examples of which is shown below.

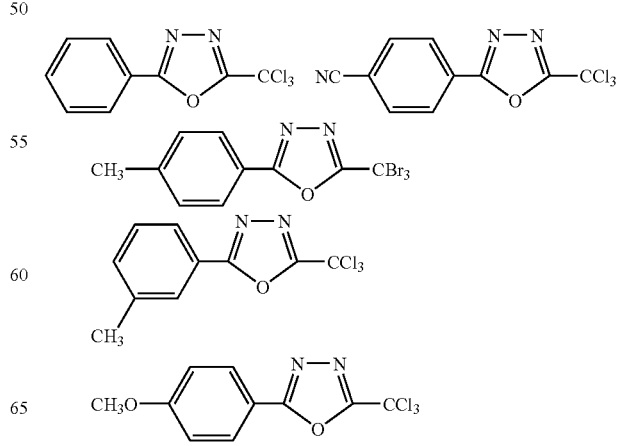

-continued

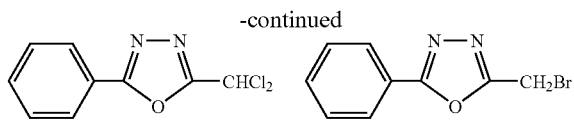

(l) Azo Compounds

As (1) azo compounds preferable as the radical initiator used in the invention, 2,2'-azobisisobutylonitrile, 2,2'-azobispropyonitrile, 1,1'-azobis(cyclohexane-1-carbonitrile), 2,2 '-azobis(2-methylbutylonitrile), 2,2'-azobis(2,4-dimethylvaleronitrile), 2,2'-azobis(4-methoxy-2,4-dimethylvaleronitrile), 4,4'-azobis(4-cyanovaleric acid), 2,2'-azobisisobutyric acid dimethyl, 2,2'-azobis(2-methylpropioneamideoxime), 2,2'-azobis[2-(2-imidazoline-2-yl)propane], 2,2'-azobis{2-methyl-N-[1,1-bis(hydroxymethyl)-2-hydroxyethyl]propioneamide}, 2,2'-azobis[2-methyl-N-(2-hydroxyethyl)propioneamide], 2,2'-azobis(N-butyl-2-methylpropioneamide), 2,2'-azobis(N-cyclohexyl-2-methylpropioneamide), 2,2'-azobis[N-(2-propenyl)-2-methylpropioneamide], and 2,2'-azobis(2,4,4-trimethylpentane) can be cited.

As furthermore preferable examples of the radical initiator in the invention, the (a) aromatic ketones, (b) onium salt compounds, (c) organic peroxides, (e) hexaarylbiimidazole compounds, (i) metallocene compounds and (k) compounds having a carbon-halogen bond can be cited; and as the most preferable examples thereof, aromatic iodonium salts, aromatic sulfonium salts, titanocene compounds, and trihalomethyl-S-triazine compounds represented by the general formula (16) can be cited.

These radical initiators are added, relative to a total solid components of a resin composition and thermo/photosensitive composition, in an amount of 0.1 to 50 mass %, more preferably 0.5 to 30 mass %, and particularly preferably 5 to 20 mass % in the resin composition and thermo/photosensitive composition.

The radical initiators recited in the invention can be preferably used singly or in combination of two or more kinds.

[(C) and (C') Sensitizing Dye]

To the resin composition and thermo/photosensitive composition recited in the invention, a sensitizing dye that can absorb light of a predetermined wavelength is preferably added. By exposing to light that has a wavelength that the sensitizing dye can absorb, a radical generation reaction by the radical initiator, and thereby a polymerization of the specific alkali-soluble polymer A can be accelerated. As such sensitizing dyes, known spectral sensitizing dyes, or dyes or pigments that can absorb light and interact with the radical initiator can be cited. Depending on the wavelengths that the sensitizing dyes absorb, the resin composition and the thermo/photosensitive composition recited in the invention become compositions that are sensitive to various wavelengths from ultra-violet to visible light and infrared light.

<Spectral Sensitizing Dye or Dyestuff>

As the spectral sensitizing dyes or dyestuffs preferable as the sensitizing dye used in the invention, polynuclear aromatics (for instance, pyrene, perilene, and triphenylene), xanthenes (for instance, fluorescein, eosine, erythrosine, rhodamine B, and rose Bengal), cyanines (for instance, thiacarbocyanine and oxacarbocyanine), merocyanines (for instance, merocyanine and carbomerocyanine), thiazines (for instance, thionine, methylene blue, and toluidine blue), acridines (for instance, acridine orange, chloroflavine, and acryflavine), phthalocyanines (for instance, phthalocyanine and metal phthalocyanine), porphyrins (for instance, tetraphenylporphirin and center metal substituted porphyrin), chlorophylls (for instance, chlorophyll, chlorophylline, and center metal substituted chlorophyll), metal complexes, anthraquinones (for instance, anthraquinone), squariums (for instance, squarium), and compounds shown below can be cited.

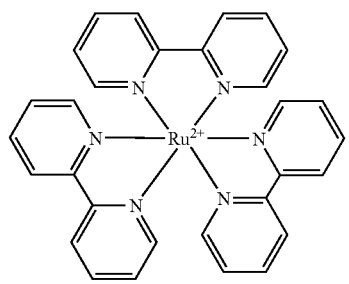

As examples of the more preferable sensitizing dyes and dyestuffs, styrylic dyes described in JP-B No. 37-13034, for instance,

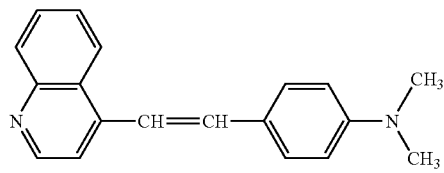

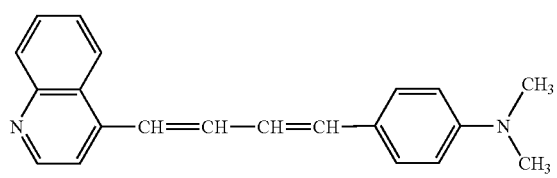

cationic dyes described in JP-A No. 62-143044, for instance,

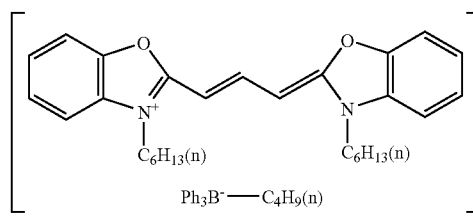

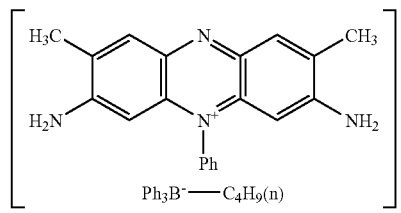

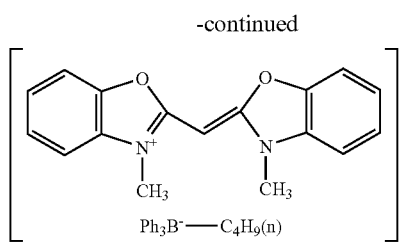
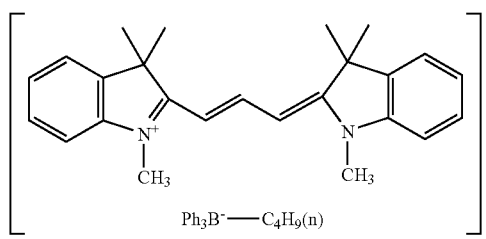
quinoxalinium salts described in JP-B No. 59-24147 such as
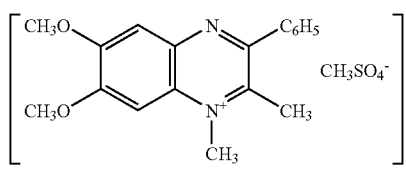
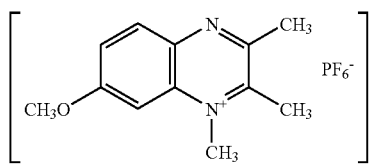
new methylene blue compounds described in JP-A No. 64-33104 such as
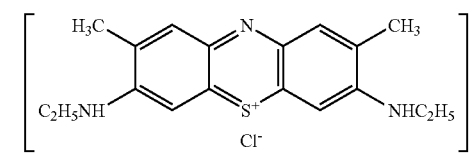
anthraquinones described in JP-A No. 64-56767 such as
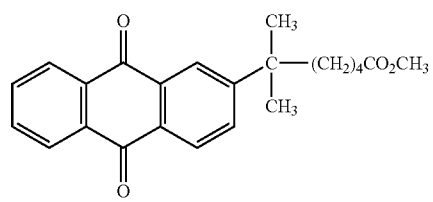
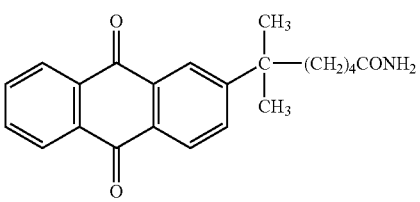
benzoxanthenes described in JP-A No. 2-1714 and acridines described in JP-A Nos. 2-226148 and 2-226149 such as
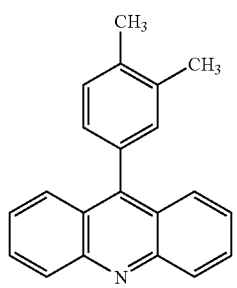
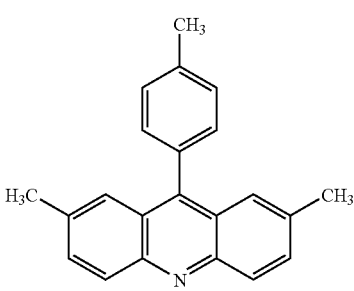
pyrilium salts described in JP-B No. 40-28499 such as
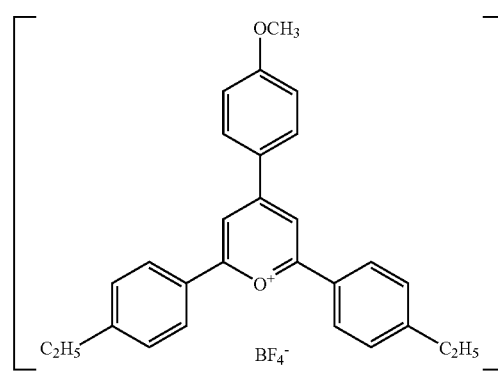

-continued
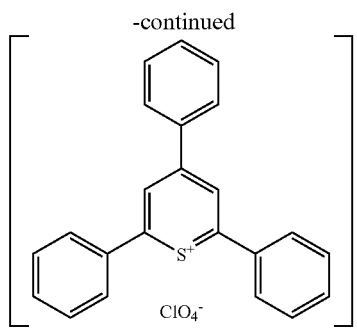
cyanines described in JP-B No. 46-42363 such as
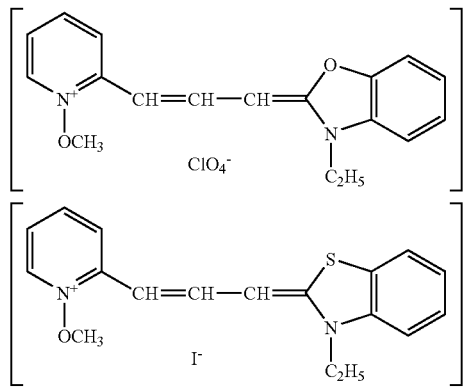
benzofuran dyes described in JP-A No. 2-63053 such as
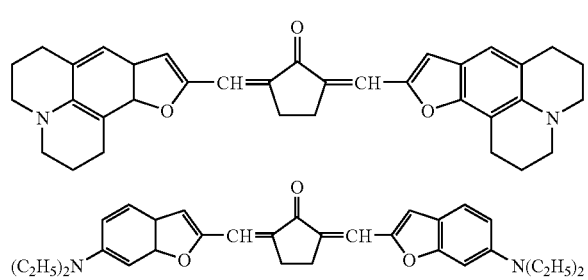
conjugated ketone dyes described in JP-A Nos. 2-85858 and 2-216154 such as
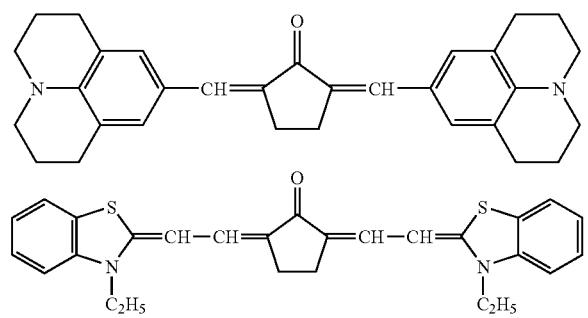
-continued
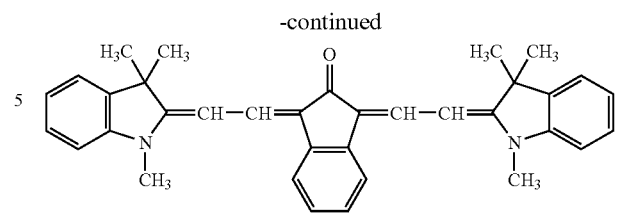
dyes described in JP-A No. 57-10605 and azocinnamylidene derivatives described in JP-B No. 2-30321 such as
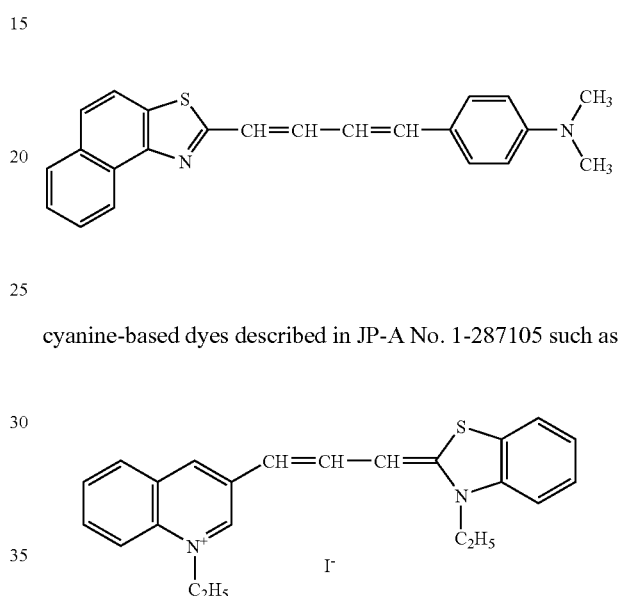
cyanine-based dyes described in JP-A No. 1-287105 such as
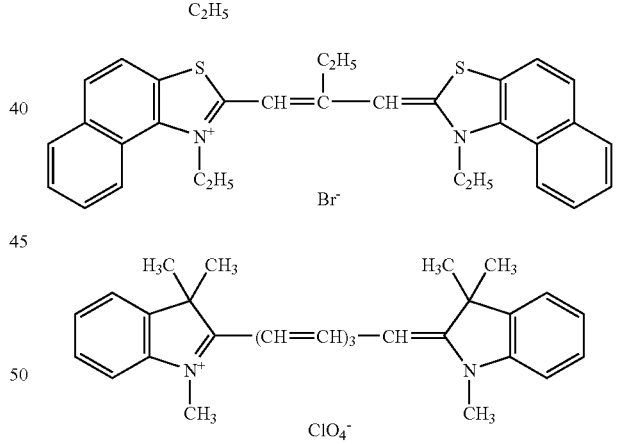
xanthene-based dyes described in JP-A Nos. 62-31844, 62-31848 and 62-143043, such as
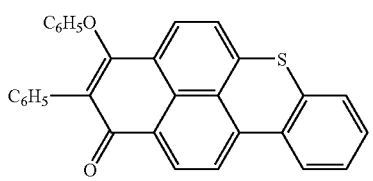

-continued

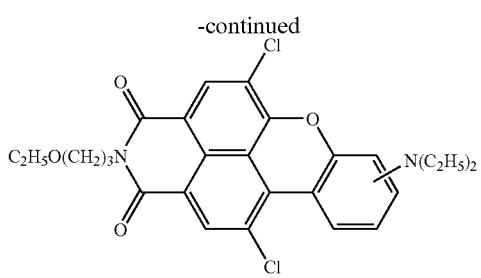

aminostyryl ketones described in JP-B No. 59-28325, such as

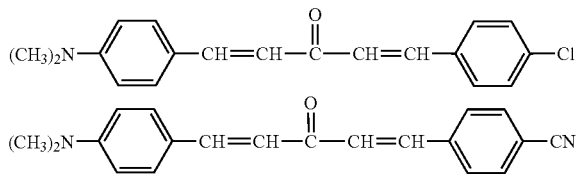

dyes represented by the following general formulae (23) through (25) described in JP-A No. 2-179643

General formula (23)

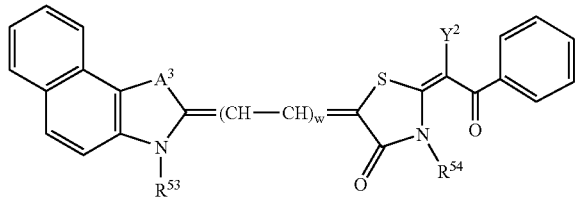

General formula (24)

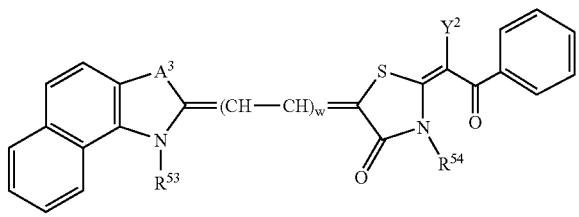

General formula (25)

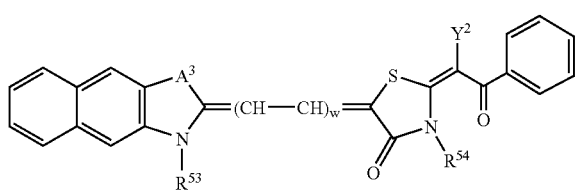

(In the formulae, $A^3$ represents an oxygen atom, sulfur atom, selenium atom, tellurium atom, alkyl or aryl substituted nitrogen atom or dialkyl substituted carbon atom; $Y^2$ represents a hydrogen atom, alkyl group, substituted alkyl group, aryl group, substituted aryl group, aralkyl group, acyl group or substituted alkoxycarbonyl group; $R^{53}$ and $R^{54}$ each represent a hydrogen atom, alkyl group having 1 to 18 carbon atoms, or substituted alkyl group having 1 to 18 carbon atoms and having, as a substituent, —$OR^{55}$, —$(CH_2CH_2O)_w$—$R^{55}$, halogen atom (F, Cl, Br, I), and a group represented by the following formulae ($R^{55}$ representing a hydrogen atom or alkyl group having 1 to 10 carbon atoms, $B^1$ represents a dialkylamino group, hydroxyl group, acyloxy group, halogen atom or nitro group; and w represents an integer of 0 to 4.))

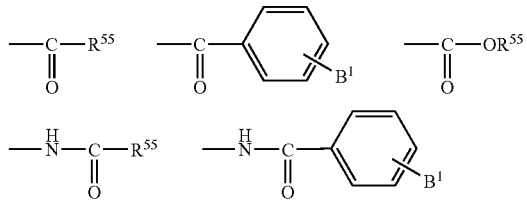

merocyanine dyes represented by the following general formula (26) described in JP-A No. 2-244050, General formula (26)

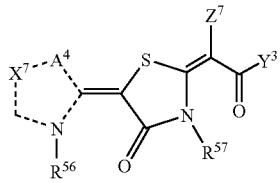

(In the general formula (26), $R^{56}$ and $R^{57}$ each independently represent a hydrogen atom, alkyl group, substituted alkyl group, alkoxycarbonyl group, aryl group, substituted aryl group or aralkyl group. $A^4$ represents an oxygen atom, sulfur atom, selenium atom, tellurium atom, alkyl or aryl substituted nitrogen atom, or dialkyl substituted carbon atom. $X^7$ represents a nonmetallic atom group necessary for forming a nitrogen-containing heterocyclic 5-membered ring. $Y^3$ represents a substituted phenyl group, nonsubstituted or substituted polynuclear aromatic ring or a nonsubstituted or substituted heteroaromatic ring. $Z^7$ represents a hydrogen atom, alkyl group, substituted alkyl group, aryl group, substituted aryl group, aralkyl group, alkoxy group, alkylthio group, arylthio group, substituted amino group, acyl group or alkoxycarbonyl group, and may be bonded to $Y^3$ to form a ring. As preferable examples, the following compounds can be cited.)

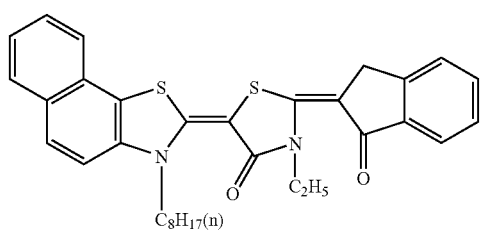

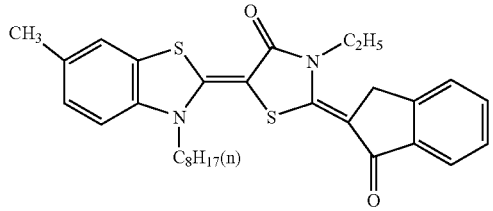

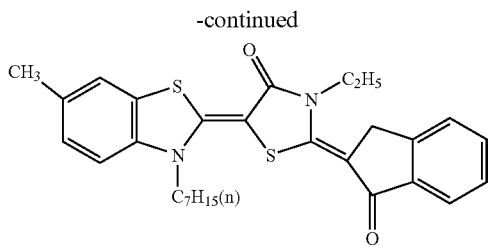

merocyanine dyes represented by the following general formula (27) set forth in JP-B No. 59-28326, General formula (27)

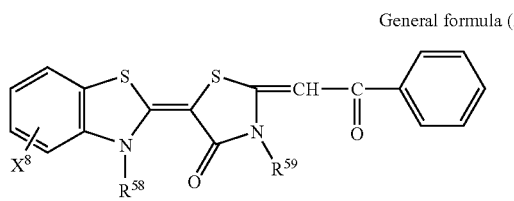

(In the general formula (27), $R^{58}$ and $R^{59}$ each represent a hydrogen atom, alkyl group, substituted alkyl group, aryl group, substituted aryl group or aralkyl group, and these may be the same each other or different from each other. $X^8$ represents a substituent whose Hammett's sigma (a) value is in the range of from −0.9 to +0.5), merocyanine dyes represented by the following general formula (28) set forth in JP-A No. 59-89303, General formula (28)

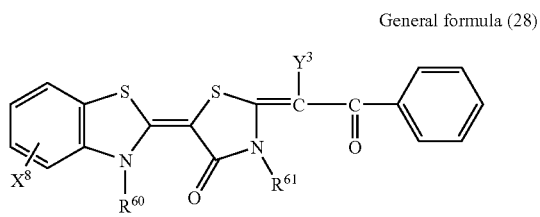

[(In the formula, $R^{60}$ and $R^{61}$ each independently represent a hydrogen atom, alkyl group, substituted alkyl group, aryl group, substituted aryl group or aralkyl group. $X^9$ represents a substituent whose Hammett's sigma (σ) value is in the range of from −0.9 to +0.5. $Y^4$ represents a hydrogen atom, alkyl group, substituted alkyl group, aryl group, substituted aryl group, aralkyl group, acyl group or alkoxycarbonyl group.) As preferable examples, the following compounds can be cited]

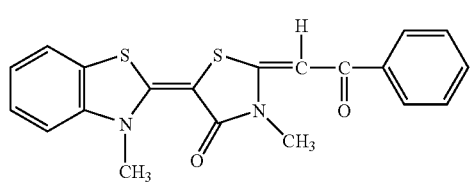

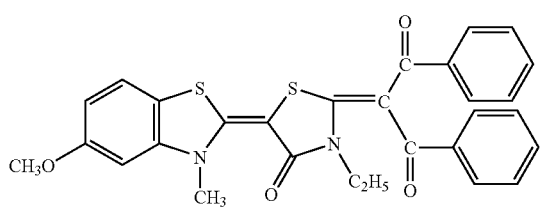

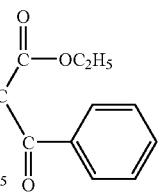

merocyanine dyes represented by the following general formula (29) set forth in JP-A No. 08-129257

General formula (29)

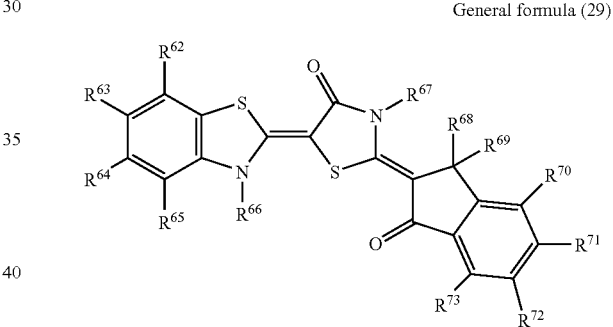

[(In the general formula (29), $R^{62}$, $R^{63}$, $R^{64}$, $R^{65}$, $R^{70}$, $R^{71}$, $R^{72}$ and $R^{73}$ each independently represents a hydrogen atom, halogen atom, alkyl group, substituted alkyl group, aryl group, substituted aryl group, hydroxyl group, substituted oxy group, mercapto group, substituted thio group, amino group, substituted amino group, substituted carbonyl group, sulfo group, sulfonate group, substituted sulfinyl group, substituted sulfonyl group, phosphono group, substituted phosphono group, phosphonate group, substituted phosphonate group, cyano group, or nitro group; alternatively, $R^{62}$ and $R^{63}$, $R^{63}$ and $R^{64}$, $R^{64}$ and $R^{65}$, $R^{70}$ and $R^{71}$, $R^{71}$ and $R^{72}$, or $R^{72}$ and $R^{73}$ may bonded to each other to form an aliphatic group or aromatic ring; $R^{66}$ represents a hydrogen atom, alkyl group, substituted alkyl group, aryl group, or substituted aryl group; $R^{67}$ represents a substituted or nonsubstituted alkenylalkyl group, or substituted or nonsubstituted alkynylalkyl group; $R^{68}$ and $R^{69}$ each independently represent a hydrogen atom, halogen atom, alkyl group, substituted alkyl group, aryl group, substituted aryl group, or substituted carbonyl group.) As preferable examples, compounds shown below can be cited.]

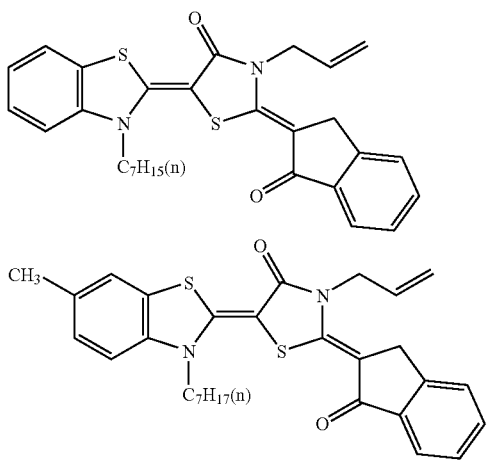

benzopyran dyes represented by the following general formula (30) set forth in JP-A No. 08-334897,

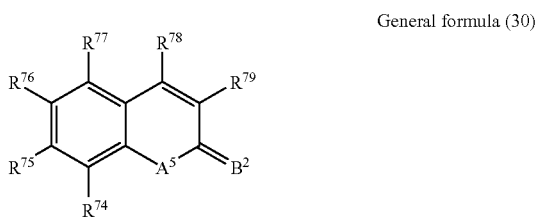

General formula (30)

(In the general formula (30), $R^{74}$ through $R^{77}$ each independently represent a hydrogen atom, halogen atom, alkyl group, aryl group, hydroxyl group, alkoxy group or amino group. Furthermore, $R^{74}$ through $R^{77}$ may form a ring made of carbon atoms and non-metal atoms, by bonding to each other. $R^{78}$ represents a hydrogen atom, alkyl group, aryl group, heteroaromatic group, cyano group, alkoxy group, carboxy group or alkenyl group. $R^{79}$ is a group represented by $R^{78}$ or -$Z^7$-$R^{78}$, $Z^7$ represents a carbonyl group, sulfonyl group, sulfinyl group or arylenedicarbonyl group. Furthermore, both $R^{78}$ and $R^{79}$ may form a ring made of non-metal atoms. $A^5$ represents an oxygen atom, sulfur atom, NH or N atom having a substituent. $B^2$ represents an oxygen atom, or a group of =C($G^7$)($G^8$). $G^7$ and $G^8$, either same with or different from each other, represent a hydrogen atom, cyano group, alkoxycarbonyl group, aryloxycarbonyl group, acyl group, arylcarbonyl group, alkylthio group, arylthio group, alkylsulfonyl group, arylsulfonyl group, or fluorosulfonyl group. However, $G^7$ and $G^8$ can not both be the hydrogen atom at the same time. Furthermore, $G^7$ and $G^8$ may form a ring made of non-metal atoms together with carbon atoms.) and the like can be cited.

In addition, as the sensitizing dye, the following IR absorbers (dyes or pigments) can be preferably used. As preferable dyes, cyanine dyes set forth in, for instance, JP-A Nos. 58-125246, 59-84356, 59-202829, and 60-78787, and cyanine dyes set forth in GB No. 434,875 can be cited.

Furthermore, near IR absorbing sensitizing agents set forth in U.S. Pat. No. 5,156,938 can be also preferably used, still furthermore, substituted arylbenzo(thio)pyrilium salts described in U.S. Pat. No. 3,881,924, trimethinethiapyrylium salts set forth in JP-A No. 57-1426454 (U.S. Pat. No. 4,327, 169), pyrylium-based compounds set forth in JP-A Nos. 58-181051, 58-220143, 59-41363, 59-84248, 59-84249, 59-146063, and 59-146061, cyanine dyes set forth in JP-A-No. 59-216146, pentanemethinethiopyrylium salts described in U.S. Pat. No. 4,283,475, and pyrylium compounds set forth in JP-B Nos. 5-13514 and 5-19702 also can be preferably used.

Still furthermore, near-IR absorbing dyes set forth as formulae (I) and (II) in U.S. Pat. No. 4,756,993, and phthalocyanine-based dyes set forth in EP No. 916513A2 can be also cited as preferable dyes.

Furthermore, anionic IR absorbing agents set forth in Japanese Patent Application No. 10-79912 also can be preferably used. The anionic IR absorbing agent indicates one that does not have a cationic structure but has an anionic structure in a mother nucleus of a dye that practically absorbs an IR ray. For instance, (a) anionic metal complexes, (b) anionic carbon blacks, (c) anionic phthalocyanines, and furthermore (d) compounds represented by the following general formula (31) can be cited. A counter cation of these anionic IR absorbing agent is a monovalent positive ion including proton or a multivalent positive ion.

$[G^9-M^5-G^{10}]_m (X^{10})^+$     General formula (31)

Here, (a) the anionic metal complex indicates one in which an entirety of a central metal of a complex portion that practically absorbs light and a ligand, is anionic.

(b) As the anionic carbon black, the carbon black having an anionic group such as sulfonic acid, carboxylic acid, and phosphonic acid as a substituent, can be cited. In order to introduce these groups into carbon black, a method of oxidizing carbon black with the acid as described in Carbon Black Kyoukai ed., *Carbon Black Binran (Handbook of Carbon Blacks)*, 3rd ed., Carbon Black Kyoukai, Apr. 5, 1995, pp 12 can be applied.

(c) The anionic phthalocyanine indicates a compound in which the anion group cited in the explanation in (b) is bonded to a phthalocyanine skeleton as a substituent to form an anion as a whole.

Next, the compounds represented by the general formula (31) (described in the foregoing (d)) will be described in detail below. In the general formula (31), $G^9$ represents an anionic substituent, and $G^{10}$ represents a neutral substituent. $(X^{10})^+$ represents a mono- to m-valent cation including a proton; and m represents an integer of 1 to 6. $M^5$ represents a conjugate chain, and the conjugate chain $M^5$ may contain a substituent and/or a cyclic structure. The conjugate chain $M^5$ can be represented by the following formula.

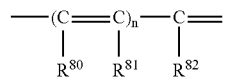

In the formula, $R^{80}$, $R^{81}$ and $R^{82}$ each independently represents a hydrogen atom, halogen atom, cyano group, alkyl group, aryl group, alkenyl group, alkynyl group, carbonyl group, thio group, sulfonyl group, sulfinyl group, oxy group or amino group, and these may be bonded to each other and form a ring structure. n represents an integer of 1 to 8.

Of the anionic infrared absorbing agents represented by the general formula (31), the following compounds IRA-1 through IRA-5 can be preferably used.

IRA-1
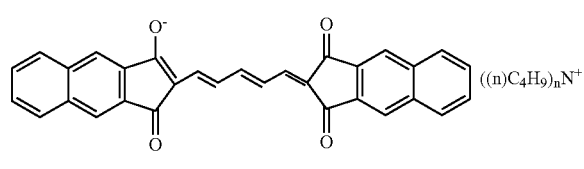
IRA-2
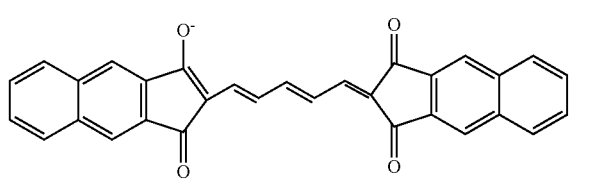
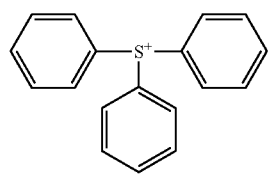
IRA-3
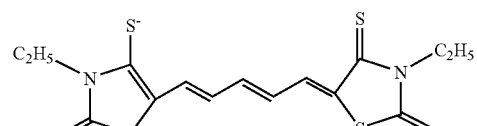
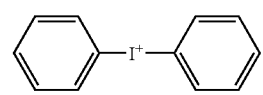
IRA-4
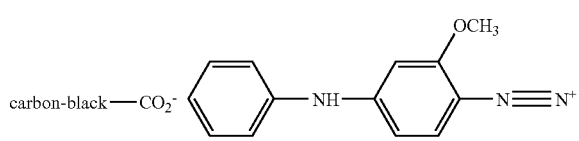
IRA-5
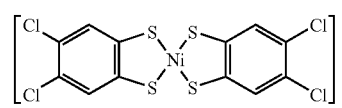 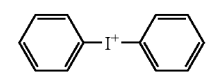
Furthermore, cationic infrared absorbing agents shown by the following IRC-1 through IRC-44 can be also preferably used.
IRC-1
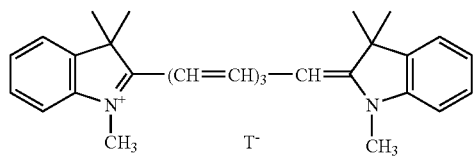
IRC-2
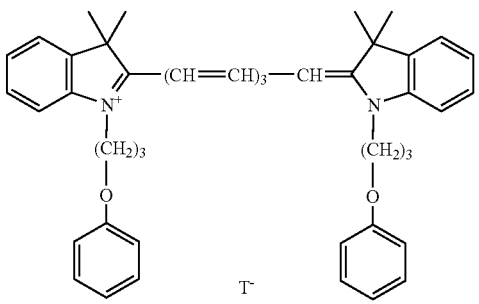
IRC-3
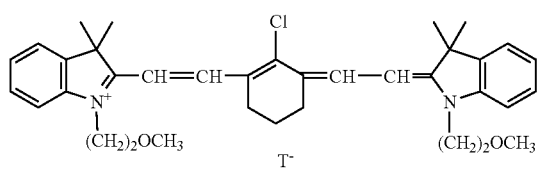
IRC-4
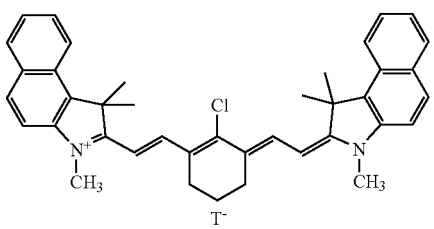

-continued
IRC-5
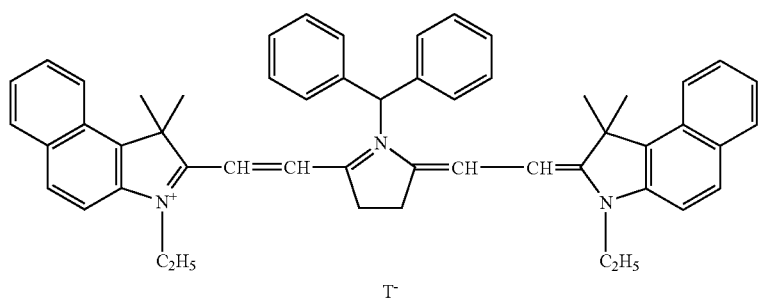
IRC-6
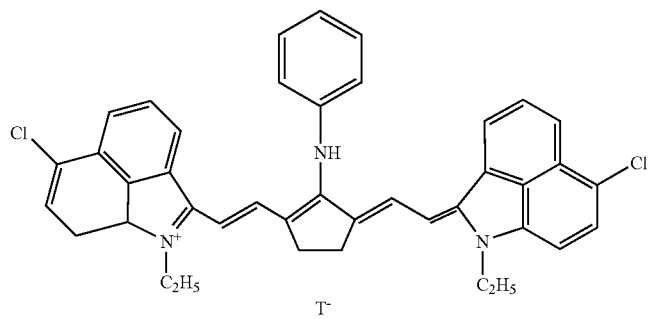
IRC-7
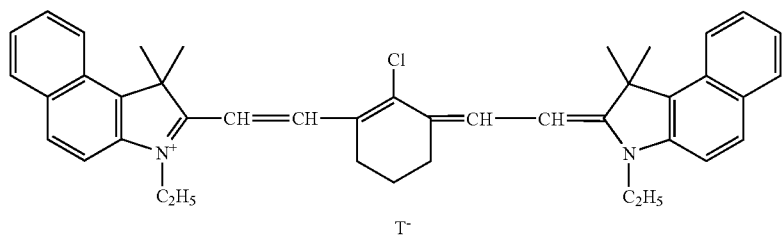
IRC-8
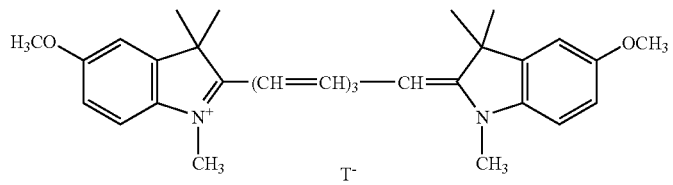
IRC-9
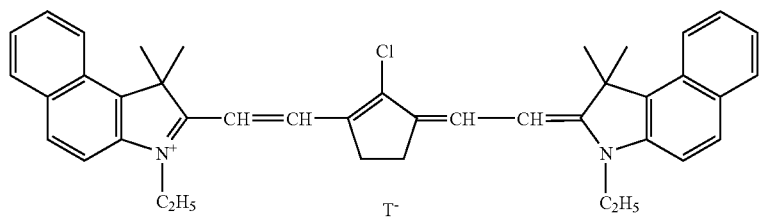
IRC-10
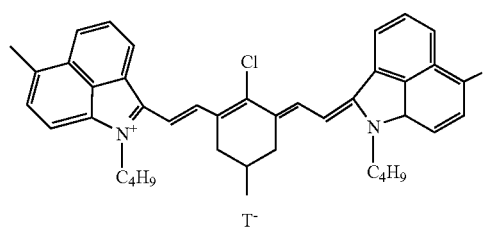
IRC-11
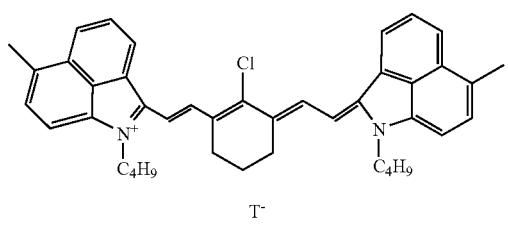

-continued
IRC-12
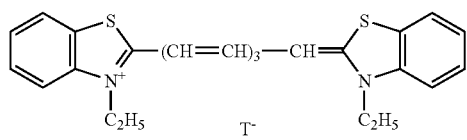
IRC-13
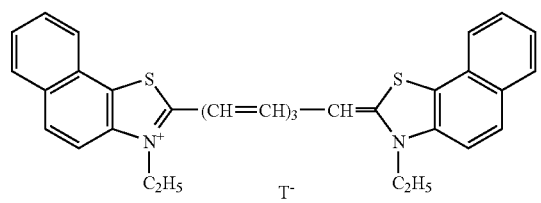
IRC-14
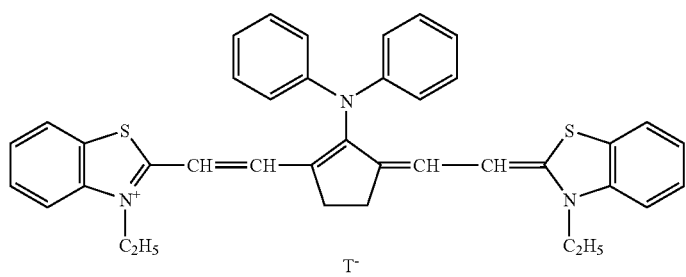
IRC-15
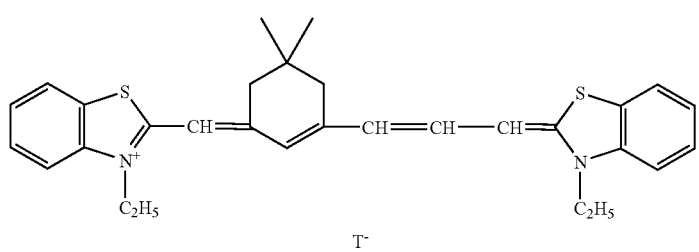
IRC-16
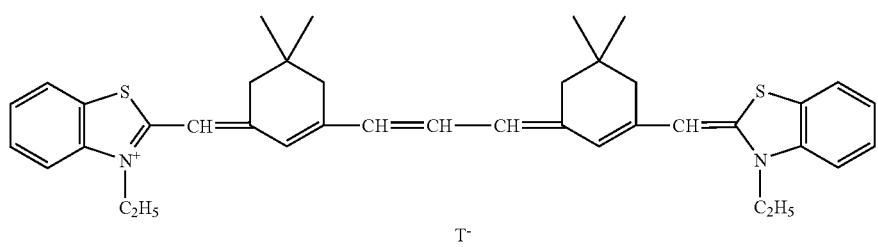
IRC-17
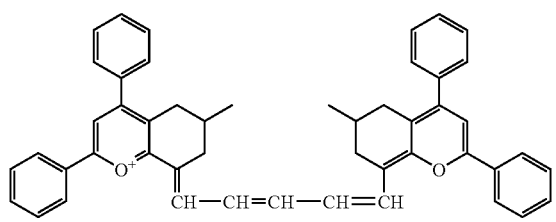
IRC-18
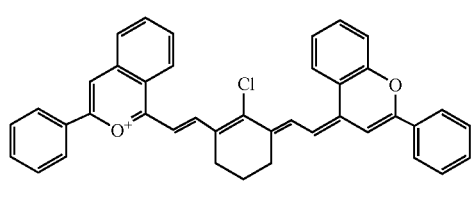
IRC-19
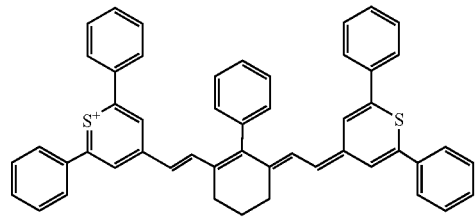

-continued
IRC-20
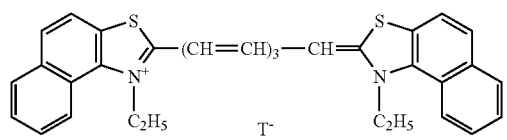
IRC-21
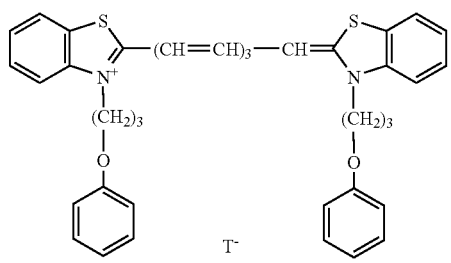
IRC-22
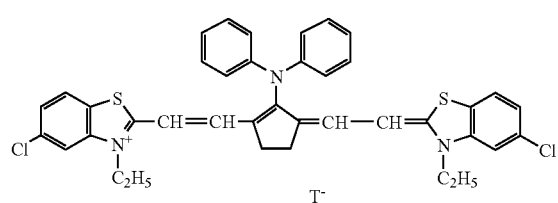
IRC-23
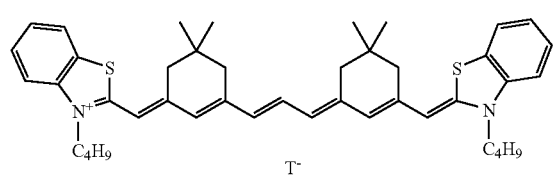
IRC-24
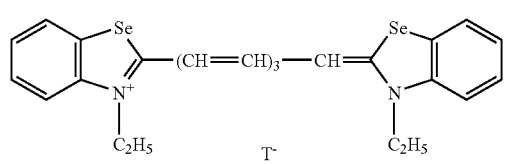
IRC-25
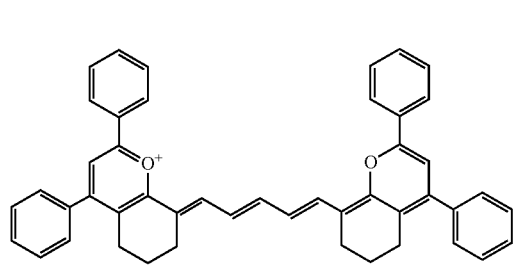
IRC-26
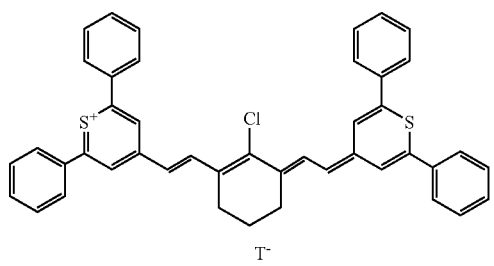
IRC-27
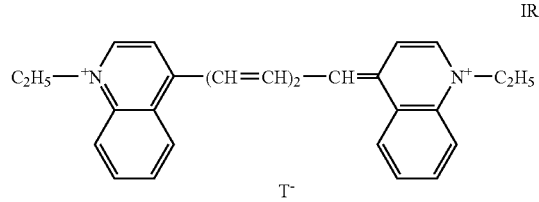
IRC-28
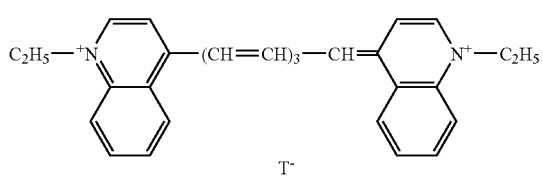

-continued
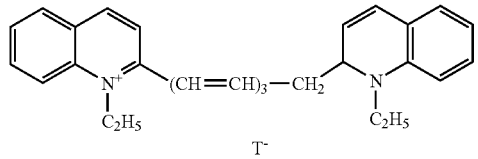
IRC-29
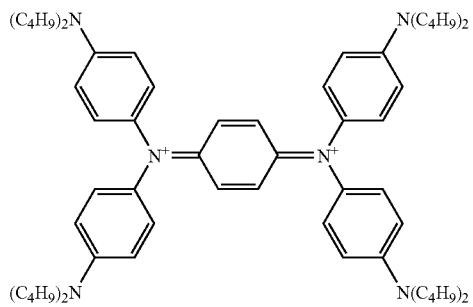
IRC-30
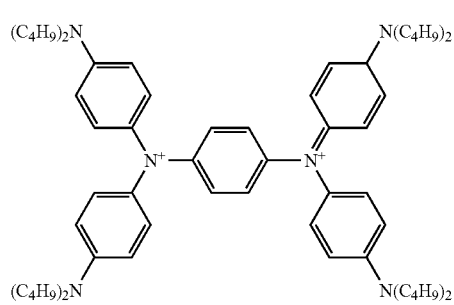
IRC-31
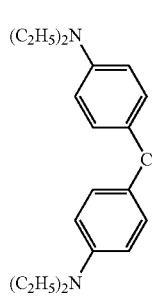
IRC-32
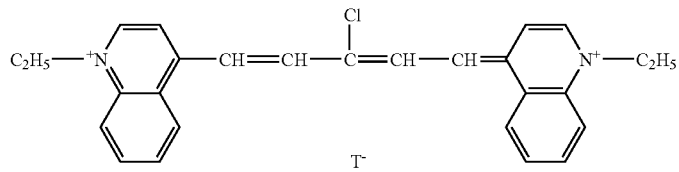
IRC-33
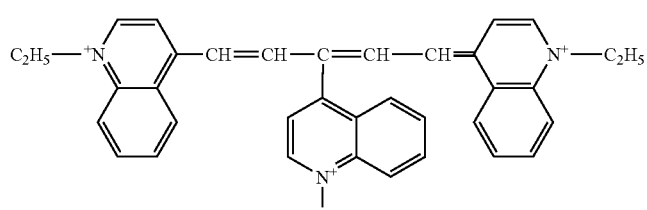
IRC-34
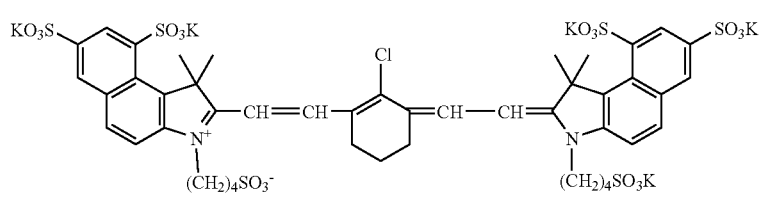
IRC-35
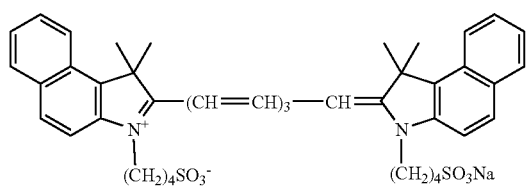
IRC-36

-continued
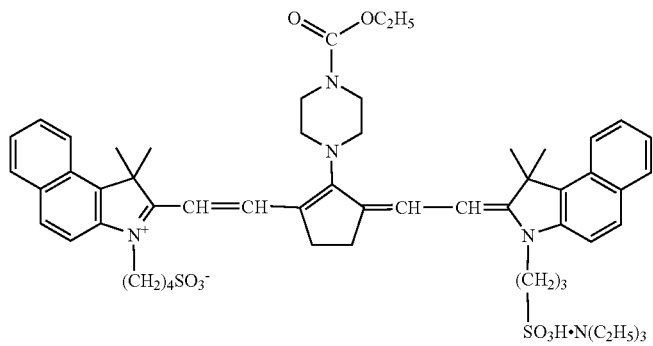
IRC-37
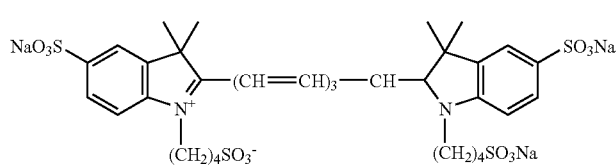
IRC-38
IRC-39
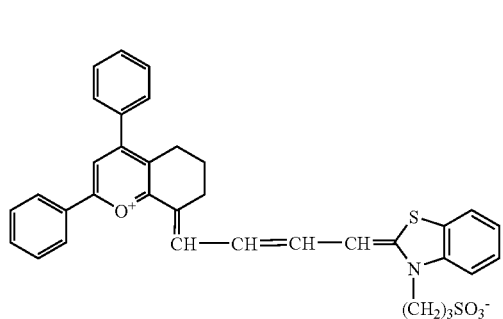
IRC-40
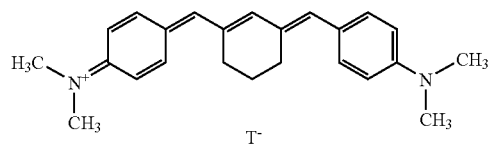
IRC-41
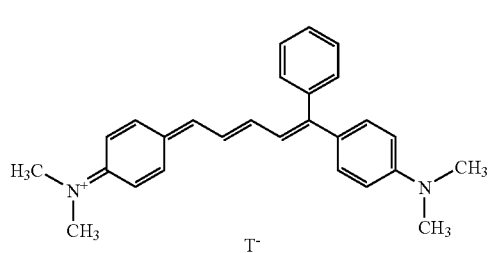
IRC-42
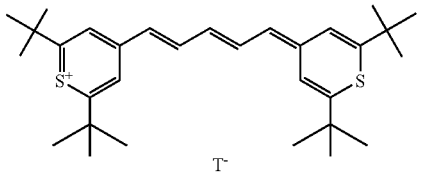
IRC-43
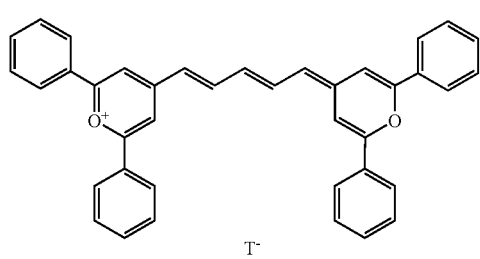

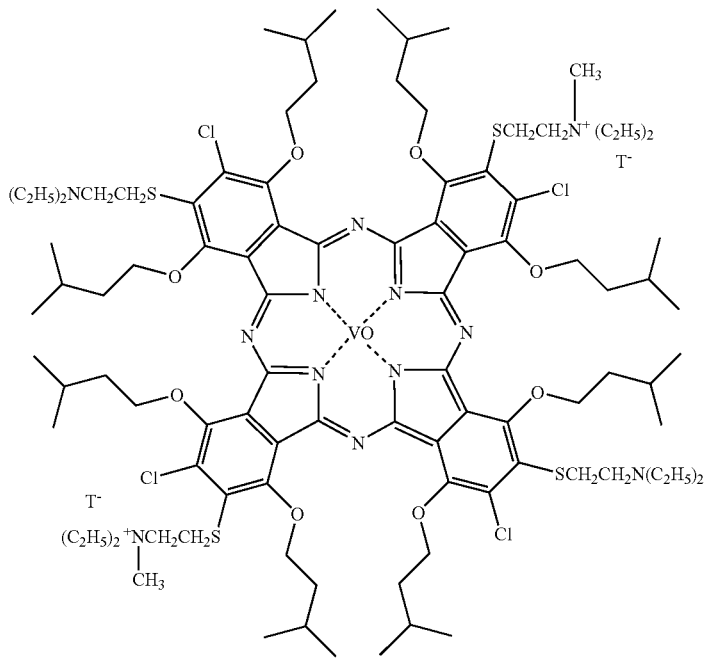

IRC-44

In the structural formulae, T⁻ represents a monovalent counter anion, preferably a halogen anion (F⁻, Cl⁻, Br⁻, I⁻), Lewis acid anion (BF$_4^-$, PF6–, SbCl$_6^-$, ClO$_4^-$), alkylsulfonic acid anion, or arylsulfonic acid anion.

The alkyl of the alkylsulfonic acid means a linear, branched or cyclic alkyl group having 1 to 20 carbon atoms, and, specifically, a methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicosyl group, isopropyl group, isobutyl group, s-butyl group, t-butyl group, isopentyl group, neopentyl group, 1-methylbutyl group, isohexyl group, 2-ethylhexyl group, 2-methylhexyl group, cyclohexyl group, cyclopentyl group, and 2-norbornyl group can be cited. Among these, linear alkyl groups having 1 to 12 carbon atoms, branched alkyl groups having 3 to 12 carbon atoms, and cyclic alkyl groups having 5 to 10 carbon atoms are more preferable.

The aryl of the aryl sulfonic acid represents those having one benzene ring, those in which 2 or 3 benzene rings form a condensed ring, or those in which a benzene ring and a five-membered unsaturated ring form a condensed ring; and, as specific examples, a phenyl group, naphthyl group, anthryl group, phenanthryl group, indenyl group, acenaphthenyl group, and fluorenyl group can be cited; among these, a phenyl group and naphthyl group are more preferable.

Furthermore, non-ionic infrared absorbing agents IRN-1 through IRN-9 shown in the following can be preferably used.

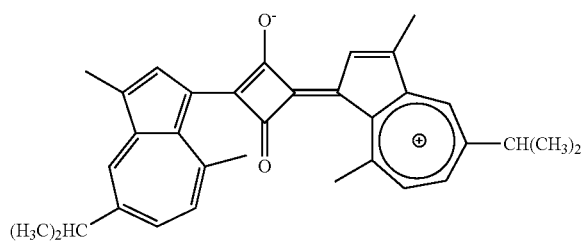

IRN-1

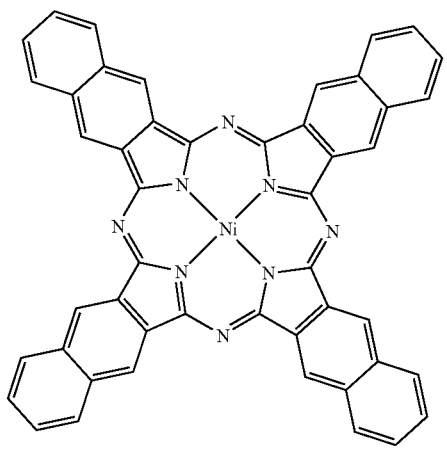

IRN-2

-continued

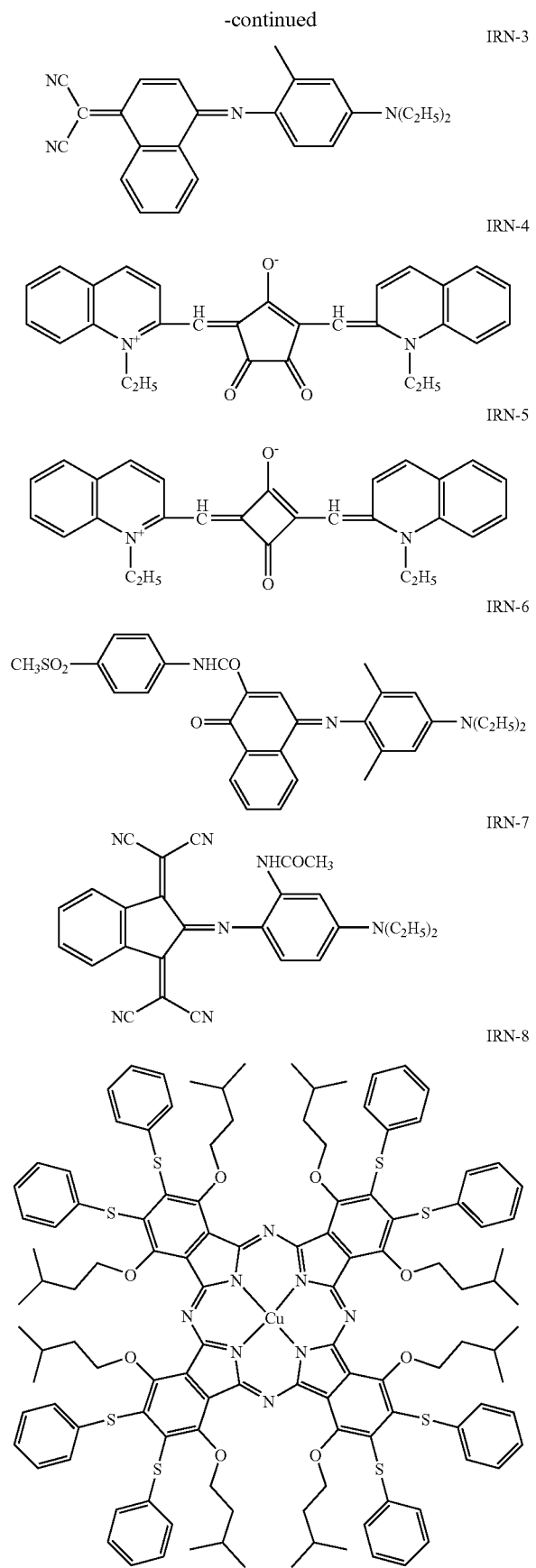

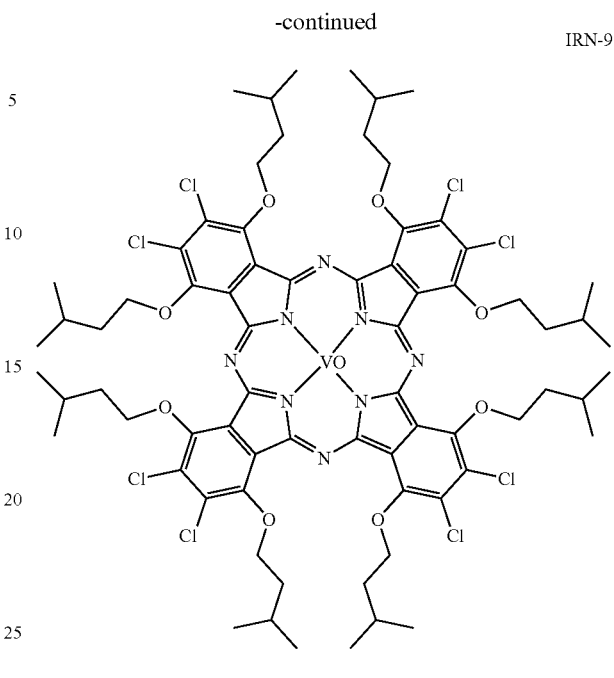

Among the above-cited compounds, as the particularly preferable anionic infrared absorbing agent, IRA-1, as the cationic infrared absorbing agent, IRC-7, IRC-30, IRC-40 and IRC-42, and as the non-ionic infrared absorbing agent, IRN-9 can be cited.

<Pigment>

Pigments used in the invention include commercially available pigments and pigments described in Nihon Ganryou Gijutsu Kyoukai, ed., *Color index (C.I.) binran* (*Color index handbook*), *Saishin ganryou binran* (*Handbook of modern pigments*), 1977, *Saishin ganryou ouyou gijutsu* (*Modern technology of application of pigments*), CMC, 1986, and *Insatsu inki gijutsu* (*Printing ink technology*), CMC, 1984.

As kinds of the pigments, a black pigment, yellow pigment, orange pigment, brown pigment, red pigment, violet pigment, blue pigment, green pigment, fluorescent pigment, metal powder pigment, and additionally, polymer bonding pigments can be cited. Specific examples thereof include an insoluble azo pigment, azolake pigment, condensed azo pigment, chelate azo pigment, phthalocyanine-based pigment, anthraquinone-based pigment, perylene and perynone-based pigment, thioindigo-based pigment, quinacridone-based pigment, dioxazine-based pigment, isoindolinone-based pigment, quinophthalone-based pigment, lake pigment, azine pigment, nitroso pigment, nitro pigment, natural pigment, fluorescent pigment, inorganic pigment and carbon black. Of these pigments, carbon black is preferable.

These pigments may be used without or with surface treatment applied. As the surface treatment method, a method of coating a resin or wax on a surface, a method of adhering a surfactant, a method of bonding a reactive substance (for example, a silane coupling agent, epoxy compound, polyisocyanate and the like) on the pigment surface, and the like can be considered. The above-mentioned surface treatment methods are described in *Kinzoku Sekken no seishitsu to ouyou* (*Properties and application of metallic soap*), Saiwai Shobou, *Insatsu inki gijutsu* (*Printing ink technology*), CMC, 1984, and *Saishin ganryou ouyou gijutsu* (*Modern technology of application of pigments*) CMC, 1986.

The particle diameter of the pigment is preferably in the range of from 0.01 to 10 μm, more preferably from 0.05 to 1 μm, and particularly preferably from 0.1 to 1 μm. When the particle diameter of the pigment is less than 0.01 μm, the stability of a material dispersed in an image-recording layer coating solution becomes unpreferable, and when the particle diameter is larger than 10 μm, uniformity of the image-recording layer becomes unpreferable.

As a method of dispersing the pigment, known dispersing technologies used to produce ink, toner and the like can be used. Examples of the dispersing machine include an ultrasonic disperser, sand mill, attriter, pearl mill, super mill, ball mill, impeller, disperser, KD mill, colloid mill, dynatron, three roll mill, and press kneader. The details thereof are described in *Saishin Ganryou Ouyou Gijutsu* (*Modern Technology of Application of Pigments*) CMC, 1986.

A sensitizing dye added to accelerate the curing reaction of the resin composition and thermo/photosensitive composition recited in the invention may be directly added in the composition together with other components. However, the sensitizing dye may be added in a separate layer provided adjacent to the layer comprising other components. In the latter case, the same effect can be obtained as the former case.

In particular, when the resin composition and thermo/photosensitive composition recited in the invention are used in a negative image-recording layer of a planographic printing plate precursor described later, the sensitizing dye can be added to the image-recording layer, or to another layer provided separately from the image-recording layer. However, when the negative image-recording material is prepared, the optical density at the absorption maximum in the range of wavelength of from 300 to 1200 nm of the recording layer is preferably in the range of from 0.1 to 3.0. When deviating from the range, the sensitivity tends to become lower. Since the optical density is determined depending on an amount of the sensitizing dye added and a thickness of the recording layer, a predetermined optical density can be obtained by controlling the both conditions. The optical density of a recording layer can be measured by an ordinary method. As a measurement method, a method in which, for instance, on a transparent or white support, a recording layer having a thickness appropriately determined in the range that the planographic printing plate requires as the dry coating amount is formed, and measurement is carried out with a transmission optical densitometer, and a method in which a recording layer is formed on a reflective support such as aluminum, and the reflection density is measured can be cited.

[(D) and (D') Radical Polymerizing Compound]

In the resin composition and thermo/photosensitive composition recited in the invention, in order to improve the sensitivity and film forming property, a radical polymerizing compound can be used together. The radical polymerizing compound that can be used together is a radical polymerizing compound that has at least one ethylenic unsaturated double bond, and is selected from compounds that have at least one, preferably two or more, terminal ethylenic unsaturated bond. Such compound groups are widely known in the relevant industrial field, and, in the invention, these can be used without particular restriction. These have chemical forms such as, for instance, monomer, prepolymer, namely, dimmer, trimer and oligomer, or mixtures thereof and copolymers thereof.

Examples of monomers and copolymers thereof include unsaturated carboxylic acids (for instance, acrylic acid, methacrylic acid, itaconic acid, crotonic acid, isocrotonic acid, maleic acid and so on), and esters and amides thereof, and, preferably, esters of unsaturated carboxylic acids and aliphatic polyalcohol compounds and amides of unsaturated carboxylic acids and aliphatic polyamine compounds can be used. Furthermore, addition reaction products of unsaturated carboxylic acid esters or amides both having a nucleophilic substituent such as a hydroxyl group, amino group, and mercapto group with mono- or poly-functional isocyanates or epoxys, and dehydration condensation reaction products of unsaturated carboxylic acid esters or amides both having a nucleophilic substituent such as a hydroxyl group, amino group, and mercapto group with mono- or poly-functional carboxylic acids also can be preferably used.

Furthermore, addition reaction products between unsaturated carboxylic acid esters or amides both having an electrophilic group such as an isocyanate group or epoxy group, and mono- or poly-functional alcohols, amines, or thiols, and furthermore substitution reaction products between unsaturated carboxylic acid esters or amide both having an eliminative substituent such as a halogen group, and tosyloxy group and mono- or poly-functional alcohols, amines or thiols are also preferable. Still furthermore, as another example, a group of compounds obtained by changing the unsaturated carboxylic acid in the above examples to unsaturated phosphonic acid, styrene and the like can also be used.

As specific examples of the radical polymerizing compound that is an ester between an aliphatic polyalcohol compound and an unsaturated carboxylic acid, the acrylic acid esters can be cited such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and a polyester acrylate oligomer.

The methacrylic acid esters can be cited such as, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane.

The itaconic acid esters can be cited such as, ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

The crotonic acid esters include, for example, ethylene glycol dicrotonate, tetramethylene glycol dicrotonate, pentaerythritol dicrotonate, and sorbitol tetracrotonate.

The isocrotonic acid esters can be cited such as, ethylene glycol diisocrotonate, pentaerythritol diisocrotonate, and sorbitol tetraisocrotonate.

The maleic acid esters can be cited such as, ethylene glycol dimaleate, triethylene glycol dimaleate, pentaerythritol dimaleate, and sorbitol tetramaleate.

As examples of other esters, aliphatic alcohol-based esters described in, for instance, JP-B Nos. 46-27926 and 51-47334, and JP-A No. 57-196231, those having an aromatic skeleton described in JP-A Nos. 59-5240, 59-5241, and 2-226149, and those containing an amino group set forth in JP-A No. 1-165613 also can be preferably used.

Furthermore, specific examples of monomer of amide between an aliphatic polyvalent amine compound and an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide.

Other preferred examples of the amide-based monomer include those having a cyclohexylene structure described in JP-B No. 54-21726.

Furthermore, a urethane-based addition polymerizable compound produced using an addition reaction between an isocyanate and a hydroxyl group is also preferably used, and specific examples thereof include vinylurethane compounds having two or more polymerizing vinyl groups within one molecule that is obtained by adding a vinyl monomer containing a hydroxyl group represented by the following general formula (32) to a polyisocyanate compound having two or more isocyanate groups within one molecule, described in JP-B No. 48-41708.

$$CH_2=C(R^{83})COOCH_2CH(R^{84})OH \qquad \text{General formula (32)}$$

In the general formula (32), $R^{83}$ and $R^{84}$ each independently represent a hydrogen atom or methyl group.

Furthermore, urethane acrylates described in JP-A No. 51-37193, JP-B Nos. 2-32293 and 2-16765, and urethane compounds having an ethylene oxide-based skeleton described in JP-B Nos. 58-49860, 56-17654, 62-39417 and 62-39418 may be preferably used.

Furthermore, radical polymerizing compounds having an amino structure or a sulfide structure within the molecule, described in JP-A Nos. 63-277653, 63-260909 and 1-105238, may be used.

Other examples include polyfunctional acrylates and methacrylates such as polyester acrylates and epoxy acrylates obtained by reacting an epoxy resin with a (meth)acrylic acid, described in JP-A No. 48-64183, and JP-B Nos. 49-43191 and 52-30490. Furthermore, specific unsaturated compounds described in JP-B Nos. 46-43946, 1-40337 and 1-40336, and vinylphosphonic acid-based compounds described in JP-A No. 2-25493 can be also cited. Still furthermore, in some cases, the structure containing a perfluoroalkyl group set forth in JP-A No. 61-22048 can be preferably used. Also, those described as a photocurable monomer and oligomer in Nippon Secchaku Kyokai Shi (Journal of Japan Adhesion Society), Vol. 20, No. 7, pp. 300-308 (1984) can be used.

The radical-polymerizing compounds can be used singly or in combinations of two or more kinds. Details of the use method of the radical-polymerizing compound, such as selection of the structure, whether used singly or in combination, and amount added, can be freely selected in accordance with the designed performance of the final resin composition and thermo/photosensitive composition.

However, when the resin composition and thermo/photosensitive composition according to the invention are used as a recording layer of a planographic printing plate precursor, a larger blending ratio of the radical-polymerizing compound in the resin composition and thermo/photosensitive composition is advantageous in view of the sensitivity; however, when the blending ratio is too large, undesirable phase separation may be caused, a problem may arise in the production step due to adhesive property of the recording layer (e.g., production failure caused by transfer or adhesion of the recording layer components), and a problem of precipitation in the developer may be caused. In view of these points, the preferable blending ratio of the radical-polymerizing compound is in most cases in the range of from 5 to 80% by mass, and more preferably from 20 to 75% by mass, based on all components of the composition.

In particular, in the invention, when the (A) specific alkali-soluble polymer A and (D) radical-polymerizing compound are used together, or the (A) specific alkali-soluble polymer A' and (D') radical-polymerizing compound are used together, a ratio of the (A) component to the (D) component and that of the (A') component to the (D) component are in the range of from 1:0.05 to 1:3 by mass ratio, preferably from 1:0.1 to 1:2, and more preferably from 1:0.3 to 1:1.5.

As for the use method of the radical-polymerizing compound, appropriate structure, blending and amount added can be freely selected by taking account of the degree of polymerization inhibition by oxygen, resolution, fogging, change in refractive index, surface adhesion property and the like. Depending on the case, a layer construction and a coating method, such as undercoat and overcoat, can also be employed.

Thus obtained resin composition recited in the invention and thermo/photosensitive composition recited in the invention are excellent in the film forming property, film strength and shelf-stability, and, in particular, can be preferably used as the recording layer of a negative planographic printing plate precursor.

[Application to Planographic Printing Plate Precursor]

When the resin composition and thermo/photosensitive composition recited in the invention are used as a recording layer of the planographic printing plate precursor, the resin composition or thermo/photosensitive composition is dissolved in a solvent and coated on an appropriate support, and thereby the recording layer can be produced. Furthermore, according to objects, various kinds of additives, protective layers, resin intermediate layers and back coat layers described below can be formed in a similar way.

In the resin composition and thermo/photosensitive composition according to the invention, a dye having a large absorption in the visible light region can be used as a coloring agent of an image. Specifically, Oil Yellow #101, Oil yellow #103, Oil pink #312, Oil Green BG, Oil Blue BOS, Oil Blue #603, Oil Black BY, Oil Black BS, Oil Black T-505 (these are manufactured by Orient Chemical Industries, Ltd.), Victoria Pure Blue, Crystal Violet (CI 42555), Methyl Violet (CI 42535), Ethyl Violet, Rhodamine B (CI 145170B), Malachite Green (CI 42000), Methylene Blue (CI 52015), and dyes described in JP-A No. 62-293247 can be cited. Furthermore, pigments such as a phthalocyanine-based pigment, azo pigment, carbon black or titanium oxide can be preferably used.

Since these coloring agents give, after an image is formed, a clear distinction between an image area and a non-image area, they are preferably added. The amount of coloring agent added is preferably from 0.01 to 10% by mass based on the total solid componentss in a recording layer coating solution.

Furthermore, in the present invention, a small amount of a thermal polymerization inhibitor is preferably added so as to inhibit the radical-polymerizing compound from unnecessarily thermally polymerizing during the manufacture or storage of the resin composition and thermo/photosensitive composition. Examples of suitable thermal polymerization inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and N-nitroso-N- phenylhydroxyamine aluminum salt. The amount of the thermal polymerization inhibitor added is preferably in the range of approximately from 0.01 to substantially 5% by mass, based on the mass of the entire composition. Furthermore, optionally, in order to prevent polymerization inhibition by oxygen from occurring, a higher fatty acid derivative such as behenic acid or behenic acid amide may be added and allowed to localize on the recording layer surface during the drying step after the coating. The amount of the higher fatty acid derivative to be added is preferably in the range of approximately from 0.1 to 10% by mass based on the entire composition.

Still furthermore, the resin composition and thermo/photosensitive composition according to the invention are mainly used in forming a recording layer of the planographic printing plate precursor. In order to extend the stability of the processing of such recording layer to development conditions, a non-ionic surfactant such as set forth in JP-A Nos. 62-251740 and 3-208514, or an amphoteric surfactant such as set forth in JP-A Nos. 59-121044 and 4-13149 can be added.

Specific examples of the non-ionic surfactant include sorbitan tristearate, sorbitan monopalmitate, sorbitan trioleate, stearic acid monoglyceride, and polyoxyethylene nonylphenyl ether.

Specific examples of the amphoteric surfactant include alkyldi(aminoethyl)glycine, alkylpolyaminoethyl glycine hydrochloride, 2-alkyl-N-carboxyethyl-N-hydroxyethyl imidazolium betaine, and N-tetradecyl-N,N-betaine type surfactants (for example, Amogen K (trade name), made by Dai-ichi Kogyo Co.).

The proportion of the non-ionic and amphoteric surfactants in the recording layer coating solution are preferably in the range of from 0.05 to 15% by mass, and more preferably from 0.1 to 5% by mass.

Furthermore, in the recording layer coating solution according to the invention, optionally, a plasticizer is added to give flexibility to the film. For instance, polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate can be used.

In order to produce a planographic printing plate precursor by use of the resin composition and thermo/photosensitive composition recited in the invention, normally, constituents of the resin composition and thermo/photosensitive composition are dissolved in a solvent together with necessary respective components and coated on an appropriate support. Solvents that can be used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxy ethane, methyl lactate, ethyl lactate, N,N-dimethyl acetamide, N,N-dimethylformamide, tetramethyl urea, N-methyl pyrrolidone, dimethylsulfoxide, sulfolane, γ-butyrolactone, toluene, and water, but are not restricted thereto. These solvents can be used singly or in combination. The concentration of the above components (whole solid componentss including additives) in the solvent is preferably in the range of 1 to 50% by mass.

Furthermore, a coating amount (solid components) of the recording layer on the support obtained after the coating and drying, though varying depending on applications, is preferably in the range of from 0.5 to 5.0 g/m$^2$ in general for the planographic printing plate precursor. The smaller the coating amount becomes, the larger the apparent sensitivity is. However, the coating characteristics of the recording layer deteriorate.

As the coating method, various methods can be applied. These methods include, for instance, bar-coater coating, rotary coating, spray coating, curtain coating, dip coating, air-knife coating, blade coating and roll coating.

In the recording layer coating solution according to the invention, in order to improve the coating properties, a surfactant, for instance, a fluorine-type surfactant such as set forth in JP-A No. 62-170950 can be added. A preferable amount to be added is in the range of from 0.01 to 1% by mass in the solid components of the entire recording layer, and more preferably from 0.05 to 0.5% by mass.

(Support)

As the support used when the planographic printing plate precursor is formed with the resin composition and thermo/photosensitive composition recited in the invention, there is no particular restriction on the support as long as it is a planar substance stable in dimension. For instance, paper, paper laminated with plastic (for instance, polyethylene, polypropylene, polystyrene and the like), metal plate (for instance, aluminum, zinc, copper and the like), plastic film (for instance, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal and the like) can be cited. These may be made of a sheet of a single component such as a resin film and a metal plate or may be a laminated body of two or more materials. For instance, paper or plastic film on which such metal as mentioned above is laminated or vapor deposited, laminated sheet of different kinds of plastic films and the like are included.

As the support, the polyester film or aluminum plate is preferable, and, among these, the aluminum plate that is stable in the dimension and relatively less expensive is particularly preferable. A preferable aluminum plate is a pure aluminum plate and an alloy plate that is mainly made of aluminum and slightly contains foreign elements, and furthermore a plastic film on which aluminum is laminated or vapor deposited is also preferable. The foreign elements contained in the aluminum alloy include silicon, iron, manganese, copper, magnesium, chromium, zinc, bismuth, nickel, titanium and the like. A content of the foreign elements in the alloy is at most 10% by mass or less. Particularly preferable aluminum in the invention is pure aluminum. However, since completely pure aluminum is very difficult to produce from a viewpoint of smelting technology, one that contains foreign elements slightly can be allowed. Thus, the composition of the aluminum plate that is applied to the invention is not particularly specified, but aluminum plates so far known as a material, can be appropriately utilized.

A thickness of the aluminum plate is approximately in the range of from 0.1 to 0.6 mm, preferably from 0.15 to 0.4 mm, and particularly preferably from 0.2 to 0.3 mm.

Prior to roughening a surface of the aluminum plate, according to request, in order to remove rolling oil on the surface, degreasing treatment with, for instance, a surfactant, organic solvent or alkali aqueous solution is performed.

The roughening of the surface of the aluminum plate can be performed according to various methods. For instance, a method of mechanically roughening a surface, a method of electrochemically dissolving and roughening a surface, and a method of chemically selectively dissolving a surface can be applied. As the mechanical method, known methods such as ball polishing, brush polishing, blast polishing and buff polishing method can be used. Furthermore, as the electrochemical roughening method, there is a method in which an alternating current or direct current is passed in a hydrochloric acid or nitric acid electrolytic solution. As disclosed in JP-A No. 54-63902, both of these surface-roughening methods may be used in combination.

On thus surface-roughened aluminum plate, optionally, after subjected to alkali etching and neutralizing, in order to improve water retention and wear-resistance of the surface, anodic oxidation can be applied. As an electrolyte that can be used in the anodic oxidation of the aluminum plate, various electrolytes that can form a porous oxide film can be used. In general, sulfuric acid, phosphoric acid, oxalic acid, chromic acid or mixed acids thereof can be used. A concentration of the electrolyte can be appropriately determined according to the kind of the electrolyte.

The treatment conditions of the anodic oxidation cannot be uniquely specified because the conditions can vary according to the electrolyte used; however, generally, the conditions are suitable when a concentration of the electrolyte is in the range of 1 to 80% by mass in the solution; a liquid temperature of 5 to 70° C.; a current density of 5 to 60 A/dm$^2$; a voltage of 1 to 100 V; and an electrolysis time period of 10 seconds to 5 minutes.

An amount of an anodic oxidation film is preferably 1.0 g/m$^2$ or more, and more preferably in the range of 2.0 to 6.0 g/m$^2$. When the anodic oxidation film is less than 1.0 g/m$^2$, the press life is insufficient, or a non-image area of the planographic printing plate tends to be scarred, resulting in so-called "scar stain" in which ink adheres scarred portion during printing.

Such anodic oxidation treatment is applied on a surface of the support of the planographic printing plate used for printing. However, owing to going round of line of electric force to the back, also on the back surface, an anodic oxidation film of from 0.01 to 3 g/m$^2$ is generally formed.

The treatment for imparting hydrophilicity to the support surface is applied after the anodic oxidation treatment; so far known treatment methods can be used. As such method for imparting hydrophilicity, there is an alkali metal silicate (for instance, aqueous solution of sodium silicate) method set forth in U.S. Pat. Nos. 2,714,066, 3,181,461, 3,280,734 and 3,902,734. In this method, the support is subjected to either immersion treatment or electrolytic treatment in an aqueous sodium silicate solution. Apart from this, a method of treating with potassium fluorozirconate disclosed in JP-B No. 36-22063, and a method of treating with polyvinyl phosphonic acid such as disclosed in U.S. Pat. Nos. 3,276,868, 4,153,461 and 4,689,272 may be employed.

Among these, a particularly preferable treatment for imparting hydrophilicity in the invention is a silicate treatment. The silicate treatment will be explained below.

The anodic oxidation film of the aluminum plate processed as mentioned above is immersed in an aqueous solution whose concentration of alkali metal silicate is in the range of 0.1 to 30% by mass, and preferably 0.5 to 10% by mass and pH is in the range of 10 to 13 mesured at 25° C., at a temperature in the range of, for instance, from 15 to 80° C. for 0.5 to 120 seconds. When the pH of the aqueous solution of alkali metal silicate is less than 10, the liquid becomes gelatinous; whereas when it is higher than 13.0, the oxide film is dissolved. As alkali metal silicates that is used in the invention, sodium silicate, potassium silicate, and lithium silicate can be cited. As a hydroxide that is used to increase the pH of the aqueous solution of alkali metal silicate, sodium hydroxide, potassium hydroxide and lithium hydroxide can be cited. In the treatment liquid, an alkali earth metal salt or a IVB group metal salt may be compounded. As the alkali earth metal salts, nitrates such as calcium nitrate, strontium nitrate, magnesium nitrate and barium nitrate, and water-soluble salts such as sulfates, chlorides, phosphates, acetates, oxalates and borates can be cited. As the IVB group metal salts, titanium tetrachloride, titanium trichloride, potassium titanium fluoride, potassium titanium oxalate, titanium sulfate, titanium tetraiodide, zirconium oxide chloride, zirconium dioxide, zirconium oxychloride and zirconium tetrachloride can be cited. The alkali earth metal salts or the IVB group metal salts can be used singly or in combinations of two or more thereof. A preferable content of these metal salts is in the range of 0.01 to 10% by mass, and more preferably 0.05 to 5.0% by mass.

Owing to the silicate treatment, the hydrophilicity of the surface of the aluminum plate is further improved; accordingly, in printing, it becomes difficult for the ink to adhere to the non-image area, resulting in an improvement in stain resistance.

(Backcoat Layer)

On a back surface of the support, optionally, a backcoat is disposed. As such backcoat, a coating layer made of a metal oxide that is obtained by hydrolyzing or condensation polymerizing organic polymer compounds set forth in JP-A No. 5-45885, or organic or inorganic metal compounds disclosed in JP-A No. 6-35174, can be preferably used.

Among these coating layers, alkoxy compounds of silicon such as $Si(OCH_3)_4$, $Si(OC_2H_5)_4$, $Si(OC_3H_7)_4$ and $Si(OC_4H_9)_4$ are less expensive and can be easily obtained, and the coating layers of the metal oxides obtained therefrom are excellent in the development resistance. Accordingly, these coating layers are particularly preferable.

(Protective Layer)

A general planographic printing plate precursor is, usually, exposed to light in air; accordingly, a protective layer can be further disposed on the recording layer. The characteristics desired for such protective layer are low permeability of low molecular weight compounds such as oxygen, enough transparency to light used for exposure, excellency in adhesion with the recording layer and easiness to remove in the development step after the exposure; accordingly, water-soluble polymer compounds that are relatively excellent in the crystallinity such as polyvinyl alcohol, polyvinyl pyrrolidone, acidic celluloses, gelatin, gum arabic, and polyacrylic acid are generally used.

On the other hand, the resin composition and thermo/photosensitive composition according to the invention have an advantage in that deterioration of the image forming property due to inhibition of polymerization by oxygen and the like can be suppressed from occurring; accordingly, the compositions may not be necessarily provided with the protective layer; however, in order to further improve the property of shielding extraneous oxygen and the image forming property, in particular, image strength, the protective layer may be provided.

(Exposure, Development and Printing)

A planographic printing plate precursor in which, on the support surface mentioned above, the resin composition or thermo/photosensitive composition recited in the invention are produced as a recording layer allows to be recorded by use of an infrared laser. Furthermore, thermal recording with a UV lamp or thermal head is also possible. In the present invention, images are preferably exposed with a solid-state laser or semiconductor laser that radiate infrared light in the wavelength range of from 760 to 1200 nm.

After the exposure with the infrared laser, the resin composition and thermo/photosensitive composition recited in the invention are preferably developed with water or an alkali aqueous solution.

When the alkali aqueous solution is used as a developing solution, as the developing solution and replenishing solution of the resin composition and thermo/photosensitive composition according to the invention, so far known alkali aqueous solutions can be used. Examples of alkali aqueous solution include inorganic alkaline salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, and lithium hydroxide can be cited. Furtheremore, organic alkaline chemicals such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine can also be used.

These alkali agents can be used singly or in combination of two or more kinds thereof.

Furthermore, it is known that in the case of the development being performed with an automatic processor, when a solution that is the same as the developing solution or an aqueous solution (replenishing solution) higher in the alkalinity than the developing solution is added to the developing solution, without replacing the developing solution in the developing tank for a long time, a lot of planographic printing plate precursors can be processed. Also in the invention, the replenishing method can be preferably applied.

In the developing solution and replenishing solution, in order to accelerate or suppress the developability and to improve the dispersion of developing scum and ink-affinity of an image area of a printing plate, optionally, various kinds of surfactants and organic solvents can be added. As preferred surfactants, there can be cited anionic, cationic, nonionic, and amphoteric surfactants. As preferred organic solvents, benzyl alcohol and the like can be cited. Furthermore, polyethylene glycol or a derivative thereof, or polypropylene glycol or a derivative thereof is preferably added. Furthermore, non-reducing sugars such as arabitol, sorbitol and mannitol can be also added.

Furthermore, to the developing solution and the replenishing solution, optionally, hydroquinone, resource, inorganic salt-based reducing agents such as sodium salts or potassium salts of sulfurous acid and hydrogensulfurous acid and, further, organic carboxylic acids, defoaming agents, and water softeners can be added.

The printing plate developed with the above-mentioned developing solution and replenishing solution undergoes the post treatment with a rinse solution containing wash water and a surfactant, and a desensitizing solution containing gum Arabic and a starch derivative. As the post treatment when the resin composition according to the invention is used as a printing plate material, these treatments can be variously combined and used.

Recently, in the field of plate making and printing, in order to rationalize and standardize plate making operations, automatic processors for use in printing plate materials are widely used. The automatic processor that is generally made of a developing portion and a post treatment portion comprises a unit that transfers the printing plate material, various treatment solution tanks and a spray unit. In the automatic processor, while horizontally transferring the exposed printing plate, each of the treatment solutions pumped with a pump is sprayed from a spray nozzle and thereby development is performed. Furthermore, in recent years, a method is known in which a printing plate material is immersed and transferred by use of an in-liquid guide roll and the like into a treatment solution tank that is filled with the treatment solution and thereby the treatment is performed. In such automatic processing, the treatments can be carried out while each treating solution being replenished with the each replenishing solution according to a treated amount and running time. Furthermore, the replenishing can be automatically conducted by detecting the electric conductivity with a sensor.

Still furthermore, a so-called disposable treatment method in which the material is treated with practically unused treatment solution can be also applied.

Thus obtained planographic printing plate is, optionally, coated with desensitizing gum, and thereafter, supplied to the printing step; however, when a planographic printing plate having higher press life is desired, the baking treatment is applied.

When the planographic printing plate is baked, it is preferably treated prior to the baking with the surface conditioner as disclosed in JP-B Nos. 61-2518 and 55-28062 and JP-A Nos. 62-31859 and 61-159655.

As the method thereof, a method of coating the surface conditioner on the lithographic printing plate with a sponge or absorbent cotton impregnated with the solution, a method of dipping the printing plate in a vat filled with the surface conditioner and thereby coating the solution, or a method of coating the solution with an automatic coater may be used. Furthermore, after the coating, the amount of surface conditioner coated is preferably rendered uniform using a squeegee or a squeezing roller. By doing so, more advantageous results can be obtained.

In general, the amount of surface conditioner coated is suitably from 0.03 to 0.8 $g/m^2$ (dry mass).

After the planographic printing plate coated with the surface conditioner is, optionally, dried, then it is heated to a high temperature by a baking processor (for example, a baking processor "BP-1300", available from Fuji Photo Film Co., Ltd.) and the like. At this time, a heating temperature and a heating time period are preferably from 180 to 300° C. and from 1 to 20 minutes, respectively, though it may vary depending on the kind of components that constitute the image.

The baked lithographic printing plate may be appropriately subjected to, depending on the necessity, conventional treatments such as water washing and gumming. However, in the case of a surface conditioner containing a water-soluble polymer compound or the like being used, a so-called desensitization treatment such as gumming may be omitted.

The lithographic printing plate obtained through these treatments from the resin composition or thermo/photosensitive composition recited in the invention is mounted on an off-set printer or the like and used for printing a large number of prints.

EXAMPLES

In the following, the present invention will be explained in detail with reference to examples; however, the invention is not restricted by the examples. In the examples of the invention, a planographic printing plate in which the resin composition or thermo/photosensitive composition according to the invention are used as a recording layer is evaluated, the evaluation is taken as the evaluation of the resin composition or thermo/photosensitive composition according to the invention.

Examples 1 Through 3, Comparative Example 1

[Preparation of Support]

A molten metal of JIS A1050 alloy that contains 99.5% or more of aluminum, 0.30% of Fe, 0.10% of Si, 0.02% of Ti and 0.013% of Cu was subjected to a cleaning treatment followed by casting. In the cleaning treatment, a degassing treatment was applied to remove unnecessary gases such as hydrogen and the like in the molten metal followed by filtering with a ceramic tube. The casting method was a DC casting method. A surface of a solidified ingot having a thickness of 500 mm was faced by 10 mm, and, in order to suppress an intermetallic compound from growing, a homogenizing treatment was applied at 550° C. for 10 hr.

In the next place, hot rolling was applied at 400° C., annealing was applied at 500° C. for 60 seconds in a continuous annealing furnace followed by cold rolling, and thereby an aluminum rolled sheet having a thickness of 0.30 mm was prepared. By controlling the roughness of the rolling roll, the centerline mean surface roughness Ra after the cold rolling was adjusted to 0.2 μm. Thereafter, the rolled sheet was subjected to a tension leveler so as to improve the planarity.

Then, surface treatment was applied to form a planographic printing plate support.

Firstly, in order to remove rolling mill oil on the surface of the aluminum plate, degreasing treatment was performed at 50° C. for 30 seconds with a 10% sodium aluminate aqueous solution, and a neutralizing and desmutting treatment was performed at 50° C. for 30 seconds with a 30% sulfuric acid aqueous solution.

Subsequently, in order to improve the adhesion of a photosensitive layer with the support and to endow a non-image area with the water retainability, the surface of the support was roughened, that is, grained. With an aqueous solution containing 1% nitric acid and 0.5% aluminum nitrate maintained at 45° C. and an aluminum web transmitting in the aqueous solution, from an indirect power supply cell, in an alternating wave form of a current density of 20 A/dm² and a duty ratio of 1:1, an amount of electricity of 240 C/dm² was supplied to an anode side, and thereby electrolytic graining was performed. Thereafter, with 10% sodium aluminate aqueous solution, the etching was applied at 50° C. for 30 seconds followed by neutralizing and desmutting treatment with 30% sulfuric acid aqueous solution at 50° C. for 30 seconds.

Furthermore, in order to improve the wear resistance, chemical resistance and water retainability, an oxide film was formed on the support by an anodic oxidation. A 20% sulfuric acid solution was used as an electrolyte at 35° C.; with an aluminum web transmitting in the electrolyte, from an indirect current supply cell, a direct current of 14 A/dm² was supplied and thereby electrolytic treatment was performed; and thereby an anodic oxidation film of 2.5 g/m² was formed.

[Formation of Recording Layer]

The following recording layer coating solution 1 was prepared, coated with a wire-bar on the aluminum supports obtained as mentioned above, dried at 115° C. for 45 seconds by use of a hot air dryer to form a recording layers, and thereby planographic printing plate precursors 1 were obtained. A coating amount after drying was in the range of from 1.2 to 1.3 g/m².

<Recording Layer Coating Solution 1>

Alkali-soluble polymer: (A) component (the compound described in Table 12 and the amount described in Table 12)

Radical-polymerizing compound: (D) component (the compound described in Table 12 and the amount described in Table 12)

| | |
|---|---:|
| Infrared absorbing agent "IR-1": (C) component | 0.10 g |
| Radical generating agent "S-1": (B) component | 0.30 g |
| Naphthalene sulfonic acid salt of Victoria Pure Blue | 0.04 g |
| Fluorine-type surfactant (Megafax F-176 available from Dainihon Ink & Chemical Industries Co.) | 0.01 g |
| Methyl ethyl ketone | 9.0 g |
| Methanol | 10.0 g |
| 1-Methoxy-2-propanol | 8.0 g |

The alkali-soluble polymer used in the example is the above-illustrated specific alkali-soluble polymer A recited in the invention. Furthermore, structures of the alkali-soluble polymers (P-1) and (P-2) used in the comparative example are shown below.

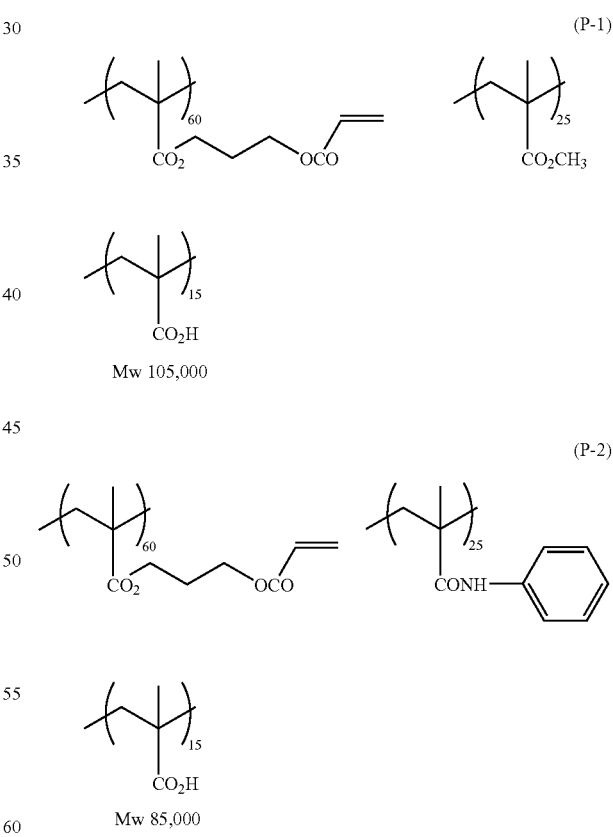

Subsequently, structures of the radical initiators (S-1) through (S-5), the infrared absorbing agents (IR-1) through (IR-3), and radical polymerizing compounds (DPHA), (M-1), and (M-2) all used in the example or the comparative example are shown below.

121                                                                 122
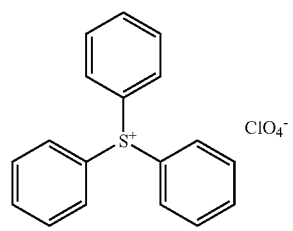
(S-1)
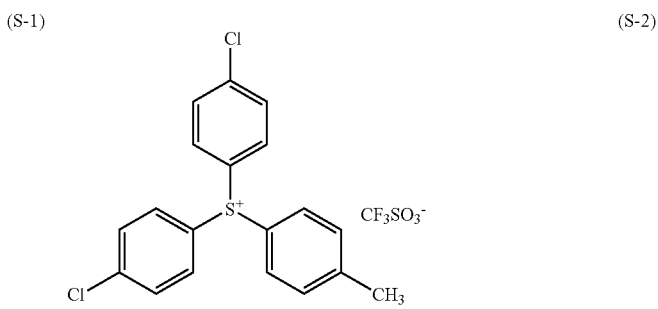
(S-2)
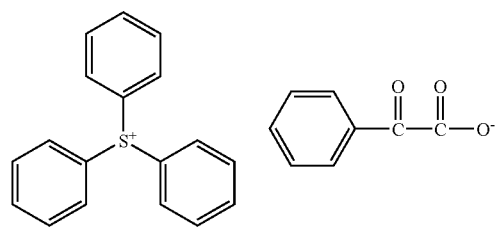
(S-3)
(S-4)
(S-5)
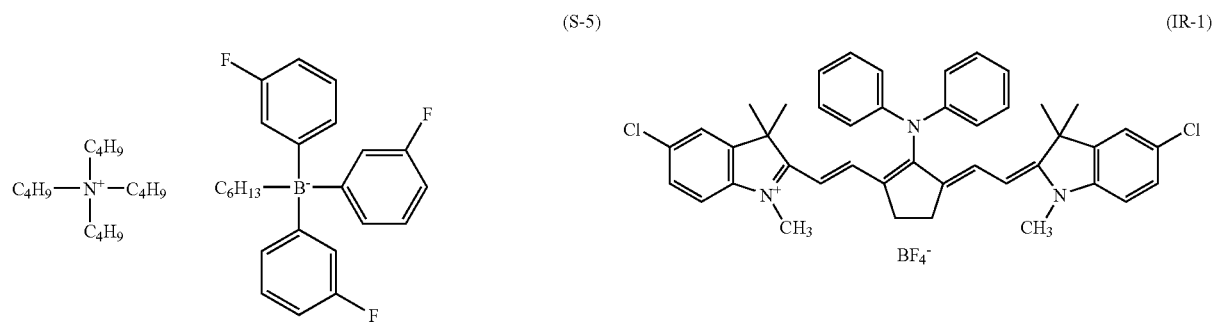
(IR-1)
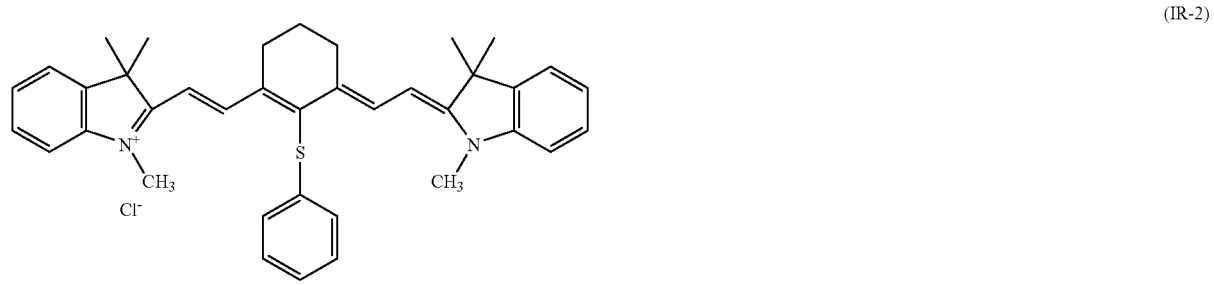
(IR-2)

-continued

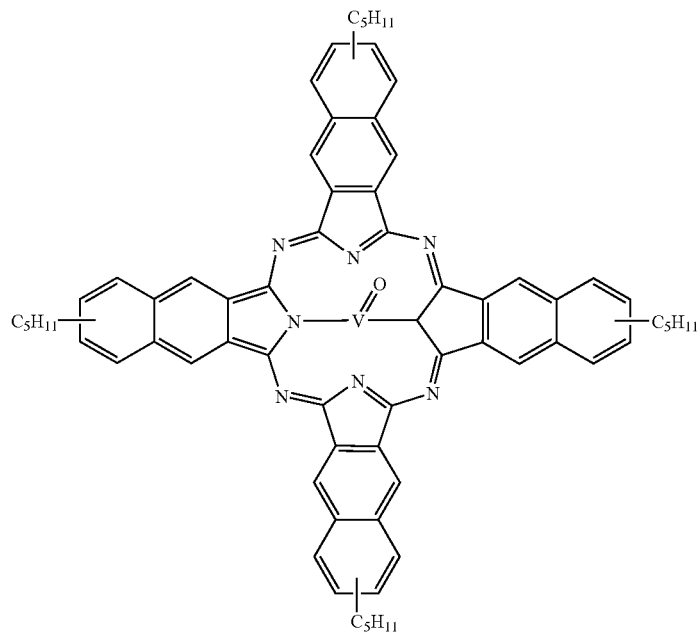

(IR-3)

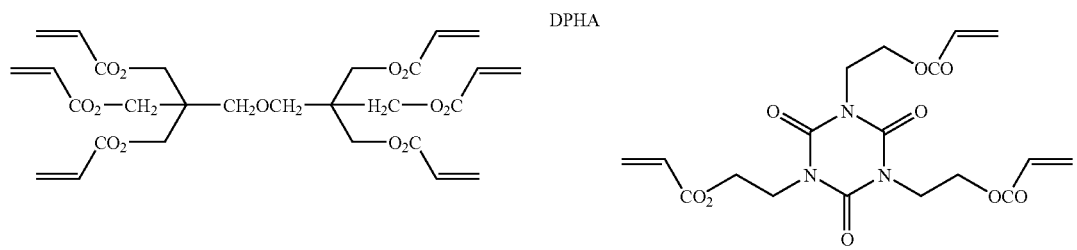

DPHA (M-1)

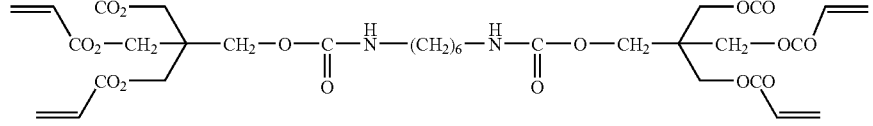

(M-2)

[Exposure]

The obtained negative type planographic printing plate precursors 1 were exposed, by use of Creo Trendsetter 3244VFS equipped with a water-cooled 40 W infrared semiconductor laser, under the conditions in which an output was 9 W, an exterior surface drum revolution number was 210 rpm, a plate surface energy was 100 mJ/cm$^2$ and a resolution was 2400 dpi.

[Development]

After the exposure, with an automatic processor Stablon 900N manufactured by Fuji Photo Film Co., Ltd., the development was performed, and thereby planographic printing plates 1 were obtained.

As the developing solution, for both of a charge solution and replenishing solution, a solution of DV-2 (manufactured by Fuji Photo Film Co., Ltd.) diluted with water (DV-2: water=1:4) was used. A developing bath was set at a temperature of 30° C. Furthermore, as a finisher, a solution of FN-6 (manufactured by Fuji Photo Film Co., Ltd.) diluted with water (FN-6:water=1:1)(pH=10.8) was used.

[Evaluation of Press Life, Stain Resistance of Non-Image Area and Shelf-Stability]

In the next place, the obtained planographic printing plates 1 were subjected to printing by use of a printer Lithrone manufactured by Komori Corporation. At this time, how many sheets can be printed with a sufficient ink concentration and whether there is stain on the non-image area or not were measured by eye inspection, and thereby the press life and stain resistance were evaluated.

Furthermore, the obtained planographic printing plate precursors 1 were stored for three days at 60° C. or at 45° C., 75% RH for three days, respectively, thereby the change with the passage of time was accelerated, and thereafter the printing was similarly carried out. Subsequently, similarly to the above, the press life and the stain resistance on the non-image area were measured, and thereby the shelf-stability was evaluated. Results are shown together in Table 12.

TABLE 12

|  | Alkali-soluble polymer (content) | Radical-polymerizing compound (content) | Press life/Stain resistance of non-image area | | |
| --- | --- | --- | --- | --- | --- |
|  |  |  | No accelerated time passage | 60° C., 3 days | 45° C., 75% RH, 3 days |
| Example 1 | Polymer compound 1, 2.0 g | None | 55,000 sheets, no stain | 55,000 sheets, no stain | 55,000 sheets, no stain |
| Example 2 | Polymer compound 2, 1.0 g | DPHA, 1.0 g | 63,000 sheets, no stain | 63,000 sheets, no stain | 63,000 sheets, no stain |
| Example 3 | Polymer compound 4, 1.0 g | DPHA, 1.0 g | 63,000 sheets, no stain | 63,000 sheets, no stain | 63,000 sheets, no stain |
| Comparative Example 1 | P-1, 1.0 g | DPHA, 1.0 g | 35,000 sheets, no stain | 18,000 sheets, stain | 15,000 sheets, stain |

As is obvious from Table 12, the planographic printing plates 1 of Examples 1 through 3 in which the specific alkali-soluble polymer A recited in the invention was used were confirmed to be excellent in the press life, in comparison with the planographic printing plate 1 of Comparative Example 1 in which an alkali-soluble polymer outside of the range of the invention was used.

Furthermore, it was found that even after storing under a high temperature and high humidity environment, in the planographic printing plates 1 of Examples 1 through 3, the press life and stain resistance of the non-image area did not deteriorate, that is, the shelf-stability was excellent.

Examples 4 Through 6, Comparative Example 2

[Formation of Undercoat Layer]

On the aluminum supports similar to that in Examples 1 through 3, an undercoat solution shown below were coated with a wire bar, and dried, with a hot air dryer, at 90° C. for 30 seconds. A dry coating amount was 10 mg/m².

<Undercoating Solution>

| | |
| --- | --- |
| A copolymer of ethyl methacrylate and sodium 2-acrylamide-2-methyl-1-propane sulfonate with a molar ratio of 75:15 | 0.1 g |
| 2-Aminoethyl phosphonic acid | 0.1 g |
| Methanol | 50 g |
| Ion-exchanged water | 50 g |

[Formation of Recording Layer]

In the next place, the following recording layer coating solution 2 was prepared, coated on the undercoated aluminum plates with a wire bar, dried, with a hot air dryer, at 115° C. for 45 seconds, and thereby negative type planographic printing plate precursors 2 were obtained. A dry coating amount was 1.3 g/m². The reflection concentrations of the recording layers of the planographic printing plate precursors 2 at an absorption maximum in the infrared region was measured and found that all were in the range of from 0.6 to 1.2.

<Recording Layer Coating Solution 2>

Alkali-soluble polymer: (A) component (the compound described in Table 13 and the amount described in Table 13)

| | |
| --- | --- |
| IR absorber "IR-1": (C) component | 0.10 g |
| Radical generator "S-1": (B) component | 0.35 g |
| Dipentaerithritol hexaacrylate: (D) component | 1.00 g |
| Naphthalene sulfonic acid salt of Victoria Pure Blue | 0.04 g |
| Fluorine-type surfactant (Megafac F-176, made by Dainippon Ink & Chemicals Inc.) | 0.01 g |
| Methyl ethyl ketone | 9.0 g |
| Methanol | 10.0 g |
| 1-Methoxy-2-propanol | 8.0 g |

[Exposure and Development]

To the obtained negative type planographic printing plate precursors 2, similarly to Examples 1 through 3, the infrared laser exposure and development were applied, and thereby planographic plates 2 were obtained.

[Evaluation of the Press Life, Stain Resistance and Shelf-stability]

The obtained planographic printing plates 2 were subjected to the printing similarly to Examples 1 through 3, and further evaluated similarly. Results are together shown in Table 13.

As obvious from Table 13, it was confirmed that the planographic printing plates 2 of Examples 4 through 6 in which the specific alkali-soluble polymer A recited in the invention was used were excellent in the press life, in comparison with the planographic printing plate 2 of Comparative Example 2 in which an alkali-soluble polymer outside of the range of the invention was used.

Furthermore, it was found that even after storing under a high temperature and high humidity environment, in the planographic printing plates 2 of Examples 4 through 6, the press life and stain resistance of the non-image area did not deteriorate, that is, the shelf-stability was excellent.

TABLE 13

|  | Alkali-soluble polymer (content) | Press life/Stain resistance of non-image area | | |
|---|---|---|---|---|
|  |  | No accelerated time passage | 60° C., 3 days | 45° C., 75% RH 3 days |
| Example 4 | Polymer compound 6, 1.0 g | 70,000 sheets, no stain | 70,000 sheets, no stain | 70,000 sheets, no stain |
| Example 5 | Polymer compound 7, 1.0 g | 85,000 sheets, no stain | 85,000 sheets, no stain | 85,000 sheets, no stain |
| Example 6 | Polymer compound 8, 1.0 g | 110,000 sheets, no stain | 110,000 sheets, no stain | 110,000 sheets, no stain |
| Comparative Example 2 | P-2, 1.0 g | 40,000 sheets, no stain | 20,000 sheets, stain | 15,000 sheets, stain |

Examples 7 Through 13, Comparative Examples 3 and 4

[Preparation of Support]

A surface of an aluminum plate having a thickness of 0.30 mm was grained with a nylon brush and an aqueous suspension of 400 mesh Pamistone followed by thorough water washing. The aluminum plate was etched by being immersed in a 10 mass % sodium hydroxide aqueous solution at 70° C. for 60 seconds followed by washing with running water, neutralizing with 20 mass % nitric acid, and water washing. Subsequently, under the condition of VA=12.7 V, with a sine wave alternating current and a quantity of anode electricity of 160 C/dm$^2$, the electrolytic surface roughening was performed in a 1 mass % nitric acid aqueous solution. The surface roughness was measured and found to be 0.6 μm (by Ra). Subsequently, the plate was dipped in a 30 mass % sulfuric acid aqueous solution and subjected to desmutting at 55° C. for 2 minutes. Thereafter, in a 20 mass % sulfuric acid aqueous solution, with a current density of 2 A/dm$^2$, the anodic oxidation was applied for 2 minutes so that a thickness of an anodic oxidation film was 2.7 g/m$^2$.

[Formation of Undercoat Layer]

According to the following procedure, a liquid composition (sol solution) of an SG method was prepared, the sol solution was diluted with methanol/ethylene glycol=9/1 (by mass ratio) and coated on a support so that an amount of Si became 30 mg/m$^2$ followed by drying at 100° C. for 1 minute.

<Sol Solution Composition>

| Methanol | 130 g |
|---|---|
| Water | 20 g |
| 85 Mass % phosphoric acid | 16 g |
| Tetraethoxysilane | 50 g |
| 3-Methacryloxypropyltrimethoxysilane | 60 g |

The above sol solution composition was mixed and agitated. After about 5 minutes, heat generation was detected. After reacting for 60 minutes, the content was transferred to another container, thereto 3000 g of methanol was added, and thereby a sol solution was obtained.

[Formation of Recording Layer]

On the aluminum supports thus treated, the recording layer coating solution 3 having the composition shown below was coated with a wire-bar on the foregoing undercoated aluminum supports, dried at 115° C. for 45 seconds with a hot air dryer, and thereby planographic printing plate precursors 3 were obtained. A coating amount after drying was in the range of 1.2 to 1.3 g/m$^2$.

<Recording Layer Coating Solution 3>

| Alkali-soluble polymer: (A) component (the compound described in Table 14) | 1.2 g |
|---|---|
| Radical-polymerizing compound "M-1": (D) component | 0.8 g |
| Infrared absorbing agent "IR- 1": (C) component | 0.09 g |
| Radical generating agent "S-3": (B) component | 0.40 g |
| Naphthalene sulfonic acid salt of Victoria Pure Blue | 0.04 g |
| Fluorine-type surfactant (Megafax F-176 available from Dainihon Ink & Chemical Industries Co.) | 0.01 g |
| Methyl ethyl ketone | 9.0 g |
| Methanol | 10.0 g |
| p-Methoxyphenol | 0.001 g |
| 1-Methoxy-2-propanol | 8.0 g |

[Exposure and Development]

The obtained negative type planographic printing plate precursors 3 were exposed under the conditions of a resolution of 2400 dpi by use of Creo Trendsetter 3244VFS equipped with a water-cooled 40 W infrared semiconductor laser. At this time, by varying an exposing power (W) and an exterior surface drum revolution rate, a plate surface energy was varied, and thus exposure was performed.

Furthermore, similarly to the method employed in Examples 1 through 3, the development was carried out, and thereby planographic printing plates 3 were obtained.

[Evaluation of Press Life and Sensitivity]

The obtained planographic printing plates 3 were subjected to the printing similarly to Examples 1 through 3. How many sheets can be printed with sufficient ink concentration was measured by eye inspection at the respective amounts of exposure, and thereby the press life was evaluated. Results are shown together in Table 14.

As is obvious from Table 14, even when the exposure level was varied, the planographic printing plates 3 of Examples 7 through 13 in which the specific alkali-soluble polymer A recited in the invention was used were confirmed to be excellent in the press life in comparison with the planographic printing plates 3 of Comparative Examples 3 and 4 in which an alkali-soluble polymer outside of the range of the invention was used.

Furthermore, it was found that while in Comparative Examples 3 and 4, at low exposure levels in particular, the press life considerably deteriorated, in the planographic printing plate precursors of Examples 7 through 13, even with an exposure of low exposure level, the press life did not exhibit considerable deterioration, that is, the planographic printing plate precursors of Examples 7 through 13 were excellent in the sensitivity.

TABLE 14

| | Alkali-soluble polymer (content) | Press life: Exposure level (mJ/cm$^2$) | | |
|---|---|---|---|---|
| | | 100 | 180 | 260 |
| Example 7 | Polymer compound 2, 1.0 g | 80,000 sheets | 95,000 sheets | 110,000 sheets |
| Example 8 | Polymer compound 4, 1.0 g | 85,000 sheets | 105,000 sheets | 120,000 sheets |
| Example 9 | Polymer compound 8, 1.0 g | 100,000 sheets | 110,000 sheets | 130,000 sheets |
| Example 10 | Polymer compound 10, 1.0 g | 110,000 sheets | 120,000 sheets | 140,000 sheets |
| Example 11 | Polymer compound 16, 1.0 g | 120,000 sheets | 130,000 sheets | 150,000 sheets |
| Example 12 | Polymer compound 19, 1.0 g | 150,000 sheets | 170,000 sheets | 190,000 sheets |
| Example 13 | Polymer compound 21, 1.0 g | 160,000 sheets | 175,000 sheets | 195,000 sheets |
| Comparative Example 3 | P-1, 1.0 g | 10,000 sheets | 20,000 sheets | 40,000 sheets |
| Comparative Example 4 | P-2, 1.0 g | 15,000 sheets | 25,000 sheets | 50,000 sheets |

Examples 14 Through 17, Comparative Example 5

[Formation of Recording Layer]

On the aluminum supports undercoated in a similar way to Examples 4 through 6, the recording layer coating solution 4 having the composition shown below was coated with a wire-bar, dried at 115° C. for 45 seconds with a hot air dryer. Furthermore, the following overcoat layer coating solution was coated by use of a slide hopper, dried at 120° C. for 75 seconds with a hot air dryer, and thereby planographic printing plate precursors 4 were obtained. The coating amounts of the recording layers were 2.0 g/m$^2$ and those of the overcoat layers were 2.3 g/m$^2$.

<Recording Layer Coating Solution 4>

| | |
|---|---|
| Alkali-soluble polymer: (A) component (the compound described in Table 15) | 1.2 g |
| Radical-polymerizing compound DPHA: (D) component | 0.8 g |
| Infrared absorbing agent "IR-2": (C) component | 0.09 g |
| Radical Initiator "S-4": (B) component | 0.40 g |
| Naphthalene sulfonic acid salt of Victoria Pure Blue | 0.04 g |
| Fluorine-type surfactant (Megafax F-176 available from Dainihon Ink & Chemical Industries Co.) | 0.01 g |
| Methyl ethyl ketone | 9.0 g |
| Methanol | 10.0 g |
| p-Methoxyphenol | 0.001 g |
| 1-Methoxy-2-propanol | 8.0 g |

<Overcoat Layer Coating Solution>

| | |
|---|---|
| Polyvinyl alcohol (degree of saponification: 98.5 mol %, degree of polymerization: 500) | 2.5 g |
| Polyvinyl pyrrolidone (K30 available from Tokyo Kasei Kogyo Co., molecular weight: 40,000) | 0.5 g |
| Non-ionic surfactant (EMAREX NP-10 available from Japan Emulsion Co., Ltd.) | 0.05 g |
| Ion-exchanged water | 96.95 g |

[Exposure and Development]

The obtained negative type planographic printing plate precursors 4 were subjected to the infrared laser exposure and development in a similar way to the method employed in Examples 1 through 3, thereby planographic printing plates 4 were obtained.

[Evaluation of Press Life, Stain Resistance and Shelf-stability]

The obtained planographic printing plates 4 were subjected to the printing in a similar way to Examples 1 through 3, further followed by the similar evaluation. Results are shown together in Table 15.

As is obvious from Table 15, it was confirmed that the planographic printing plates 4 of Examples 14 through 17 in which the specific alkali-soluble polymer A recited in the invention was used were excellent in the press life, in comparison with the planographic printing plate 4 of Comparative Example 5 in which an alkali-soluble polymer outside of the range of the invention was used. Furthermore, it was found that even after the storage under the high temperature and high humidity environment, in the planographic plates 4 of Examples 14 through 17, the press life and the stain resistance of the non-image area did not deteriorate, that is, the shelf-stability was excellent.

TABLE 15

| | Alkali-soluble polymer (content) | Press life/Non-image area stain resistance | | |
|---|---|---|---|---|
| | | No accelerated time passage | 60° C., 3 days | 45° C., 75 % RH, 3 days |
| Example 14 | Polymer compound 4, 1.0 g | 60,000 sheets, no stain | 60,000 sheets, no stain | 60,000 sheets, no stain |
| Example 15 | Polymer compound 8, 1.0 g | 80,000 sheets, no stain | 80,000 sheets, no stain | 80,000 sheets, no stain |
| Example 16 | Polymer compound 10, 1.0 g | 95,000 sheets, no stain | 95,000 sheets, no stain | 95,000 sheets, no stain |
| Example 17 | Polymer compound 19, 1.0 g | 110,000 sheets, no stain | 110,000 sheets, no stain | 110,000 sheets, no stain |
| Comparative Example 5 | P-2, 1.0 g | 40,000 sheets, no stain | 20,000 sheets, stain | 15,000 sheets, stain |

Examples 18 Through 21, Comparative Examples 6 Through 9

[Preparation of Support]

To the support similar to that used in Examples 1 through 3, in order to secure the hydrophilic property as a non-image area of a printing plate, silicate treatment was applied. In the treatment, in a 1.5% No. 3 sodium silicate aqueous solution heated at 70° C., an aluminum web was transmitted so that a contact time period became 15 seconds further followed by water washing. An amount of adhered Si was 10 mg/m². The Ra (centerline mean surface roughness) of the support prepared as described above was 0.25 µm.

[Formation of Recording Layer]

On the aluminum support thus treated, the recording layer coating solution 5 having the composition shown below was coated with a wire-bar, dried at 115° C. for 45 seconds with a hot air dryer, and thereby a planographic printing plate precursor 5 was obtained. The dry coating amounts were in the range of from 1.2 to 1.3 g/m².

Subsequently, in a similar way to Examples 14 through 17, the overcoat layer was coated.

<Recording Layer Coating Solution 5>

| | |
|---|---|
| Alkali-soluble polymer: (A) component (the compound described in Table 13) | 1.0 g |
| Radical-polymerizing compound "M-2": (D) component | 1.0 g |
| Infrared absorbing agent (the compound described in Table 16): (C) component | 0.08 g |
| Radical Initiator (the compound described in Table 16): (B) component | 0.30 g |
| Naphthalene sulfonic acid salt of Victoria Pure Blue | 0.04 g |
| Fluorine-type surfactant (Megafax F-176 available from Dainihon Ink & Chemical Industries Co.) | 0.01 g |
| Methyl ethyl ketone | 9.0 g |
| Methanol | 10.0 g |
| p-Methoxyphenol | 0.001 g |
| 1-Methoxy-2-propanol | 8.0 g |

[Exposure and Development]

The obtained negative type planographic printing plate precursors 5 were subjected to the infrared laser exposure and the development similarly to Examples 1 through 3 except that the developing solution was changed to the following composition, and thereby the planographic printing plates 5 were obtained.

<Composition of Developing Solution>

| | |
|---|---|
| Potassium hydroxide | 3 g |
| Potassium hydrogen carbonate | 1 g |
| Potassium carbonate | 2 g |
| Sodium sulfite | 1 g |
| Polyethylene glycol mononaphthyl ether | 150 g |
| Sodium dibutyl naphthalene sulfonate | 50 g |
| Tetrasodium ethylene diamine tetraacetate | 8 g |
| Water | 785 g |

[Evaluation of Press Life, Stain Resistance and Shelf-stability]

The obtained planographic printing plates 5 were subjected to the printing similarly to Examples 1 through 3 followed by the similar evaluation. Results are shown together in Table 16.

As is obvious from Table 16, it was confirmed that the planographic printing plates 5 of Examples 18 through 21 in which the specific alkali-soluble polymer A recited in the invention was used were excellent in the press life, in comparison with the planographic printing plates 5 of Comparative Examples 6 through 9 in which an alkali-soluble polymer outside of the range of the invention was used.

Furthermore, it was found that even after the storage under the high temperature and high humidity environment, in the planographic printing plates 5 of Examples 18 through 21, the press life and the stain resistance of the non-image area did not deteriorate, that is, the shelf-stability was excellent.

TABLE 16

| | Alkali-soluble polymer (content) | Infrared absorbing agent | Radical initiator | Press life/Stain resistance of non-image area | | |
|---|---|---|---|---|---|---|
| | | | | No accelerated time passage | 60° C., 3 days | 45° C., 75% RH, 3 days |
| Example 18 | Polymer compound 10, 1.0 g | IR-1 | S-2 | 60,000 sheets, no stain | 60,000 sheets, no stain | 60,000 sheets, no stain |
| Example 19 | Polymer compound 20, 1.0 g | IR-1 | S-5 | 80,000 sheets, no stain | 80,000 sheets, no stain | 80,000 sheets, no stain |
| Example 20 | Polymer compound 10, 1.0 g | IR-3 | S-5 | 60,000 sheets, no stain | 60,000 sheets, no stain | 60,000 sheets, no stain |
| Example 21 | Polymer compound 20, 1.0 g | IR-3 | S-2 | 80,000 sheets, no stain | 80,000 sheets, no stain | 80,000 sheets, no stain |
| Comparative Example 6 | P-1, 1.0 g | IR-1 | S-2 | 35,000 sheets, no stain | 18,000 sheets, stain | 15,000 sheets, stain |
| Comparative Example 7 | P-1, 1.0 g | IR-1 | S-5 | 35,000 sheets, no stain | 18,000 sheets, stain | 15,000 sheets, stain |
| Comparative Example 8 | P-1, 1.0 g | IR-3 | S-5 | 35,000 sheets, no stain | 18,000 sheets, stain | 15,000 sheets, stain |
| Comparative Example 9 | P-1, 1.0 g | IR-3 | S-2 | 35,000 sheets, no stain | 18,000 sheets, stain | 15,000 sheets, stain |

As mentioned above, it was confirmed that, according to the invention, in all of the planographic printing plate precursors in which the alkali-soluble polymer recited in the invention was used as the recording material, a lot of sheets of printed matter could be obtained with sufficient ink concentration, that is, the press life and inking properties were excellent. Furthermore, even when the planographic plate precursors were preserved under the high temperature and high humidity conditions, the press life, stain resistance and the like did not deteriorate, that is, the shelf-stability was excellent. Still furthermore, since even when the exposure energy was varied at image recording, the high press life was realized at the respective exposure levels, it was confirmed that the planographic printing plate precursors were excellent also in the sensitivity.

As obvious from the examples, it was confirmed that the planographic printing plate precursors in which the resin composition recited in the invention was used were excellent in the sensitivity, shelf-stability, press life and ink-affinity; accordingly, it is understood that the resin composition according to the invention was useful as the recording material of the negative type planographic printing plate precursor.

Examples 22 Through 28, Comparative Examples 10 Through 12

[Preparation of Support]

A molten metal of JIS A1050 alloy that contains 99.5% or more of aluminum, 0.30% of Fe, 0.10% of Si, 0.02% of Ti and 0.013% of Cu was subjected to a cleaning treatment followed by casting. In the cleaning treatment, degassing treatment was applied to remove unnecessary gases such as hydrogen and so on in the molten metal followed by filtering with a ceramic tube. The casting method was a DC casting method. A surface of a solidified ingot having a thickness of 500 mm was faced by 10 mm, and, in order to suppress an intermetallic compound from growing, homogenizing treatment was applied at 550° C. for 10 hr. In the next place, hot rolling was applied at 400° C., annealing was applied at 500° C. for 60 seconds in a continuous annealing furnace followed by cold rolling, and thereby an aluminum rolled sheet having a thickness of 0.30 mm was prepared. By controlling the roughness of the rolling roll, the centerline mean surface roughness Ra after the cold rolling was adjusted to 0.2 μm. Thereafter, the rolled sheet was subjected to a tension leveler so as to improve the planarity.

Then, surface treatment was applied to form a planographic printing plate support.

Firstly, in order to remove rolling mill oil on the surface of the aluminum plate, degreasing treatment was applied at 50° C. for 30 seconds with a 10% sodium aluminate aqueous solution, and neutralizing and desmutting treatment was performed at 50° C. for 30 seconds with a 30% sulfuric acid aqueous solution.

Subsequently, in order to improve the adhesion of a recording layer with the support and to endow a no-image area with the water retainability, the surface of the support was roughened, that is, grained. With an aqueous solution containing 1% nitric acid and 0.5% aluminum nitrate maintained at 45° C. and an aluminum web transmitting in the aqueous solution, from an indirect power supply cell, in an alternating wave form of a current density of 20 A/dm$^2$ and a duty ratio of 1:1, an amount of electricity of 240 C/dm$^2$ was supplied to an anode side, and thereby electrolytic graining was performed. Thereafter, with a 10% sodium aluminate aqueous solution, the etching was applied at 50° C. for 30 seconds followed by neutralizing and desmutting with a 30% sulfuric acid aqueous solution at 50° C. for 30 seconds.

Furthermore, in order to improve the wear resistance, chemical resistance and water retainability, an oxide film was formed on the support by the anodic oxidation. With a 20% sulfuric acid aqueous solution used as an electrolyte at 35° C. and an aluminum web transmitting in the electrolyte, the electrolytic treatment was applied with a direct current of 14 A/dm$^2$ from an indirect current cell, and thereby an anodic oxidation film of 2.5 g/m$^2$ was formed.

Thereafter, in order to secure the hydrophilic property as a non-image area of a printing plate, silicate treatment was applied. In the treatment, with a 1.5% No. 3 sodium silicate aqueous solution maintained at 70° C., an aluminum web was transmitted so that a contact time period became 15 seconds further followed by water washing. An amount of adhered Si was 10 mg/m$^2$. The Ra (centerline mean surface roughness) of the support prepared as described above was 0.25 μm.

[Formation of Recording Layer]

The following recording layer coating solution C1 was prepared, coated on the aluminum support obtained as mentioned above with a wire-bar, dried at 115° C. for 45 seconds with a hot air dryer to form a recording layer, and thereby a planographic printing plate precursor was obtained. The coating amounts after drying were in the range of from 1.2 to 1.3 g/m².

The alkali-soluble polymer used in the Example according to the invention was the specific alkali-soluble polymer A' obtained according to the synthesis example, and the structure units of alkali-soluble polymers (CP-1) through (CP-3) used in the Comparative Examples are shown below.

<Recording Layer Coating Solution 1>

Alkali-soluble polymer: (A') component (the compound described in Table 17 and the amount described in Table 17)

Radical-polymerizing compound: (D') component (the compound described in Table 17 and the amount described in Table 17)

| | |
|---|---|
| Sensitizing dye: (C') component (the compound described in Table 17) | 0.15 g |
| Radical initiator: (B') component (the compound described in Table 17) | 0.20 g |
| Naphthalene sulfonic acid salt of Victoria Pure Blue | 0.04 g |
| Fluorine-type surfactant (Megafax F-176 available from Dainihon Ink & Chemical Industries Co.) | 0.01 g |
| p-Methoxyphenol | 0.001 g |
| Methyl ethyl ketone | 9.0 g |
| Methanol | 10.0 g |
| 1-Methoxy-2-propanol | 8.0 g |

TABLE 17

| | Alkali-soluble polymer | Polymerizing-compound | Sensitizing dye | Radical initiator | Press life |
|---|---|---|---|---|---|
| Example 22 | V-1, 1.0 g | CDPHA, 1.0 g | CC-1 | CS-1 | 50,000 sheets |
| Example 23 | V-2, 1.0 g | CDPHA, 1.0 g | CC-1 | CS-1 | 60,000 sheets |
| Example 24 | V-4, 1.0 g | CDPHA, 1.0 g | CC-1 | CS-1 | 63,000 sheets |
| Example 25 | V-12, 1.0 g | CDPHA, 1.0 g | CC-1 | CS-1 | 68,000 sheets |
| Example 26 | V-2, 2.0 g | None | CC-2 | CS-2 | 62,000 sheets |
| Example 27 | V-4, 2.0 g | None | CC-2 | CS-2 | 64,000 sheets |
| Example 28 | V-12, 2.0 g | None | CC-2 | CS-2 | 66,000 sheets |
| Comparative Example 10 | CP-1, 1.0 g | CDPHA, 1.0 g | CC-1 | CS-1 | 23,000 sheets |
| Comparative Example 11 | CP-2, 1.0 g | CDPHA, 1.0 g | CC-1 | CS-1 | 32,000 sheets |
| Comparative Example 12 | CP-3, 1.0 g | CDPHA, 1.0 g | CC-1 | CS-1 | 33,000 sheets |

The structure units of the alkali-soluble polymers (CP-1) through (CP-3) used in the comparative examples are shown below.

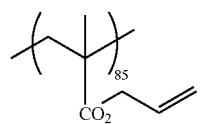
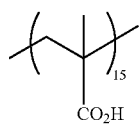
(CP-1) Mw 136,000

-continued

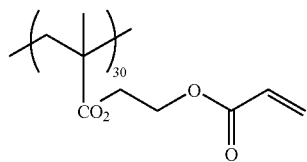
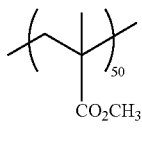
(CP-2)

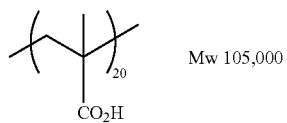
Mw 105,000

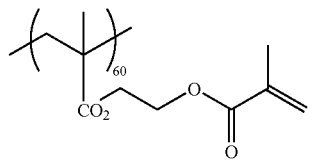
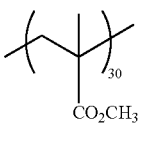
(CP-3)

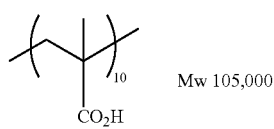
Mw 105,000

Similarly, structures of the radical initiators (CS-1) through (CS-5) used in the examples and comparative examples recited in the invention are shown below.

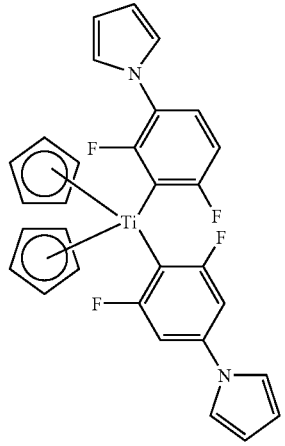
(CS-1)

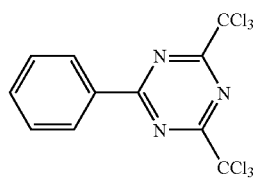
(CS-2)

(CS-3)
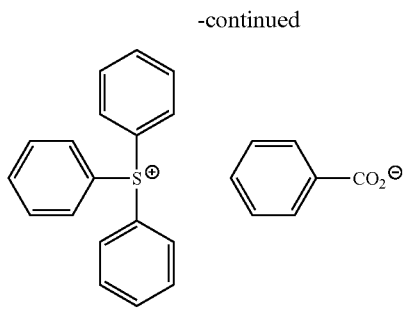
(CC-2)
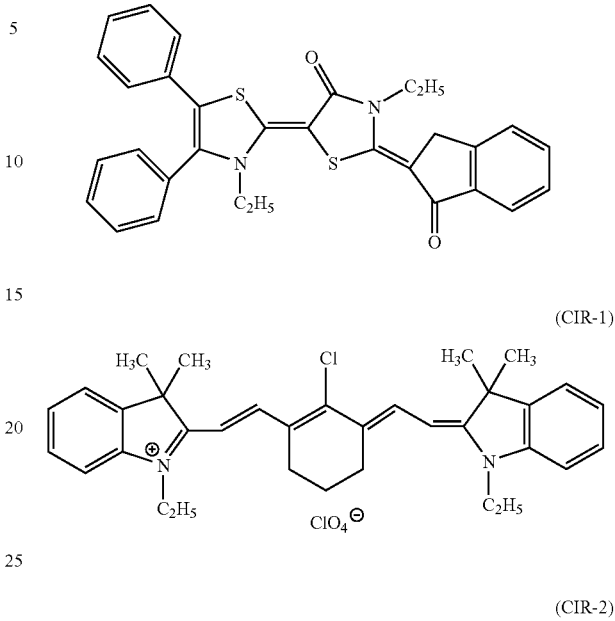
(CS-4)
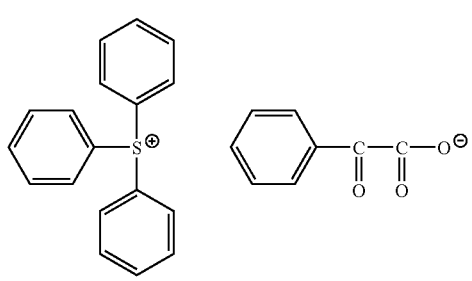
(CIR-1)
(CIR-2)
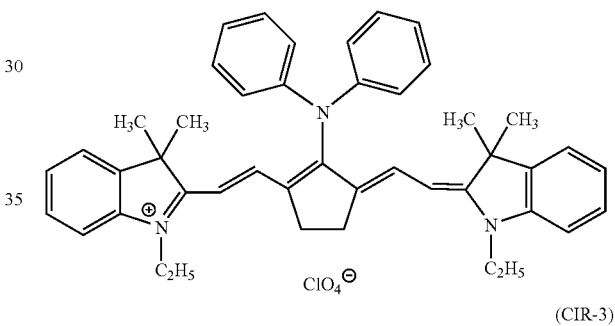
(CS-5)
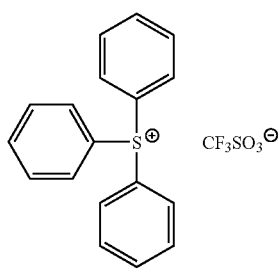
Similarly, structures of the sensitizing dyes (CC-1), (CC-2) and (CIR-1) through (CIR-3) used in the examples and comparative examples recited in the invention are shown below.
(CIR-3)
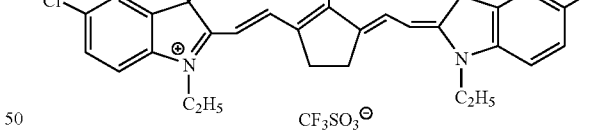
(CC-1)
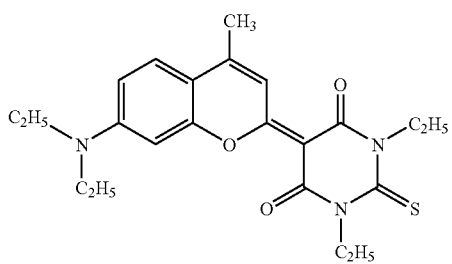
Similarly, structures of the radical-polymerizing compounds (CDPHA), (U-1) and (U-2) used in the examples and comparative examples recited in the invention are shown below.
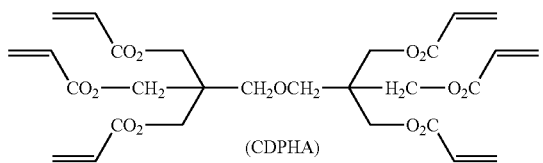

-continued

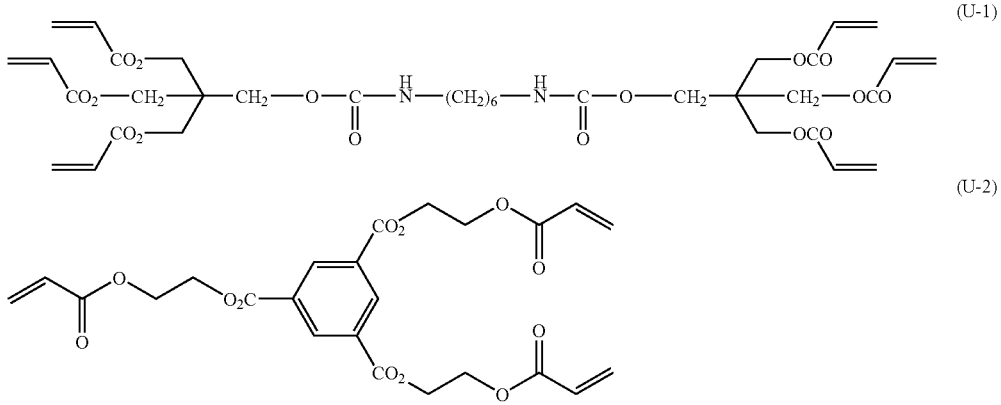

A 3 mass % polyvinyl alcohol (degree of saponification: 86.5 to 89 mole %, and degree of polymerization: 1000) aqueous solution was coated so that a dry coating mass became 2 g/m², dried at 100° C. for 2 minutes, and thereby a planographic printing plate precursor having a protective layer on the recording layer was obtained.

[Exposure]

With a scanning exposure system with a 75 mW air-cooled YAG-SHG laser (exposing wavelength: 532 nm) as a light source, scanning exposure was performed at exposure of 0.20 mJ/cm².

[Development]

After the exposure, with an automatic processor Stablon 900NP manufactured by Fuji Photo Film Co., Ltd., the development was performed. As the developing solution, for both of a charge solution and replenishing solution, a solution of DP-4 (manufactured by Fuji Photo Film Co., Ltd.) diluted with water (DP-4:water=1:8) was used. A developing bath was set at a temperature of 30° C., and the developing time period was set at 12 seconds. At this time, the replenishing solution was automatically supplied so that the electric conductivity of the developing solution in the developing bath of the automatic processor was kept constant. Furthermore, as a finisher, a solution of FN-6 (manufactured by Fuji Photo Film Co., Ltd.) diluted with water (FN-6:water=1:1) was used.

[Evaluation of Press Life]

In the next place, the printing was performed by use of a printer Lithrone manufactured by Komori Corporation. At this time, how many sheets can be printed with a sufficient ink concentration was measured by eye inspection, and thereby the press life was evaluated. Results are shown together in the Table 17.

As is obvious from Table 17, it was confirmed that the planographic printing plates of Examples 22 through 28 in which the specific alkali-soluble polymer A' recited in the invention was used were excellent in the press life, in comparison with the planographic printing plates of Comparative examples 10 through 12 in which the alkali-soluble polymer outside the range of the invention was used.

Examples 29 Through 32, Comparative Examples 13 and 14

On the aluminum support similar to that used in Examples 22 through 28, the recording layer coating solution C2 shown below was coated with a wire-bar, dried at 115° C. for 45 seconds with a hot air dryer, and thereby a planographic printing plate precursor was obtained. The dry coating amounts were in the range of from 1.2 to 1.3 g/m².

<Recording Layer Coating Solution C2>

Alkali-soluble polymer: (A') component (the compound described in Table 18 and the amount described in Table 18)

Radical-polymerizing compound: (D') component (the compound described in Table 18 and the amount described in Table 18)

| | |
|---|---|
| Sensitizing dye "CIR-1": (C') component | 0.09 g |
| Radical Initiator "CS-3": (B') component | 0.35 g |
| Naphthalene sulfonic acid salt of Victoria Pure Blue | 0.04 g |
| Fluorine-type surfactant (Megafax F-176 available from Dainihon Ink & Chemical Industries Co.) | 0.01 g |
| N-nitroso-N-phenylhydroxylamine Al | 0.001 g |
| Methyl ethyl ketone | 9.0 g |
| Methanol | 10.0 g |
| 1-Methoxy-2-propanol | 8.0 g |

TABLE 18

| | Alkali-soluble polymer | Polymerizing-Compound | No forced time passage | 60° C., 3 days | 45° C., 75% RH, 3 days |
|---|---|---|---|---|---|
| Example 29 | V-4, 1.0 g | CDPHA, 1.0 g | 70,000 sheets, no stain | 70,000 sheets, no stain | 70,000 sheets, no stain |
| Example 30 | V-12, 1.0 g | CDPHA, 1.0 g | 75,000 sheets, no stain | 75,000 sheets, no stain | 75,000 sheets, no stain |
| Example 31 | V-8, 1.0 g | U-1, 1.0 g | 80,000 sheets, no stain | 80,000 sheets, no stain | 80,000 sheets, no stain |

TABLE 18-continued

|  | Alkali-soluble polymer | Polymerizing-Compound | No forced time passage | 60° C., 3 days | 45° C., 75% RH, 3 days |
|---|---|---|---|---|---|
| Example 32 | V-15, 1.0 g | U-1, 1.0 g | 82,000 sheets, no stain | 82,000 sheets, no stain | 82,000 sheets, no stain |
| Comparative Example 13 | CP-3, 1.0 g | CDPHA, 1.0 g | 32,000 sheets, no stain | 25,000 sheets, stain | 20,000 sheets, stain |
| Comparative Example 14 | CP-4, 1.0 g | U-1, 1.0 g | 50,000 sheets, no stain | 30,000 sheets, stain | 25,000 sheets, stain |

[Exposure]

The obtained planographic printing plate precursor was exposed, by use of Creo Trendsetter 3244VFS equipped with a water-cooled 40 W infrared semiconductor laser, under the conditions of an output of 6.5 W, an exterior surface drum revolution rate of 81 rpm, a plate surface energy of 188 mJ/cm$^2$ and a resolution of 2400 dpi.

[Development]

After the exposure, with an automatic processor Stablon 900NP manufactured by Fuji Photo Film Co., Ltd., the development was performed. As the developing solution, the following "D-1" and "D-2" were used for a charge solution and a replenishing solution, respectively. A developing bath was set at a temperature of 30° C., and the developing time period was set at 12 seconds. At this time, the replenishing solution was automatically supplied so that the electric conductivity of the developing solution in the developing bath of the automatic processor was kept constant. Furthermore, as a finisher, a solution of FN-6 (manufactured by Fuji Photo Film Co., Ltd.) diluted with water (FN-6:water=1:1) was used.

<Developing Solution "D-1">

| Potassium hydroxide | 3 g |
|---|---|
| Potassium hydrogen carbonate | 1 g |
| Potassium carbonate | 2 g |
| Sodium sulfite | 1 g |
| Polyethylene glycol mononaphthyl ether | 150 g |
| Sodium dibutyl naphthalene sulfonate | 50 g |
| Tetrasodium ethylenediamine tetraacetate | 8 g |
| Water | 785 g |

<Developing Solution "D-2">

| Potassium hydroxide | 6 g |
|---|---|
| Potassium carbonate | 2 g |
| Sodium sulfite | 1 g |
| Polyethylene glycol mononaphthyl ether | 150 g |
| Sodium dibutyl naphthalene sulfonate | 50 g |
| Potassium hydroxyethane diphosphonate | 4 g |
| Silicone TSA-73 1 (available from GE Toshiba Silicones) | 0.1 g |
| Water | 786.9 g |

[Evaluation of Press Life, Stain Resistance and Shelf-stability]

The obtained planographic printing plates were subjected to the printing in a similar way to the Examples 22 through 28. Furthermore, the obtained planographic printing plate precursors were forcibly passed time by preserving them at 60° C. for 3 days, or at 45° C., 75% RH for 3 days, respectively, followed by similar printing, and further followed by similar evaluation of the press life, stain resistance and shelf-stability. Results are shown together in Table 18.

As is obvious from Table 18, the planographic printing plates of Examples 29 through 32 in which the specific alkali-soluble polymer A' recited in the invention was used were excellent in the press life, in comparison with the planographic printing plates of Comparative Examples 13 and 14 in which an alkali-soluble polymer outside of the range of the invention was used, and did not exhibit the stain in the non-image area. Furthermore, it was found that even after storage under a high temperature and high humidity environment, the press life and the stain resistance of the non-image area did not deteriorate, that is, the shelf-stability was excellent.

Examples 33 Through 38, Comparative Examples 15 and 16

On the aluminum support similar to that used in Examples 22 through 28, the undercoat coating solution shown below was coated, and dried in an atmosphere of 80° C. for 30 seconds. A dry coating amount was 10 mg/m$^2$.

<Undercoat Layer Coating Solution>

Compounds having the following compositions were mixed, and thereby a undercoat layer coating solution was prepared.

| 2-Aminoethyl phosphonic acid | 0.5 g |
|---|---|
| Methanol | 40 g |
| Pure water | 60 g |

On the support on which the undercoat layer was formed, the recording layer coating solution C3 shown below was coated with a wire-bar, dried at 115° C. for 45 seconds with a hot air dryer, and thereby a planographic printing plate precursors was obtained. Coating amount after drying were in the range of from 1.2 to 1.3 g/m$^2$.

<Recording Layer Coating Solution C3>

Alkali-soluble polymer: (A') component (the compound described in Table 19 and the amount described in Table 19)

Radical-polymerizing compound: (D') component (the compound described in Table 19 and the amount described in Table 19)

| Infrared absorbing agent "CIR-2": (B') component | 0.10 g |
|---|---|
| Radical Initiator "CS-4": (C') component | 0.40 g |
| Naphthalene sulfonic acid salt of Victoria Pure Blue | 0.04 g |
| Fluorine-type surfactant (Megafax F-176 available from Dainihon Ink & Chemical Industries Co.) | 0.01 g |
| N-nitroso-N-phenylhydroxylamine Al | 0.001 g |
| Methyl ethyl ketone | 9.0 g |
| Methanol | 10.0 g |
| 1-Methoxy-2-propanol | 8.0 g |

TABLE 19

| | Alkali-soluble polymer | Polymerizing-Compound | No forced time passage | 60° C., 3 days | 45° C., 75% RH, 3 days |
|---|---|---|---|---|---|
| Example 33 | V-16, 1.0 g | CDPHA, 1.0 g | 85,000 sheets, no stain | 85,000 sheets, no stain | 85,000 sheets, no stain |
| Example 34 | V-18, 1.0 g | U-2, 1.0 g | 90,000 sheets, no stain | 90,000 sheets, no stain | 90,000 sheets, no stain |
| Example 35 | V-19, 1.0 g | U-2, 1.0 g | 92,000 sheets, no stain | 92,000 sheets, no stain | 92,000 sheets, no stain |
| Example 36 | V-8, 1.0 g | CDPHA, 1.0 g | 100,000 sheets, no stain | 100,000 sheets, no stain | 100,000 sheets, no stain |
| Example 37 | V-12, 2.0 g | None | 80,000 sheets, no stain | 80,000 sheets, no stain | 80,000 sheets, no stain |
| Example 38 | V-20, 2.0 g | None | 90,000 sheets, no stain | 90,000 sheets, no stain | 90,000 sheets, no stain |
| Comparative Example 15 | CP-3, 1.0 g | U-2, 1.0 g | 45,000 sheets, no stain | 25,000 sheets, stain | 20,000 sheets, stain |
| Comparative Example 16 | CP-4, 1.0 g | None | 50,000 sheets, no stain | 35,000 sheets, stain | 25,000 sheets, stain |

[Exposure]

The obtained planographic printing plate precursors were exposed, by use of Creo Trendsetter 3244VFS equipped with a water-cooled 40 W infrared semiconductor laser, under the conditions of an output of 6.5 W, an exterior surface drum revolution rate of 81 rpm, a plate surface energy of 188 mJ/cm$^2$ and a resolution of 2400 dpi.

[Development]

After the exposure, with an automatic processor Stablon 900NP manufactured by Fuji Photo Film Co., Ltd., the development was performed. As the developing solution, DP-4 available from Fuji Photo Film Co., Ltd. was used after diluted with water (DP-4:water=1:8) for both a charge solution and a replenishing solution. A developing bath was set at a temperature of 30° C., and the developing time period was set at 12 seconds. At this time, the replenishing solution was automatically supplied so that the electric conductivity of the developing solution in the developing bath of the automatic processor was kept constant. Furthermore, as a finisher, a solution of FN-6 (manufactured by Fuji Photo Film Co., Ltd.) diluted with water (FN-6:water=1:1) was used.

[Evaluation of Press Life, Stain Resistance and Shelf-stability]

The obtained planographic printing plate was subjected to the printing in a similar way to the Examples 22 through 28. Furthermore, the obtained planographic printing plate precursors were forcibly passed time by preserving them at 60° C. for 3 days, or at 45° C., 75% RH for 3 days, respectively, followed by similar printing, and further followed by similar evaluation of the press life, stain resistance and shelf-stability. Results are shown together in Table 19.

As is obvious from Table 19, the planographic printing plates according to Examples 33 through 38 in which the specific alkali-soluble polymer A' recited in the invention was used were excellent in the press life and did not exhibit the stain in the non-image area, in comparison with the planographic printing plates of Comparative Examples 15 and 16 in which an alkali-soluble polymer outside of the range of the invention was used. Furthermore, it was found that even after storage under a high temperature and high humidity environment, the press life and the stain resistance of the non-image area did not deteriorate, that is, the shelf-stability was excellent.

Examples 39 Through 42, Comparative Example 17

[Preparation of Support]

A surface of an aluminum plate having a thickness of 0.30 mm was grained with a nylon brush and an aqueous suspension of 400 mesh Pamistone followed by thorough water washing. The aluminum plate was immersed in a 10 mass % sodium hydroxide aqueous solution at 70° C. for 60 seconds for etching, followed by washing with running water, furthermore followed by neutralizing with 20 mass % nitric acid, still furthermore followed by water washing. Subsequently, under the condition of VA=12.7 V, with a sine wave alternating current, in a 1 mass % nitric acid aqueous solution, and at a quantity of anode electricity of 160 C/dm$^2$, the electrolytic surface roughening was performed. The surface roughness thereof was measured and found to be 0.6 µm (by Ra). Subsequently, the plate was dipped in a 30 mass % sulfuric acid aqueous solution and the desmutting was applied at 55° C. for 2 minutes. Thereafter, in 20 mass % sulfuric acid aqueous solution, under a current density of 2 A/dm$^2$, the anodic oxidation was applied for 2 minutes so that a thickness of an anodic oxidation film became 2.7 g/m$^2$.

[Formation of Undercoat Layer]

According to the following procedure, a liquid composition (sol solution) of an SG method was prepared.

<Sol Solution Composition>

| | |
|---|---|
| Methanol | 130 g |
| Water | 20 g |
| 85 Mass % phosphoric acid | 16 g |
| Tetraethoxysilane | 50 g |
| 3-Methacryloxypropyltrimethoxysilane | 60 g |

The above sol solution composition was mixed and agitated. After about 5 minutes, heat generation was detected. After the reaction was allowed to continue for 60 minutes, the content was transferred into another container, thereto 3000 g of methanol was added, and thereby a sol solution was obtained.

The sol solution was diluted with methanol/ethylene glycol=9/1 (by mass), coated so that an amount of Si on the plate became 30 mg/m², and dried at 100° C. for 1 minute.

On the aluminum support thus treated, a recording layer coating solution C4 having the composition shown below was coated with a wire-bar on the undercoated aluminum support, dried at 115° C. for 45 seconds with a hot air dryer, and thereby a planographic printing plate precursor was obtained. A coating amount after drying was in the range of from 1.2 to 1.3 g/m².

<Photosensitive Layer Coating Solution C4>

| | |
|---|---|
| Alkali-soluble polymer: (A') component (the compound described in Table 20) | 1.2 g |
| Radical-polymerizing compound "CDPHA": (D') component | 0.8 g |
| Infrared absorbing agent "CIR-3": (C') component | 0.09 g |
| Sulfonium salt "CS-5": (B') component | 0.35 g |
| Naphthalene sulfonic acid salt of Victoria Pure Blue | 0.04 g |
| Fluorine-type surfactant (Megafax F-176 available from Dainihon Ink & Chemical Industries Co.) | 0.01 g |
| Methyl ethyl ketone | 9.0 g |
| Methanol | 10.0 g |
| p-Methoxyphenol | 0.001 g |
| 1-Methoxy-2-propanol | 8.0 g |

TABLE 20

| | Alkali-soluble Polymer | Press Life | Stain Resistance |
|---|---|---|---|
| Example 39 | V-3 | 50,000 sheets | No stain |
| Example 40 | V-8 | 60,000 sheets | No stain |
| Example 41 | V-11 | 70,000 sheets | No stain |
| Example 42 | V-17 | 75,000 sheets | No stain |
| Comparative Example 17 | CP-3 | 30,000 sheets | Stain |

[Exposure]

The obtained planographic printing plate precursors were exposed with Luxel T-9000CPT (manufactured by Fuji Photo Film Co., Ltd.) equipped with a multi-channel laser head under the conditions of an output of 250 mW per one beam, an external surface drum revolution rate of 800 rpm and resolution of 2400 dpi.

[Development]

After the exposure, with an automatic processor Stablon 900N manufactured by Fuji Photo Film Co., Ltd., the development was performed. As the developing solution, DV-1 manufactured by Fuji Photo Film Co., Ltd. was used after diluted with water (DV-1:water=1:4) for both the charge solution and the replenishing solution. The developing solution bath was set at a temperature of 30° C. Furthermore, as the finisher, GU-7 (manufactured by Fuji Photo Film Co., Ltd.) was used after diluted with water (GU-7:water=1:2).

[Evaluation of Press Life and Stain Resistance]

In the next place, the printing was carried out with a Heiderberg SOR-KZ printer. At this time, how many sheets can be printed with a sufficient ink concentration was measured, and thereby the press life was evaluated. Furthermore, the stain of the non-image area of the obtained printed matters were evaluated by eye inspection. Results are shown together in the Table 20.

As is obvious from Table 20, the planographic printing plates of Examples 39 through 42 in which the specific alkali-soluble polymer A' recited in the invention was used were excellent in the press life, in comparison with the planographic printing plate of Comparative Example 17 in which an alkali-soluble polymer outside of the range of the invention was used, and did not exhibit the stain in the non-image area.

As mentioned above, according to Examples, the planographic printing plates in which the thermo/photosensitive composition according to the invention was used as the recording layer were excellent in the press life, stain resistance and shelf-stability; accordingly, it was confirmed that the thermo/photosensitive composition according to the invention was excellent in the film formability, film strength and shelf-stability.

According to the invention, a resin composition useful as a photo- or thermo-curable composition can be obtained. The resin composition can form a strong coating that can be highly sensitively cured by light or heat, is excellent in the shelf-stability, and can be preferably used in the image-recording materials such as three dimensional optical shaping and holography, planographic printing plate materials, color proofs, photo-resists and color filters, inks, paints and adhesives. Furthermore, according to the invention, a thermo/photosensitive composition excellent in the film formability, film strength and shelf-stability that are useful as a recording layer of a negative type planographic printing plate precursor can be obtained.

What is claimed is:

1. A resin composition, comprising:
a polymer compound A that has, through a linkage group containing a hydrogen-bonding group and a ring structure, a terminal ethylenic unsaturated bond on a side chain, and is soluble or swells in water or an alkali aqueous solution; and
a compound B that generates a radical when exposed to light or heat;
wherein the ring structure in the linkage group in the polymer compound A is a heterocyclic group which has 3 to 20 carbon atoms; and
the terminal ethylenic unsaturated bond on a side chain does not contain a phenyl group substituted by a vinyl group.

2. A resin composition, comprising:
a polymer compound A that has, through a linkage group containing a hydrogen-bonding group and a ring structure, a terminal ethylenic unsaturated bond on a side chain, and is soluble or swells in water or an alkali aqueous solution; and
a compound B that generates a radical when exposed to light or heat;
wherein the terminal ethylenic unsaturated bond on a side chain does not contain a phenyl group substituted by a vinyl group; and
wherein the linkage group is represented by the following formula (c), and has the ethylenic unsaturated bond as a substituent on the ring structure:

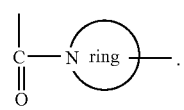

(c)

3. The resin composition according to claim 2, wherein the ring structure in the linkage group in the polymer compound A has 3 to 20 carbon atoms.

4. The resin composition according to claim 2, wherein a glass transition temperature of the polymer compound A is 60° C. or more.

5. The resin composition according to claim 2, wherein a content of the ethylenic unsaturated group in the polymer compound A is 1.5 meq/g or more per gram of the polymer compound A.

6. The resin composition according to claim 2, wherein a weight average molecular weight of the polymer compound A is 6000 or more.

7. The resin composition according to claim 2, wherein an acid value of the polymer compound A ranges from 0.5 to 30 meq/g.

8. A thermo/photosensitive composition, comprising:
a polymer compound A' and a compound B that generates a radical when exposed to light or heat;
wherein the polymer compound A' comprises a radical-polymerizing compound represented by the formula (C-A) as a polymer unit of polymer compound A';

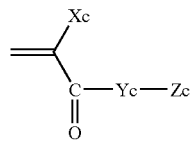

Formula (C-A)

wherein in formula (C-A), X represents a hydrogen atom or a methyl group; Y represents an oxygen atom, or a N—W; W represents a hydrogen atom or an alkyl group having 1 to 10 carbon atoms that may have a substituent; and Z represents a group having a non-acidic hydrogen-bonding group having a nitrile group;
wherein the radical-polymerizing compound is selected from (meth)acrylic acid esters having an aromatic group and a nitrile group or (meth)acrylamides having an aromatic group and a nitrile group and
wherein the polymer compound A' comprises an ethylenic unsaturated bond on a side chain.

9. The thermo/photosensitive composition according to claim 8, further comprising:
a sensitizing dye; and
another radical polymerizing compound.

10. The thermo/photosensitive composition according to claim 8, wherein a content of a structure unit that has the non-acidic hydrogen-bonding group in the polymer compound A' is 0.1 mol % or more.

11. The thermo/photosensitive composition according to claim 8, wherein a content of the polymer compound A' ranges from 5 to 95% in terms of solid components.

12. The thermo/photosensitive composition according to claim 8, wherein a weight average molecular weight of the polymer compound A' is 40,000 or more.

13. The thermo/photosensitive composition according to claim 8, wherein the polymer compound A' comprises, as a polymer unit, an additional radical-polymerizing compound having an acid group.

14. The thermo/photosensitive composition according to claim 13, wherein an acid value of the polymer compound A' ranges from 0.5 to 4.0 meq/g.

15. A thermo/photosensitive composition according to claim 8, wherein a group having an ethylenic unsaturated bond on a side chain of the polymer compound A' is represented by any one of the following formulae (C-1) through (C-3):

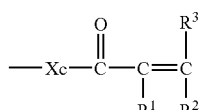

Formula (C-1)

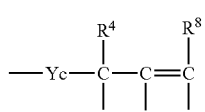

Formula (C-2)

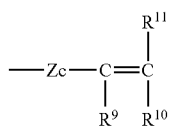

Formula (C-3)

wherein in formula (C-1), $Rc^1$ represents a hydrogen atom or a monovalent organic group; $Rc^2$ and $Rc^3$ each independently represent a hydrogen atom, a halogen atom, an amino group, a carboxyl group, an alkoxycarbonyl group, a sulfo group, a nitro group, a cyano group, or a monovalent organic group; and Xc represents an oxygen atom, a sulfur atom, or —$NRc^{4'}$-, in which $Rc^{4'}$ represents a hydrogen atom or a monovalent organic group;

in formula (C-2), $Rc^4$ through $Rc^8$ each independently represent a hydrogen atom, a halogen atom, an amino group, a dialkylamino group, a carboxyl group, an alkoxycarbonyl group, a sulfo group, a nitro group, a cyano group, or a monovalent organic group; and Yc represents an oxygen atom, a sulfur atom, or —$NRc^4$-, in which $Rc^4$ represents a hydrogen atom or a monovalent organic group; and in formula (C-3), $Rc^9$ represents a hydrogen atom or a monovalent organic group; $Rc^{10}$ and $Rc^{11}$ each independently represent a hydrogen atom, a halogen atom, an amino group, a dialkylamino group, a carboxyl group, an alkoxycarbonyl group, a sulfo group, a nitro group, a cyano group, or a monovalent organic group; and Zc represents an oxygen atom, a sulfur atom, —$NRc^{12}$- or a phenylene group that may have a substituent, in which $Rc^{12}$ represents an alkyl group that may have a substituent.

* * * * *